(12) United States Patent
Deshpande et al.

(10) Patent No.: US 10,461,250 B2
(45) Date of Patent: Oct. 29, 2019

(54) MAGNETORESISTIVE STACK/STRUCTURE AND METHOD OF MANUFACTURING SAME

(71) Applicant: Everspin Technologies, Inc., Chandler, AZ (US)

(72) Inventors: Sarin A. Deshpande, Chandler, AZ (US); Kerry Joseph Nagel, Scottsdale, AZ (US); Chaitanya Mudivarthi, Sunnyvale, CA (US); Sanjeev Aggarwal, Scottsdale, AZ (US)

(73) Assignee: EVERSPIN TECHNOLOGIES, INC., Chandler, AZ (US)

( * ) Notice: Subject to any disclaimer, the term of this patent is extended or adjusted under 35 U.S.C. 154(b) by 0 days.

(21) Appl. No.: 16/050,749

(22) Filed: Jul. 31, 2018

(65) Prior Publication Data

US 2018/0375018 A1    Dec. 27, 2018

Related U.S. Application Data

(60) Continuation of application No. 15/727,905, filed on Oct. 9, 2017, now Pat. No. 10,079,339, which is a division of application No. 15/013,950, filed on Feb. 2, 2016, now Pat. No. 9,793,470.

(60) Provisional application No. 62/249,196, filed on Oct. 31, 2015, provisional application No. 62/111,976, filed on Feb. 4, 2015.

(51) Int. Cl.
*H01L 43/12* (2006.01)
*H01L 43/08* (2006.01)

(52) U.S. Cl.
CPC .............. *H01L 43/12* (2013.01); *H01L 43/08* (2013.01)

(58) Field of Classification Search
None
See application file for complete search history.

(56) References Cited

U.S. PATENT DOCUMENTS

| 6,806,546 B2 | 10/2004 | Liu et al. |
| 6,897,532 B1 | 5/2005 | Schwarz et al. |
| 6,985,384 B2 | 1/2006 | Costrini et al. |
| (Continued) | | |

OTHER PUBLICATIONS

International Search Report and Written Opinion of International Searching Authority, dated Apr. 14, 2016, 9 pages.

*Primary Examiner* — Cory W Eskridge
(74) *Attorney, Agent, or Firm* — Bookoff McAndrews, PLLC

(57) ABSTRACT

A method of manufacturing a magnetoresistive stack/structure comprising (a) etching through a second magnetic region to (i) provide sidewalls of the second magnetic region and (ii) expose a surface of a dielectric layer, (b) depositing a first encapsulation layer on the sidewalls of the second magnetic region and over a surface of the dielectric layer, (c) thereafter: (i) etching the first encapsulation layer which is disposed over the dielectric layer using a first etch process, and (ii) etching re-deposited material using a second etch process, wherein, after such etching, a portion of the first encapsulation layer remains on the sidewalls of the second magnetic region, (d) etching (i) through the dielectric layer to form a tunnel barrier and provide sidewalls thereof and (ii) etching the first magnetic region to provide sidewalls thereof, and (e) depositing a second encapsulation layer on the sidewalls of the tunnel barrier and first magnetic region.

19 Claims, 80 Drawing Sheets

(56) References Cited

U.S. PATENT DOCUMENTS

| | | |
|---|---|---|
| 7,122,854 B2 | 10/2006 | Fukuzumi |
| 7,936,027 B2 | 5/2011 | Xiao et al. |
| 8,236,578 B2 | 8/2012 | Mather et al. |
| 8,685,756 B2 | 4/2014 | Aggarwal et al. |
| 8,686,484 B2 | 4/2014 | Whig et al. |
| 8,709,956 B2 | 4/2014 | Satoh et al. |
| 8,747,680 B1 | 6/2014 | Deshpande et al. |
| 9,093,640 B2 | 7/2015 | Aggarwal et al. |
| 9,269,894 B2 | 2/2016 | Mudivarthi et al. |
| 9,793,470 B2 | 10/2017 | Deshpande et al. |
| 10,079,339 B2 | 9/2018 | Deshpande et al. |
| 2004/0150922 A1 | 8/2004 | Kagami et al. |
| 2008/0265347 A1 | 10/2008 | Iwayama et al. |
| 2010/0053823 A1 | 3/2010 | Iwayama et al. |
| 2010/0311243 A1 | 12/2010 | Mao |
| 2011/0235217 A1 | 9/2011 | Chen et al. |
| 2014/0227801 A1* | 8/2014 | Hsu .................. H01L 43/12 438/3 |

\* cited by examiner

MAGNETORESISTIVE STACK/STRUCTURE AND METHOD OF MANUFACTURING SAME

RELATED APPLICATIONS

This application is a continuation of U.S. patent application Ser. No. 15/727,905, filed on Oct. 9, 2017, which is a divisional of U.S. patent application Ser. No. 15/013,950 (now U.S. Pat. No. 9,793,470), filed Feb. 2, 2016, which claims priority to: (1) U.S. Provisional App. No. 62/111,976, entitled "Method of Manufacturing a Magnetoresistive Device", filed Feb. 4, 2015, and (2) U.S. Provisional App. No. 62/249,196, entitled "Magnetoresistive Device and Method of Manufacturing Same", filed Oct. 31, 2015; each of the above-listed applications is incorporated herein by reference in its entirety.

INTRODUCTION

There are many inventions described and illustrated herein, as well as many aspects and embodiments of those inventions. In one aspect, the present inventions relate to a method of manufacturing a magnetoresistive stack/structure (for example, a magnetoresistive memory stack/structure or a magnetoresistive sensor or transducer stack/structure) and, in one embodiment, manufacturing a magnetoresistive stack/structure (for example, a magnetic tunnel junction (MTJ) stack/structure). For example, in one embodiment, after partially forming an MTJ stack/structure, the methods of manufacturing employ physical etching (for example, sputter etching, ion etching or milling, and/or ion-beam etching or milling) to remove re-deposited material (for example, material arising or originating from the preceding etch of the magnetic region (for example, magnetic or ferromagnetic material) and/or electrically conductive layers (if applicable)) in the field region and/or on the partially formed stack/structure.

The re-deposited material may be material that resides and/or re-deposits in the field region and/or on the partially formed stack/structure as a result of or resulting from processing of the partially formed stack/structure. Briefly, by way of background, manufacturing magnetoresistive stacks/structures, including MTJ-based magnetoresistive stacks/structures, includes a sequence of processing steps during which many layers of materials are deposited and then patterned to form a MTJ stack/structure and the one or more electrically conductive electrodes/vias/lines used to provide electrical connections to the MTJ stack/structure. The stack may include various magnetic and/or ferromagnetic (hereinafter "magnetic") layers that form the free magnetic and fixed magnetic regions of the magnetoresistive stack/structure as well as one or more non-ferromagnetic layers (for example, one or more dielectric layers that provide at least one tunnel junction for the MTJ stack/structure) disposed between such magnetic layers. In many instances, the layers of material are quite thin, on the order of a few or tens of Angstroms.

In one particular embodiment, such physical etching of the re-deposited material is preceded (for example, immediately preceded) by an encapsulation process whereby an encapsulation material (for example, an aluminum oxide, silicon oxide, silicon nitride, tetraethylorthosilicate (TEOS), an aluminum nitride (such as AlN), or one or more combinations thereof, having a thickness of less than 100 Angstroms, and preferably a thickness of between 0.5-50 Angstroms, and more preferably a thickness of 1-25 Angstroms) is deposited in the field region (including on the re-deposited material disposed in the field region) and on the partially formed stack/structure (for example, on all or substantially all of the exposed portions of the partially formed stack/structure—including the sidewalls thereof). Notably, where the encapsulation material is a silicon oxide, a silicon nitride and/or a TEOS, it may be advantageous to employ a thicker encapsulation, for example, 50-300 Angstroms and more preferably, 100-200 Angstroms (wherein the thickness of the encapsulation material on the sidewalls of the partially formed stack/structure is likely to be less than such aforementioned thicknesses (for example, approximately 20% less)). The methods of the present inventions thereafter employ one or more etch processes (which may be, for example, different etch recipes and/or mechanisms) to remove the encapsulation material and the re-deposited material (which may be or include the aforementioned physical etch to remove the re-deposited material).

In yet another aspect, the present inventions are directed to a magnetoresistive stack/structure—for example, one or more magnetoresistive stacks/structures for a sensor/transducer or memory device (for example, a device having one or more MTJ stacks/structures (for example, a plurality of MTJ stacks/structures of a MTJ-based sensor/transducer and/or MTJ-based memory devices that are configured in an array layout (see FIGS. 14, 15A and 15B))) wherein MTJ-based magnetoresistive sensor/transducer or magnetoresistive memory device includes one or more MTJ stacks/structures manufactured (in whole or in part) using any of the manufacturing techniques described and/or illustrated herein.

Notably, a magnetoresistive memory stack/structure, in one embodiment, includes at least one non-magnetic layer (for example, at least one layer of a dielectric material) disposed between a "fixed" magnetic region and a "free" magnetic region, each consisting of a plurality of layers of one or more magnetic or ferromagnetic materials. Information is stored in the magnetoresistive memory stack/structure by switching, programming and/or controlling the direction of magnetization vectors in one or more of the magnetic layers of the free magnetic region of the stack/structure. Here, the direction of the magnetization vectors of the free magnetic region may be switched and/or programmed (for example, through spin-torque transfer) by application of a write signal (one or more current pulses) to or through the magnetoresistive memory stack/structure while, in contrast, the magnetization vectors in the magnetic layers of a fixed magnetic region are magnetically fixed (in a predetermined direction).

The magnetoresistive memory stack/structure includes an electrical resistance that depends on the magnetic state of certain regions of the memory stack/structure. That is, when the magnetization vectors of the "free" magnetic region are in a first state or in a first direction (for example, which is the same direction as the direction of the magnetization vectors of the "fixed" magnetic region), the magnetoresistive memory stack/structure has a first magnetic state which may correspond to a low electrical resistance state. Conversely, when the magnetization vectors of the "free" magnetic region are in a second state or in a second direction (for example, which is a different direction (for example, opposite or opposing) as the direction of the magnetization vectors of the "fixed" magnetic region), the magnetoresistive memory stack/structure has a second magnetic state which may correspond to a high electrical resistance state. The magnetic state of the magnetoresistive memory stack/ structure is determined or read based on the resistance of the stack/structure in response to a read current of a read operation.

Although certain exemplary embodiments are described and/or illustrated herein in the context of MTJ stacks/structures, the present inventions may be implemented in giant magnetoresistive (GMR) stacks/structures where a conductor is disposed between two or more magnetic or ferromagnetic materials/layers. For the sake of brevity the discussions and illustrations will not be repeated specifically in the context of GMR or other magnetoresistive stacks/structures—but such discussions and illustrations are to be interpreted as being entirely applicable to GMR and other stacks/structures.

BRIEF DESCRIPTION OF THE DRAWINGS

The present inventions may be implemented in connection with embodiments illustrated in the attached drawings. These drawings show different aspects of the present inventions and, where appropriate, reference numerals illustrating like structures, components, materials and/or elements in different figures are labeled similarly. It is understood that various combinations of the structures, components, and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s).

FIGS. 7A-7J illustrate cross-sectional views of a magnetoresistive stack/structure at selected stages of manufacturing in accordance with another embodiment of the present inventions;

Figure 1A:
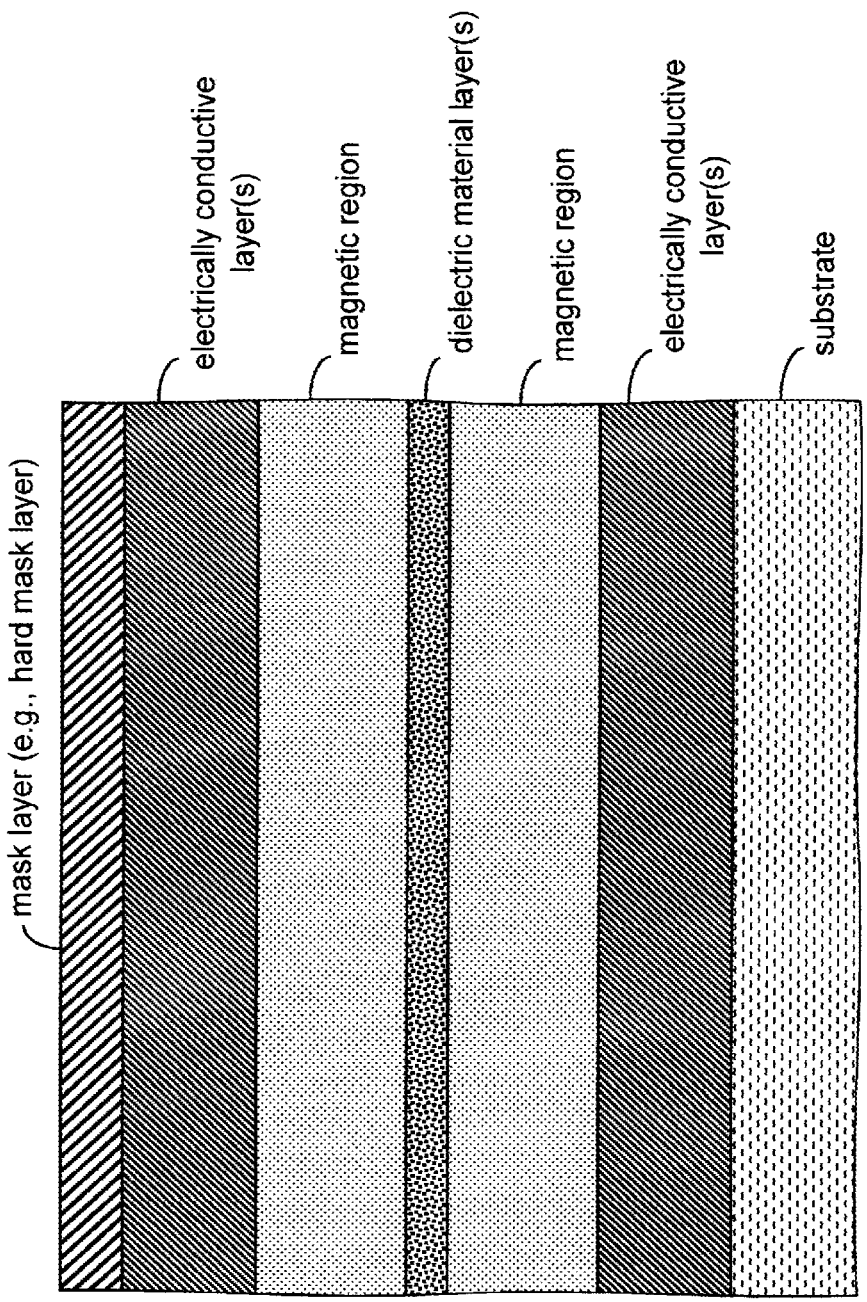
FIGS. 1A-1I illustrate cross-sectional views of layers included in a magnetoresistive stack/structure at various stages of manufacturing of an exemplary magnetoresistive stack/structure (for example, a magnetoresistive stack/structure wherein the fixed and/or free magnetic regions have an in-plane magnetic anisotropy) according to at least certain aspects of certain embodiments of the present inventions; notably, the illustrated magnetic regions (which, after processing, form the free magnetic region or the fixed magnetic region in the context of, for example, a magnetoresistive memory stack/structure) include one or more layers of materials (for example, nickel (Ni), iron (Fe), cobalt (Co), platinum (Pt), chromium (Cr) and alloys thereof) and may also include one or more layers of non-magnetic materials (for example, ruthenium (Ru), copper (Cu), aluminum (Al), tantalum (Ta), titanium (Ti), niobium (Nb), vanadium (V), zirconium (Zr) and one or more alloys thereof, and in certain embodiments, tungsten (W) and molybdenum (Mo); in addition, these regions may include one or more synthetic antiferromagnetic structures (SAF) or synthetic ferromagnetic structures (SyF) wherein one or more layers of magnetic or ferromagnetic materials (hereinafter collectively magnetic materials) may also include one or more non-magnetic materials (for example, ruthenium (Ru), copper (Cu), aluminum (Al), tantalum (Ta), titanium (Ti), niobium (Nb), vanadium (V), zirconium (Zr) and one or more alloys thereof); such materials and/or structures may be arranged in any combination or permutation now known or later developed.

Again, there are many inventions described and illustrated herein. The present inventions are neither limited to any single aspect nor embodiment thereof, nor to any combinations and/or permutations of such aspects and/or embodiments. The aspects of the present inventions, and/or embodiments thereof, may be employed alone or in combination with one or more other aspects of the present inventions and/or embodiments thereof. For the sake of brevity, many of those combinations and permutations are not discussed separately herein.

Moreover, many other aspects, inventions and embodiments, which may be different from and/or similar to, the aspects, inventions and embodiments illustrated in the drawings, will be apparent from the description, illustrations and claims, which follow. In addition, although various features and attributes have been illustrated in the drawings and/or are apparent in light thereof, it should be understood that such features and attributes, and advantages thereof, are not required whether in one, some or all of the embodiments of the present inventions and, indeed, need not be present in any of the embodiments of the present inventions

DETAILED DESCRIPTION

The following detailed description is merely illustrative in nature and is not intended to limit the embodiments of the subject matter or the application and uses of such embodiments. Any implementation described herein as exemplary is not necessarily to be construed as preferred or advantageous over other implementations. Rather it is intended or used in the sense of an "example" rather than "ideal" or "preferred" or "advantageous" relative to other implementations or embodiments.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to improve understanding of the example embodiments. For example, one of ordinary skill in the art appreciates that the cross-sectional views are not drawn to scale and should not be viewed as representing proportional relationships between different layers. The cross-sectional views are provided to help illustrate the processing steps performed by simplifying the various layers to show their relative positioning. Moreover, while certain layers and features are illustrated with straight 90-degree edges, in actuality or practice such layers may be more "rounded" and gradually sloping.

For the sake of brevity, conventional techniques related to semiconductor processing may not be described in detail herein. The exemplary embodiments may be fabricated using known lithographic processes. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or that not exposed to the radiation, is removed by the application of a developer. An etch may then be applied whereby the layer not protected by the remaining resist is patterned. Alternatively, an additive process can be used in which a structure is built up using the photoresist as a template.

Although the magnetoresistive stack/structure is illustrated as being fabricated and disposed on an electrically conductive electrode, which is disposed on the substrate, such electrically conductive electrode may be disposed above the substrate, for example, on an insulation material or a conductive material (for example, a conductor or via that is electrically connected to one to more other layers of the integrated circuit including, for example, an active element (for example, a transistor device)) that is on or above the substrate. Indeed, the magnetoresistive stack/structure may be disposed on a conductor or via, which in that embodiment, may be illustrated as the electrically conductive layers.

Similarly, an electrically conductive electrode is illustrated and described as being fabricated or disposed on the magnetoresistive stack/structure. However, such stack/structure may be electrically accessed through a via and/or a conductive line which is deposited or formed directly on the magnetoresistive stack/structure. Thus, in one embodiment, the magnetoresistive structures/stacks of the present inventions may be formed between a top electrode/via/conductor and a bottom electrode/via/conductor, which provides electrical access to the magnetoresistive stack/structure by allowing for or facilitating electrical connectivity to circuitry and other elements of the magnetoresistive device. Notably, in one embodiment, the magnetoresistive stack/structure does not include electrical connection to through one or both of the electrically conductive electrode/via/conductor (or line); for the sake of brevity, embodiments omitting one or both electrode/via/conductor will not be illustrated separately.

As noted above, there are many inventions described and illustrated herein, as well as many aspects and embodiments of those inventions. In one aspect, the described embodiments relate to, among other things, methods of manufacturing a magnetoresistive stack/structure having one or more electrically conductive electrodes or conductors on either side of a magnetic material stack. As described in further detail below, the materials of the stack/structure may include many different layers of materials and many different types of materials, where some of the layers include magnetic materials, whereas others do not. In one embodiment, the methods of manufacturing include forming the layers for the magnetoresistive stack/structure and then masking and etching those layers to produce or provide a magnetoresistive stack/structure (for example, a magnetoresistive memory stack/structure or a magnetoresistive sensor or transducer stack/structure).

Magnetoresistive stacks/structures are typically formed between or on a top conductive material (for example, electrode, via and/or conductor) and a bottom conductive material which facilitate or provide access to the magnetoresistive stack/structure by providing electrical connectivity to other circuit elements of the device. Between the conductive materials are layers or regions, including, in the context of a magnetoresistive memory stack/structure, one or more fixed magnetic regions, a free magnetic region, and one or more dielectric layers—including at least one dielectric layer, disposed between a fixed magnetic region and the free magnetic region, to provide a tunnel barrier of the magnetoresistive stack/structure. Briefly, the free magnetic region includes one or more layers of materials (for example, boron (B), nickel (Ni), iron (Fe), cobalt (Co), and alloys thereof) and may also include one or more layers of non-magnetic materials (for example, ruthenium (Ru), copper (Cu), aluminum (Al), tantalum (Ta), titanium (Ti), niobium (Nb), vanadium (V), zirconium (Zr), tungsten (W) and molybdenum (Mo). The free magnetic region may also include one or more synthetic antiferromagnetic structures (SAF) or synthetic ferromagnetic structures (SyF); such materials and/or structures may be arranged in any combination or permutation now known or later developed.

The fixed magnetic region may include one or more layers of magnetic materials (for example, boron (B), nickel (Ni), iron (Fe), cobalt (Co), platinum (Pt), chromium (Cr) and alloys thereof) as well as the aforementioned non-magnetic materials. The fixed magnetic layer may achieve its fixed magnetization based on (i) an antiferromagnetic material (for example, platinum manganese (PtMn), iron manganese (FeMn) and/or (ii) one or more pinned or unpinned synthetic antiferromagnetic structures (SAF) or synthetic ferromagnetic structures (SyF) which typically include one or more layers of ferromagnetic material layers (cobalt (Co), iron (Fe), nickel (Ni)) separated by one or more layers of non-magnetic materials (for example, ruthenium (Ru), copper (Cu), aluminum (Al)). In addition thereto, or in lieu thereof, in other embodiments, the fixed magnetization may be achieved through other means, including the manner in which the fixed layer was formed (for example, by way of shape anisotropy).

With reference to FIG. 1A, in one embodiment, a plurality of layers of various materials have been previously and sequentially deposited, grown, sputtered, evaporated and/or provided (hereinafter collectively "deposited" or various verb forms thereof (e.g., deposit, deposition or depositing)) which, after further processing, will be an MTJ stack of a magnetoresistive stack/structure. A mask layer is deposited (for example, a hard mask layer) on one or more layers of electrically conductive materials. The mask layer may be deposited using any technique now known or later developed, for example, well known conventional techniques. In one embodiment, the mask layer includes and/or consists of a silicon oxide, silicon nitride and/or a material that is relatively inert to or during the etch process of one or more layers of electrically conductive materials (which, after patterning form the electrically conductive electrode) and one or more layers of magnetic materials (which, after patterning form the magnetic material stack). (See, for example, U.S. Pat. No. 8,747,680, which is incorporated by reference).

Figure 1B:
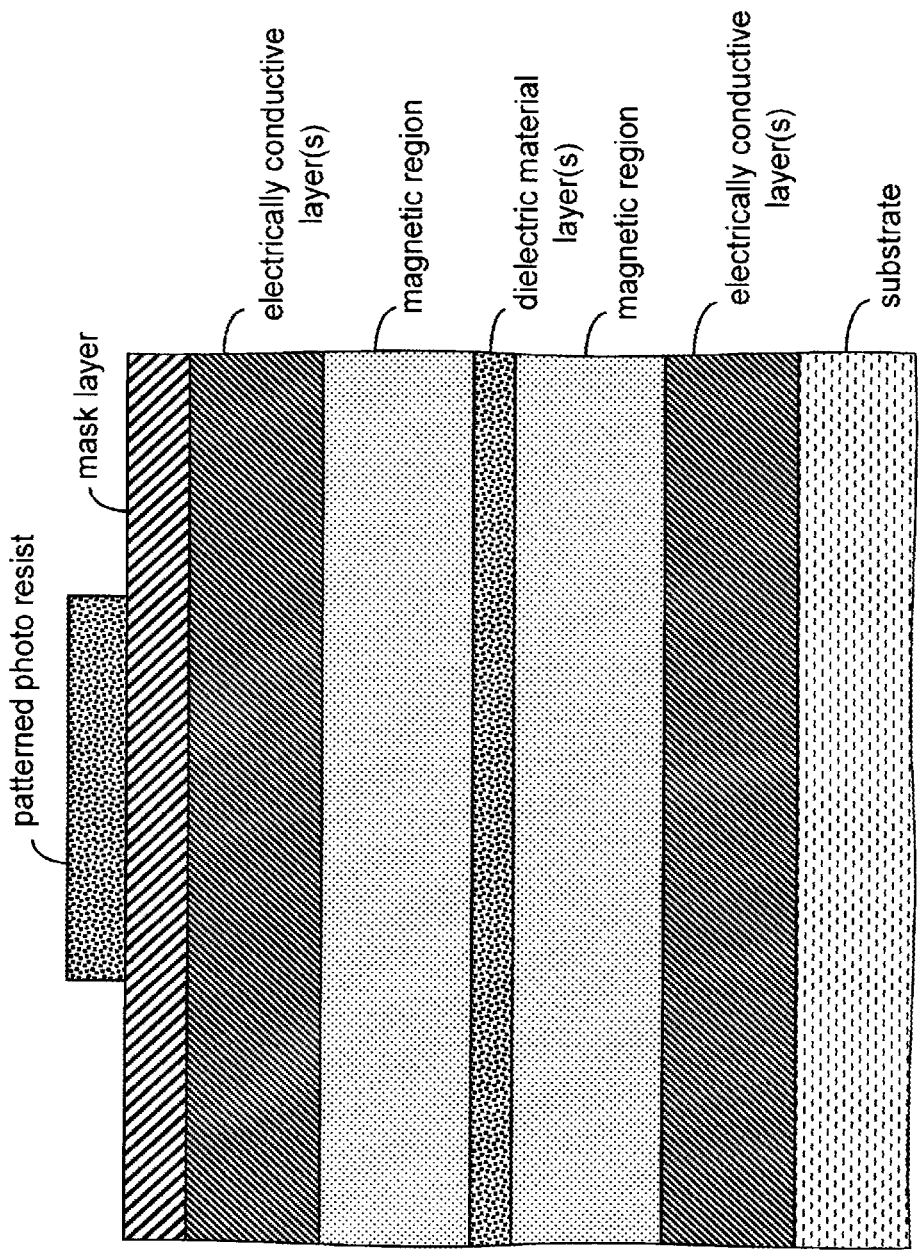

After deposition of the mask layer, a photo resist is deposited thereon and patterned to predetermined dimensions consistent with or correlated to selected dimensions of the electrically conductive electrode to be formed. (See, FIG. 1B). The photo resist may be deposited and patterned using any technique now known or later developed, for example, well known conventional deposition and lithographic techniques.

Figure 1C:
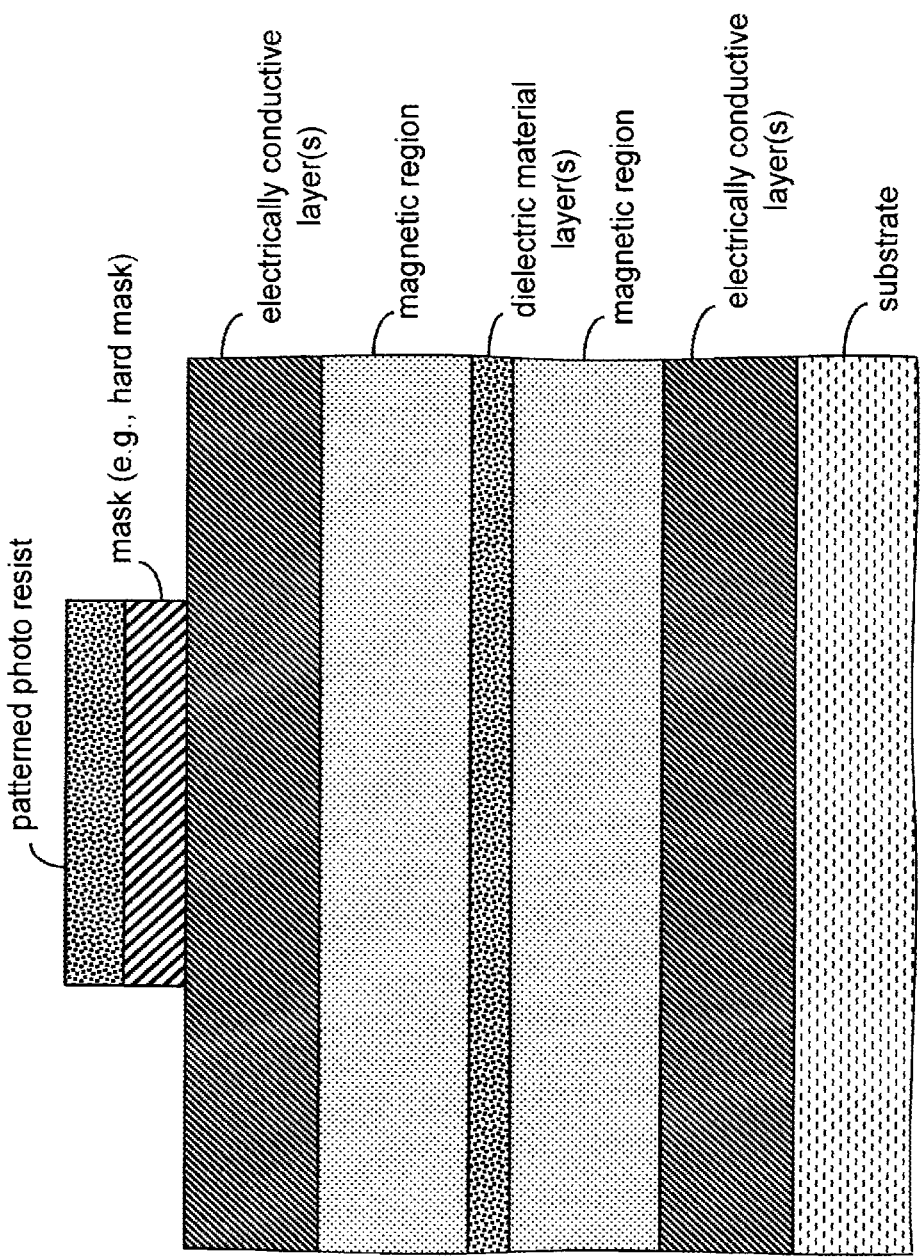

With reference to FIG. 1C, the mask layer is etched, for example, via mechanical etching (such as, for example, via sputter etching techniques) or chemical etching, to form or provide the mask. After forming or patterning the mask (having a predetermined pattern which is at least partially defined by the patterned photo resist), it may be advantageous to remove or strip the photo resist, for example, using conventional techniques.

Figure 1D:
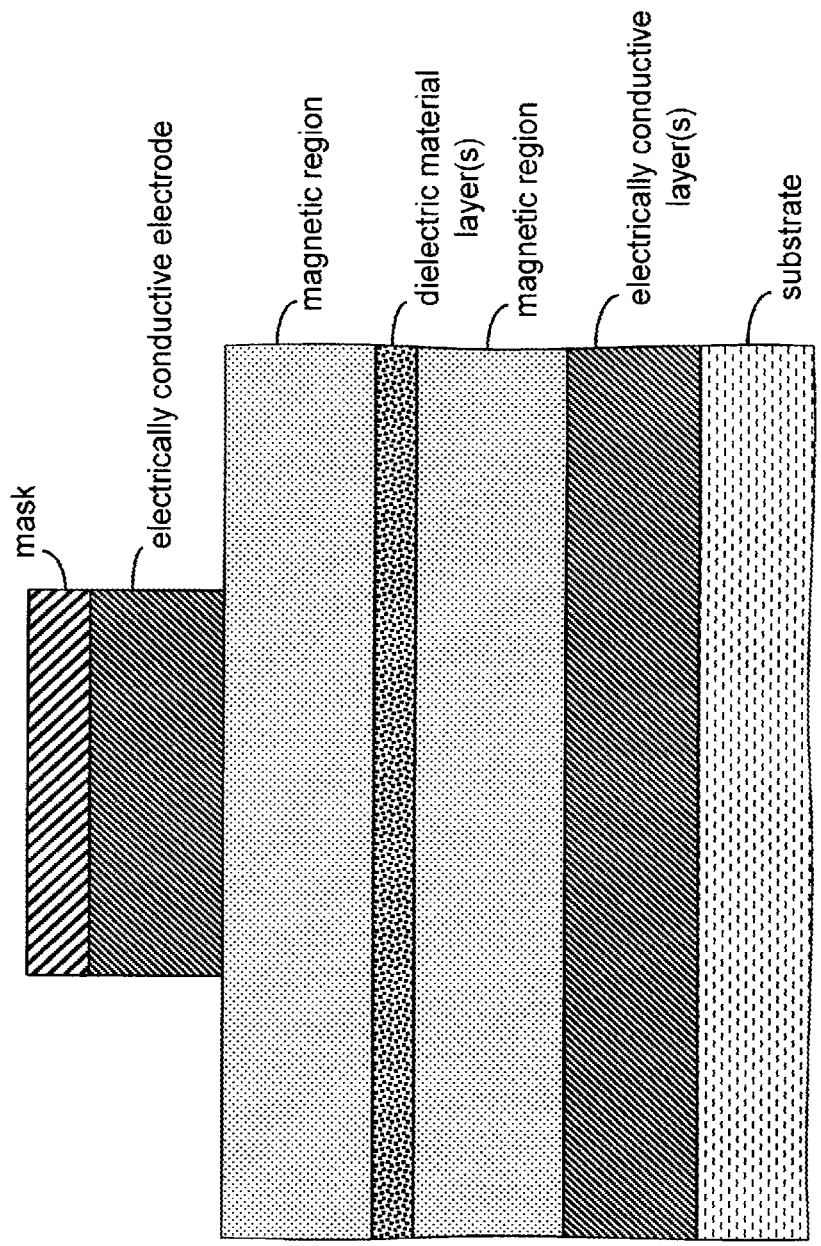

With reference to FIG. 1D, one or more layers of electrically conductive materials are then etched with the mask "protecting" certain portions thereof, to form, define, pattern and/or provide an electrically conductive electrode. The one or more layers of electrically conductive materials (for example, Tantalum (Ta), Tantalum-Nitride (TaN) or Ta—TaN composite) may be etched, formed and/or patterned using any etchants and/or technique now known or later developed—for example, using mechanical etchants and techniques (for example, sputter etchants and techniques) or chemical etching techniques.

After etching the one or more layers of electrically conductive materials and using the mask to "protect" the electrically conductive electrode, the one or more layers of magnetic materials are etched to form, define, pattern and/or provide magnetic materials of the partially formed MTJ stack/structure (for example, the free magnetic region or the fixed magnetic region of the magnetoresistive memory stack/structure). (See, FIG. 1E).

The etch process corresponding to the magnetic region disposed on the dielectric material layer(s) may be time controlled/monitored or endpoint controlled/monitored. In one embodiment, the etch process of magnetic region is stopped when endpoint monitoring detects a predetermined material, combination of materials and/or percentages. That is, the etch process terminates or stops upon detecting the dielectric material of the tunnel barrier layer(s) (i.e., one or more layer(s) of dielectric material(s)) or upon detecting the material of the layers(s) of magnetic materials after etching the tunnel barrier layer(s) (not illustrated). For example, in one particular embodiment, the etch process of magnetic region is stopped when endpoint monitoring detects a predetermined material (for example, Magnesium (Mg) or Magnesium-Oxide (MgO)), for example, the material of the tunnel barrier, and/or the absence of a predetermined material. Here, the etch process terminates largely on top of the tunnel barrier layer(s) and before significant etching of the tunnel barrier layer(s) by monitoring the endpoint for a rise in one or more of the tunnel barrier material signals in the plasma based on optical emission spectra (OES). A drop or rise in the OES signal for the tunnel barrier or magnetic stack layer above tunnel barrier (immediately above or few layers above the tunnel barrier) may be monitored and, upon detection of signals corresponding to one or more tunnel barrier material(s), the etch process is terminated.

Figure 1E:
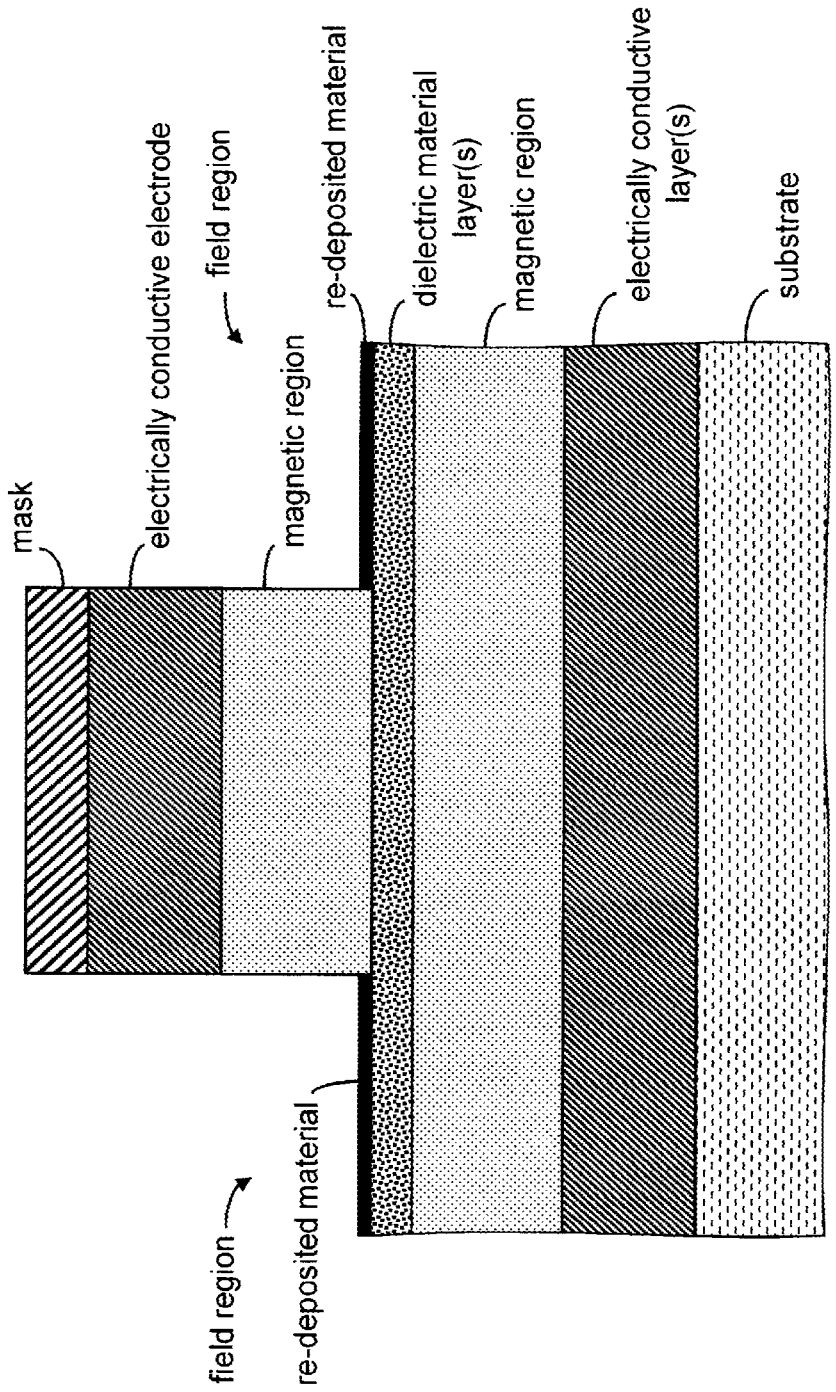

With continued reference to FIG. 1E, after etching of the magnetic material layer(s) re-deposited material forms on the exposed surfaces—and, in particular, on or in the field regions—during one or more of the initial processes (for example, after etching the magnetic region). The re-deposited material includes material that arises or originates from the preceding etch of the magnetic region (for example, magnetic or ferromagnetic material) and/or electrically conductive layer(s) (if applicable) and forms on or above, for example, the dielectric material layer(s). The presence of such re-deposited material may impact one or more operating characteristics of the magnetoresistive stack/structure (for example, switching voltage to increase as a result of such material in magnetoresistive memory stacks/structures). Moreover, removing such material, without implementing or taking certain precautions (for example, without protecting sidewalls of the previously formed magnetic materials of the partially formed magnetoresistive stack/structure), may result in damage to the magnetic properties thereby impacting switching distributions for the switching field (Hc) of the free magnetic region.

Notably, the one or more layers of materials of the magnetic region of the magnetoresistive stack/structure (for example, Nickel (Ni), Iron (Fe), Cobalt (Co), Platinum (Pt), and alloys thereof) may be etched, formed and/or patterned using any etchants and/or technique now known or later developed—for example, using mechanical and/or chemical techniques (for example, a low bias power sputter technique or a chemical etch technique such as a conventional fluorine and/or chlorine based etch technique). Where the magnetic region includes one or more SAFs or SyFs, the one or more layers of magnetic materials may also include one or more non-magnetic materials (for example, ruthenium (Ru), copper (Cu), aluminum (Al), tantalum (Ta) and titanium (Ti)). Notably, the magnetic regions may include SAF and SyF structures, one or more layers of magnetic materials, and other materials (including magnetic and/or non-magnetic) now known or later developed. Such materials and/or structures of the magnetic regions may be arranged in any combination or permutation now known or later developed.

In one particular embodiment, the magnetic region disposed on/above the tunnel barrier form the free magnetic region of the magnetoresistive memory stack/structure. As such, under those circumstances, the magnetic region which is disposed under or beneath the tunnel barrier provides or forms, after processing, the fixed magnetic region of the stack/structure.

Figure 1F:
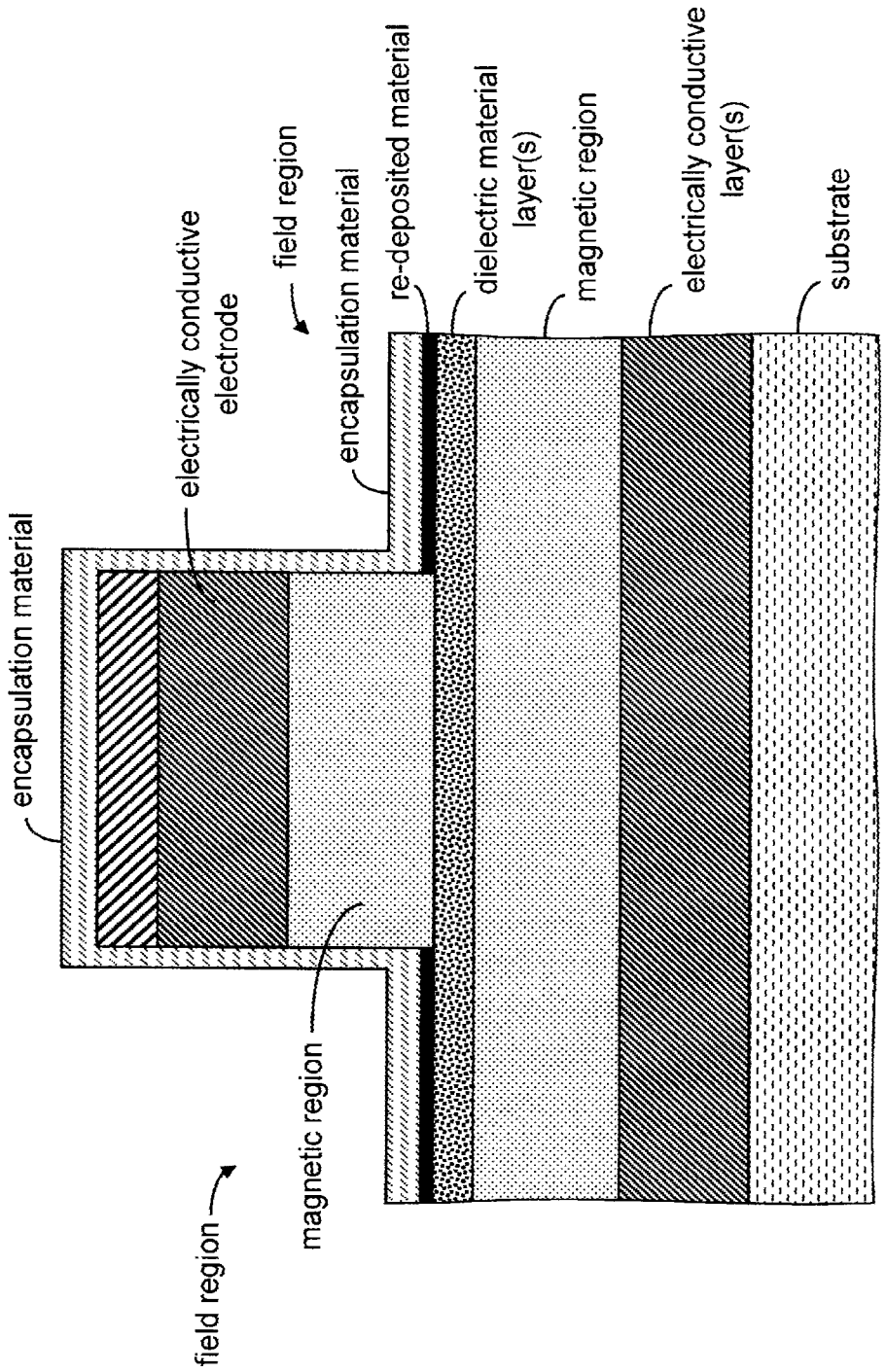

With reference to FIG. 1F, after etching/forming the magnetic region, an encapsulation material (for example, an aluminum oxide (such as $Al_2O_3$), a silicon oxide (such as $SiO_2$), a silicon nitride (such as $Si_3N_4$), a magnesium oxide (such as MgO), a tetraethylorthosilicate (TEOS), an aluminum nitride (such as AlN), or one or more combinations thereof) is deposited on (i) the re-deposited material disposed in the field regions and (ii) the partially formed stack/structure (for example, on all or substantially all of the exposed portions of the partially formed stack/structure—including the sidewalls thereof (e.g., the magnetic region). In one embodiment, the encapsulation material includes a thickness of less than 100 Angstroms, preferably a thickness of between 0.5-50 Angstroms or 1-25 Angstroms, and more preferably a thickness of less than 25 Angstroms. It may be advantageous that the amount of encapsulation layer on the exposed surfaces of magnetic region (in the illustrative embodiment, the sidewalls of the magnetic region) be sufficiently thick to protect the magnetic region from damage or contamination during removal of the re-deposited materials via subsequent processing (for example, "protect" the sidewalls of the magnetic region to the processes of removing the re-deposited materials in the field regions). Moreover, where the encapsulation material is silicon oxide, silicon nitride and/or TEOS (or the like), it may be advantageous to employ a thicker encapsulation, for example, 50-300 Angstroms and more preferably, 100-200 Angstroms (wherein the thickness of the encapsulation material on the sidewalls of the partially formed stack/structure is likely to be less than such aforementioned thicknesses (for example, approximately 20% less)). Notably, such magnetic region may eventually operate or function as the free magnetic region or the fixed magnetic region of the MTJ stack/structure—albeit in a preferred embodiment, such magnetic region form the free magnetic region.

Figure 1G:
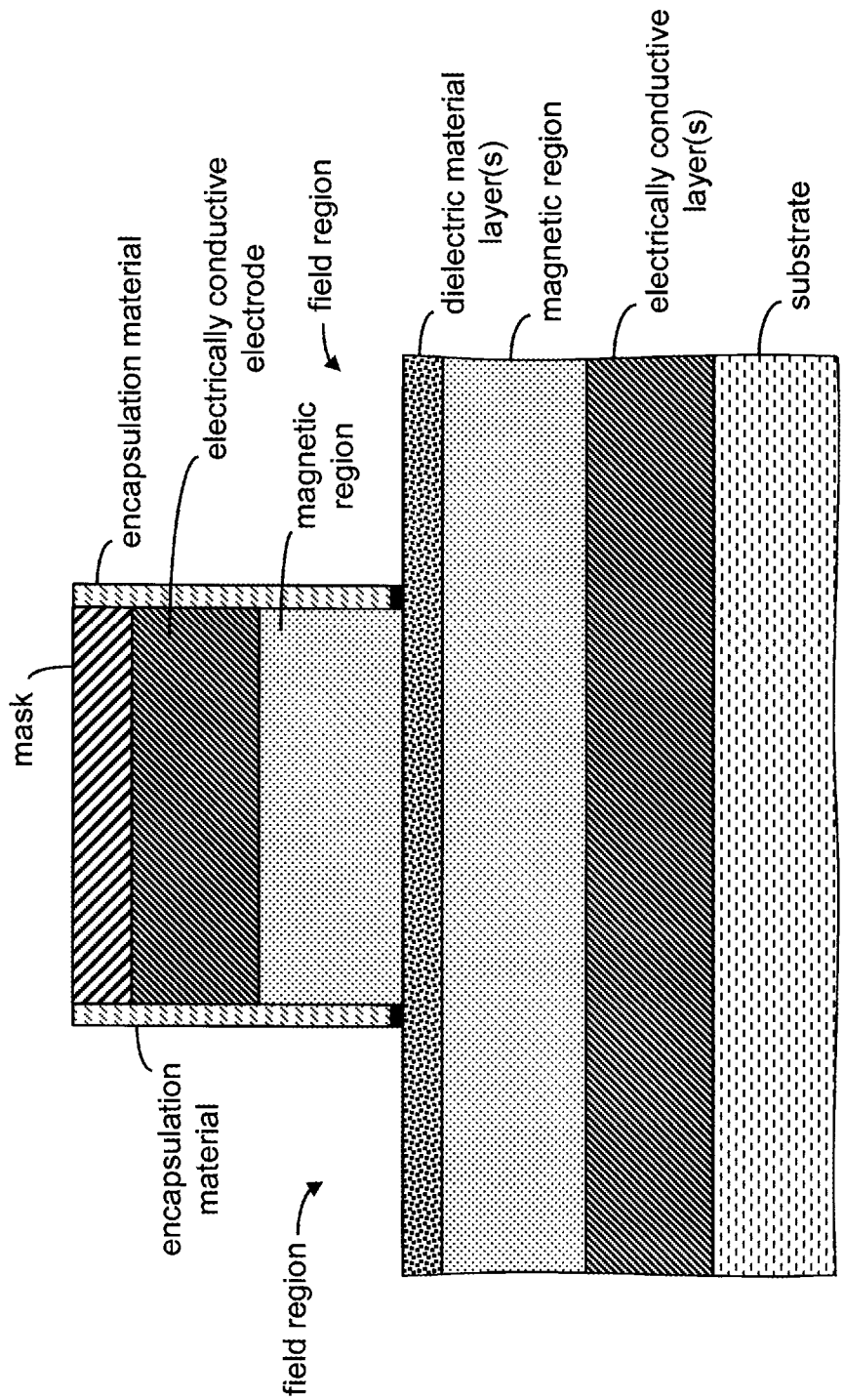

With reference to FIG. 1G, after deposition of the encapsulation material, one or more etch processes are employed to remove the re-deposited material (for example, ferromagnetic material) in the field region and/or on the partially formed stack/structure. For example, in one embodiment, the etch processes includes a physical etching (for example, sputter etching, ion etching or milling, and/or ion-beam etching or milling). Here, an Argon or Xenon sputter etch may be employed to remove the encapsulation material and the re-deposited material in the field regions and thereby "clear" or substantially "clear" the field of the re-deposited material. With continued reference to FIG. 1G, a portion of the encapsulation material may remain on the partially formed stack/structure (for example, on sidewalls of the partially formed stack/structure—including the magnetic region).

As intimated above, the methods of the present inventions may employ one or more etch processes (which may be, for example, different etch recipes and/or mechanisms) to remove the re-deposited material. For example, a first etch process (for example, a process employing a reactive ion etch) may be employed to remove at least (or all) of the encapsulation material overlying the re-deposited materials portions and thereafter a second etch process (for example, a process employing a physical etching (for example, a sputter or an ion milling etch) may be employed to remove all or the remaining portions of the re-deposited materials. In this embodiment, the first and second etch processes are sequentially and, in a preferred embodiment, the second etch process immediately follows the first etch process.

Figure 1H:
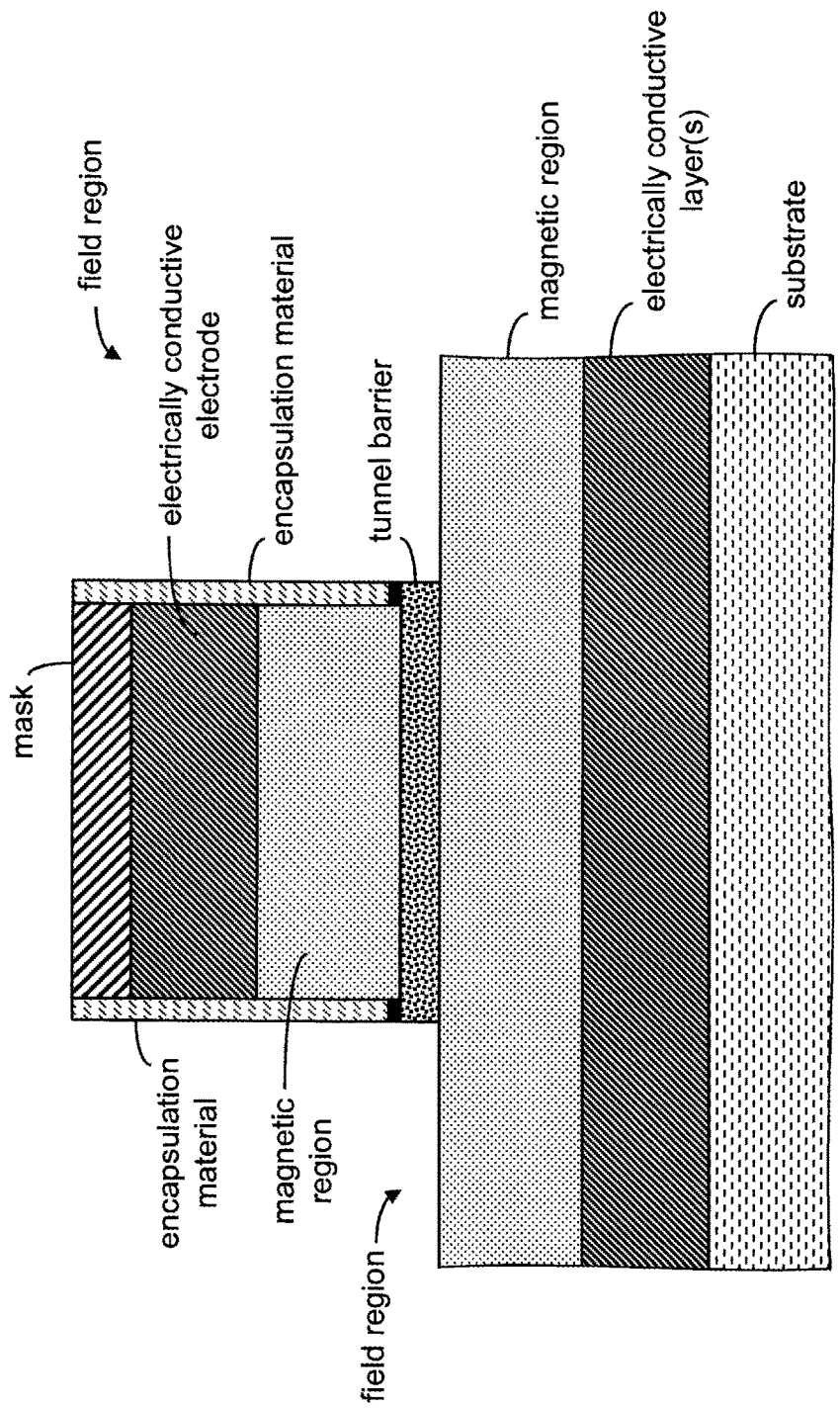

With reference to FIG. 1H, in one embodiment, after removal of all or substantially all of the re-deposited materials, the dielectric material layer(s) are etched to form a tunnel barrier of the magnetoresistive stack/structure. The dielectric material layer(s) (for example, Mg or MgO) may be etched and/or patterned using any etchants and/or technique now known or later developed—for example, using physical etchants and etching techniques (for example, sputter etching techniques). It should be noted that the present inventions may employ any suitable etchants and techniques, whether now known or later developed, to etch the one or more layers of dielectric materials and thereby form, define and/or provide the tunnel barrier of the magnetoresistive stack/structure.

Figure 1I:
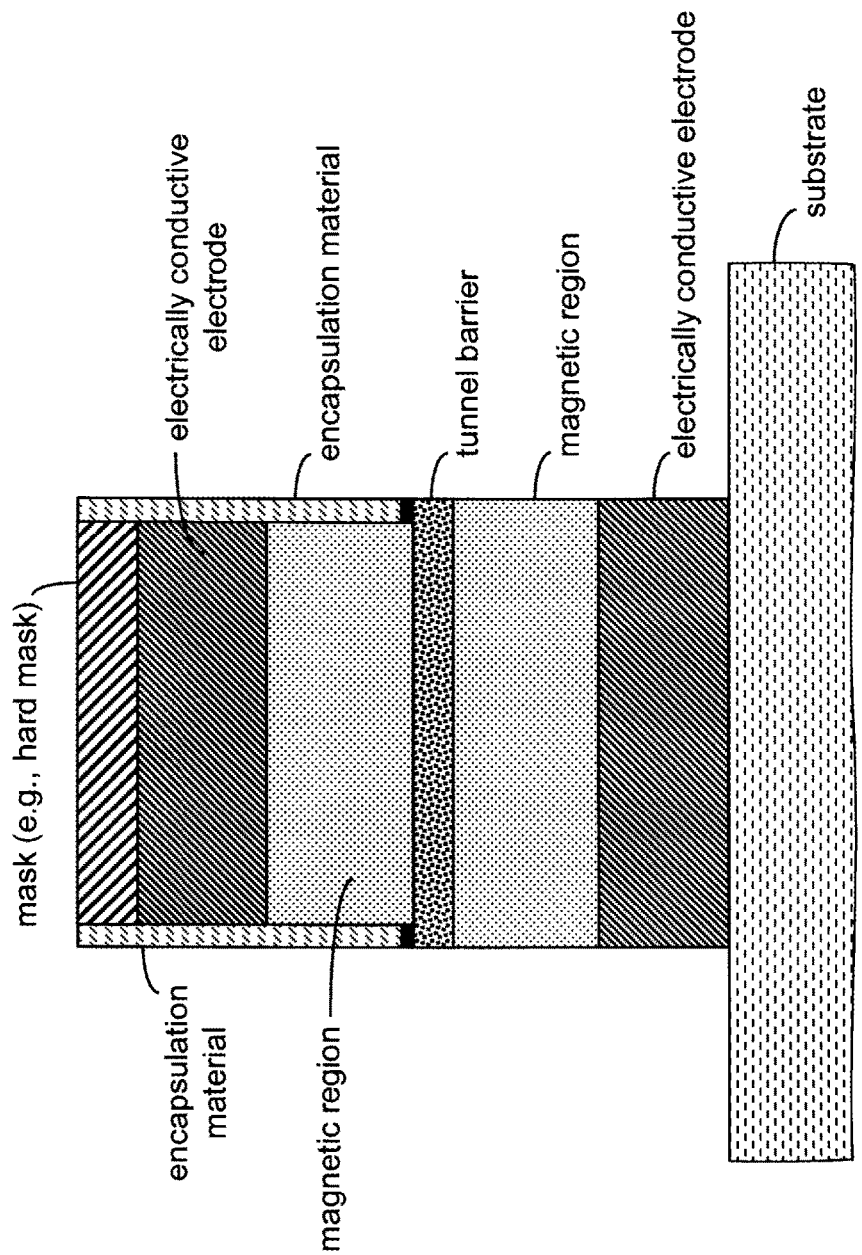
Figure 2A:
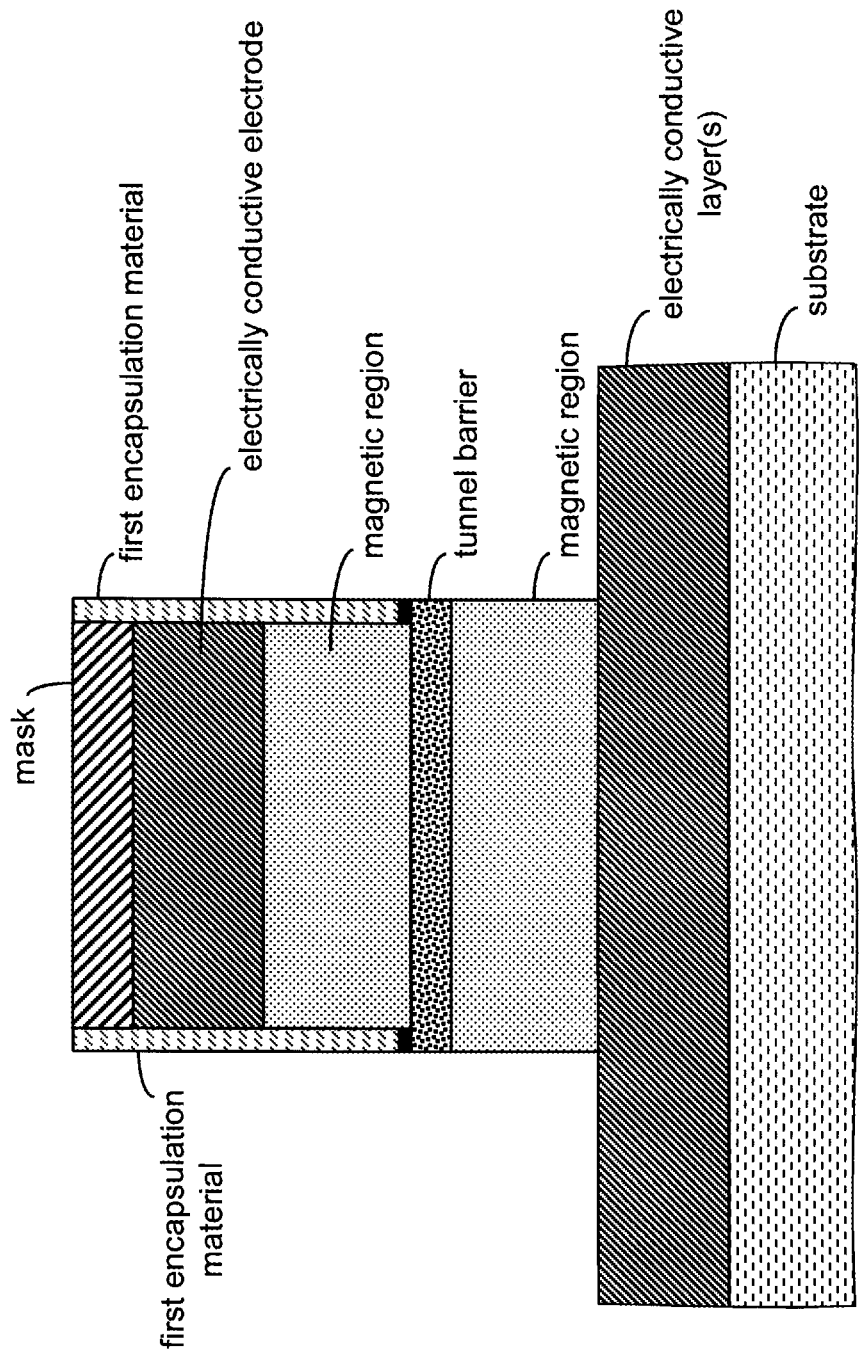
FIGS. 2A-2C illustrate cross-sectional views of a magnetoresistive stack/structure at selected stages of manufacturing in accordance with another embodiment of the present inventions.
Figure 2B:
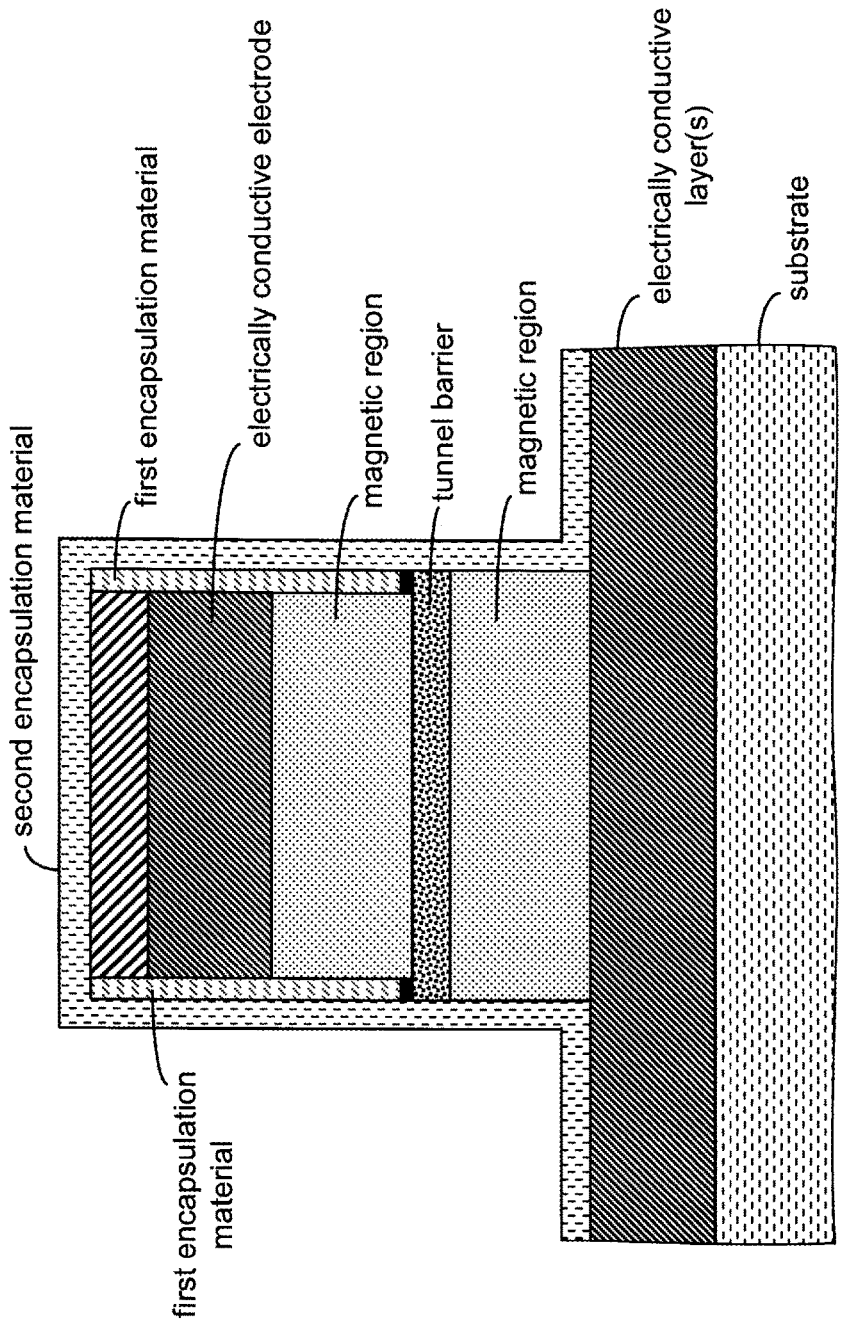
Figure 2C:
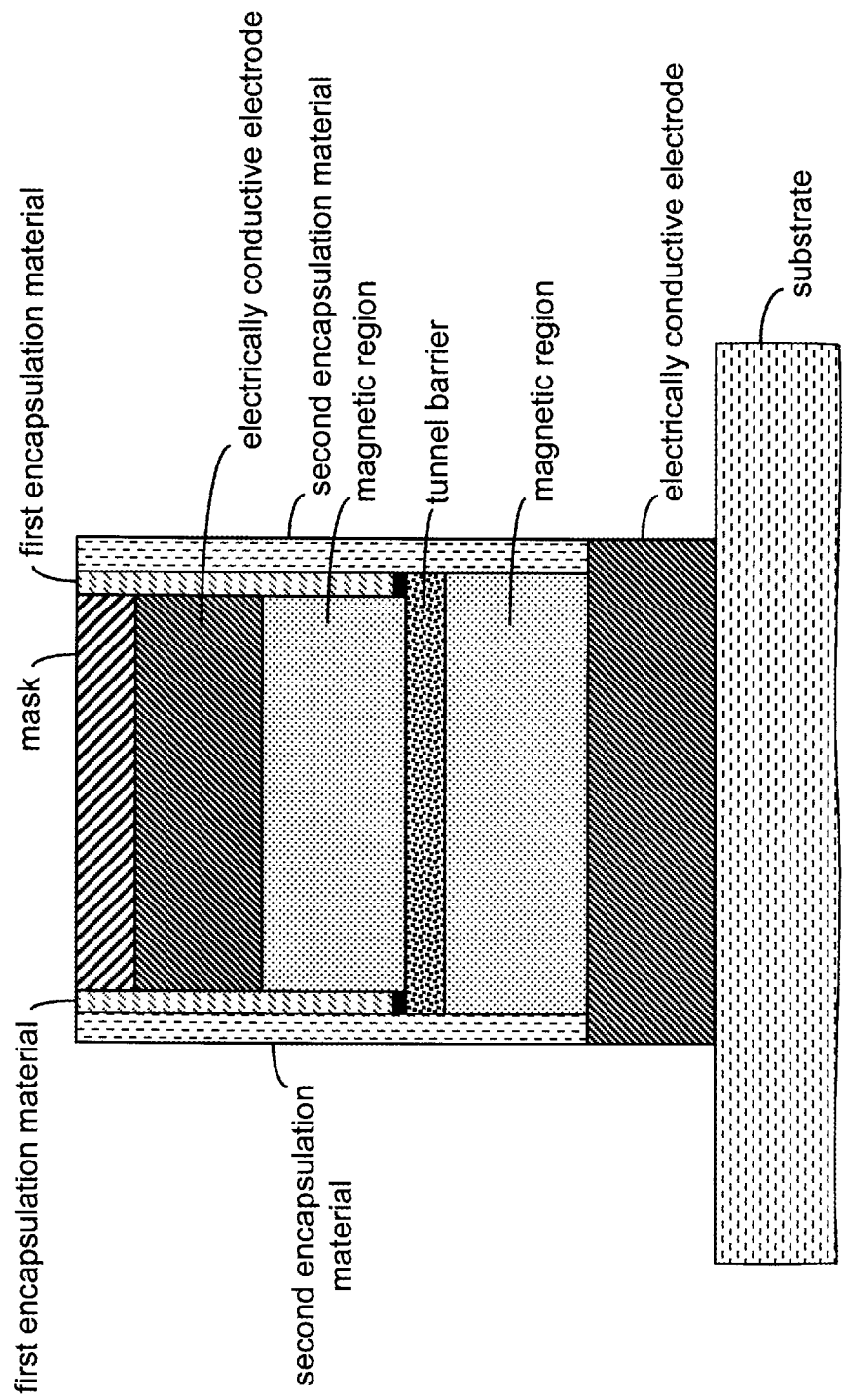

With reference to FIG. 1I, the magnetic region and the electrically conductive layer(s) under or beneath the dielectric materials layer(s) (i.e., the tunnel barrier) are then etched to form a second magnetic region and a second electrically conductive electrode, respectively. Such etching may also be via conventional techniques. Indeed, any techniques and/or recipes now known or later developed may be employed to form such the magnetic region (which, in operation, is the free magnetic region or the fixed magnetic region—and in one preferred embodiment, such magnetic region under or beneath the tunnel barrier provides the fixed magnetic region of the MTJ stack/structure). Notably, the electrically conductive materials disposed under or beneath the tunnel barrier provides a second or bottom electrode for the magnetoresistive stack/structure.

In one embodiment, after formation, definition and/or patterning of the second magnetic region of the magnetoresistive stack/structure and the second electrically conductive electrode, the mask may be removed or stripped using, for example, conventional techniques, to facilitate electrically contact to the exposed electrically conductive electrode. Indeed, after removing or stripping the mask, the exposed electrically conductive electrode may be connected to sense, read and/or write conductors and the magnetoresistive stack/structure completed using any processes and/or structures now known or later developed. In another embodiment, the mask is not removed or stripped but the MTJ stack/structure may be completed as described in U.S. Pat. No. 8,747,680 (which, as mentioned above, is incorporated by reference). Notably, where the mask is a metal hard mask, the mask (or portion thereof) may be patterned and employed as the electrically conductive electrode (or a portion thereof).

With reference to FIGS. 1A-1H and 2A-2C, in another embodiment, after removal of all or substantially all of the re-deposited materials and the tunnel barrier and magnetic region beneath the tunnel barrier are formed, a second encapsulation material is deposited (see FIG. 2B) on the stack/structure (for example, on all or substantially all of the exposed portions of the stack/structure—including the sidewalls thereof). The second encapsulation material may also be, for example, an aluminum oxide, a silicon oxide, a silicon nitride, a TEOS, an aluminum nitride or one or more combinations or alloys thereof. It may be advantageous that the amount of second encapsulation layer on the exposed surfaces of tunnel barrier and the magnetic regions (in the illustrative embodiment, the sidewalls of the tunnel barrier and magnetic materials) be sufficiently thick to protect the tunnel barrier and magnetic region beneath the tunnel barrier from damage or contamination during etching and formation of the electrically conductive electrode from the electrically conductive layer(s). (See FIG. 2C).

In one embodiment, the second encapsulation material includes a thickness of less than 100 Angstroms, preferably a thickness of between 0.5-50 Angstroms or 1-25 Angstroms, and more preferably a thickness of less than 25 Angstroms. Where the second encapsulation material is silicon oxide, silicon nitride and/or TEOS (or the like), it may be advantageous to employ a thicker encapsulation, for example, 50-250 Angstroms and more preferably, 50-200 Angstroms (again—wherein the thickness of the encapsulation material on the sidewalls of the partially formed stack/structure is likely to be less than such aforementioned thicknesses (for example, approximately 20% less)).

With reference to FIGS. 1A-1G and 3A-3D, in another embodiment, after removal of all or substantially all of the re-deposited materials, a second encapsulation material is deposited (see FIG. 3A) on the partially formed stack/structure (for example, on all or substantially all of the exposed portions of the partially formed stack/structure—including the sidewalls of the magnetic region (i.e., free magnetic region or fixed magnetic region). Here again, the second encapsulation material may be, for example, an aluminum oxide, silicon oxide, silicon nitride, TEOS, aluminum nitride or one or more combinations thereof. It may be advantageous that the amount of encapsulation layer on the sidewalls of the magnetic region be sufficiently thick to protect materials/layers of such region during further or subsequent processing. Notably, the thickness of the second encapsulation layer may be different from the thickness of the first encapsulation layer. Indeed, the encapsulation layers disposed on the sidewalls of the partially formed stack/structure may be employed in a self-aligned etch process when forming other portions of the stack/structure. In the situation that the top magnetic layer is free magnetic region and the bottom magnetic layer is fixed magnetic region, it may be advantageous to provide first and second encapsulation layers having thicknesses that, in total, facilitate differentiation of the magnetic edges of the free magnetic region and fixed magnetic region of, for example, a magnetoresistive memory stack/structure.

Figure 3A:
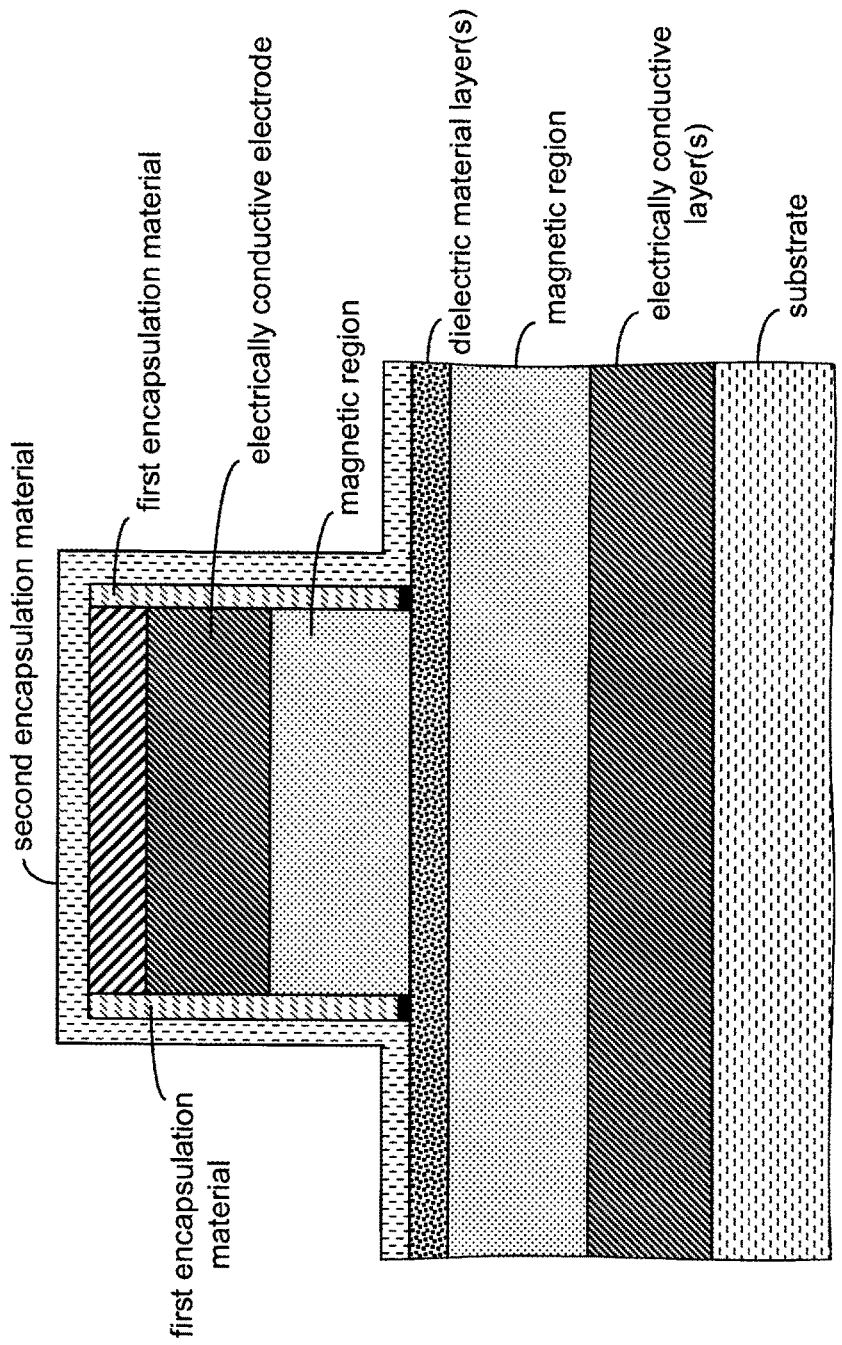
FIGS. 3A-3D illustrate cross-sectional views of a magnetoresistive stack/structure at selected stages of manufacturing in accordance with another embodiment of the present inventions.
Figure 3B:
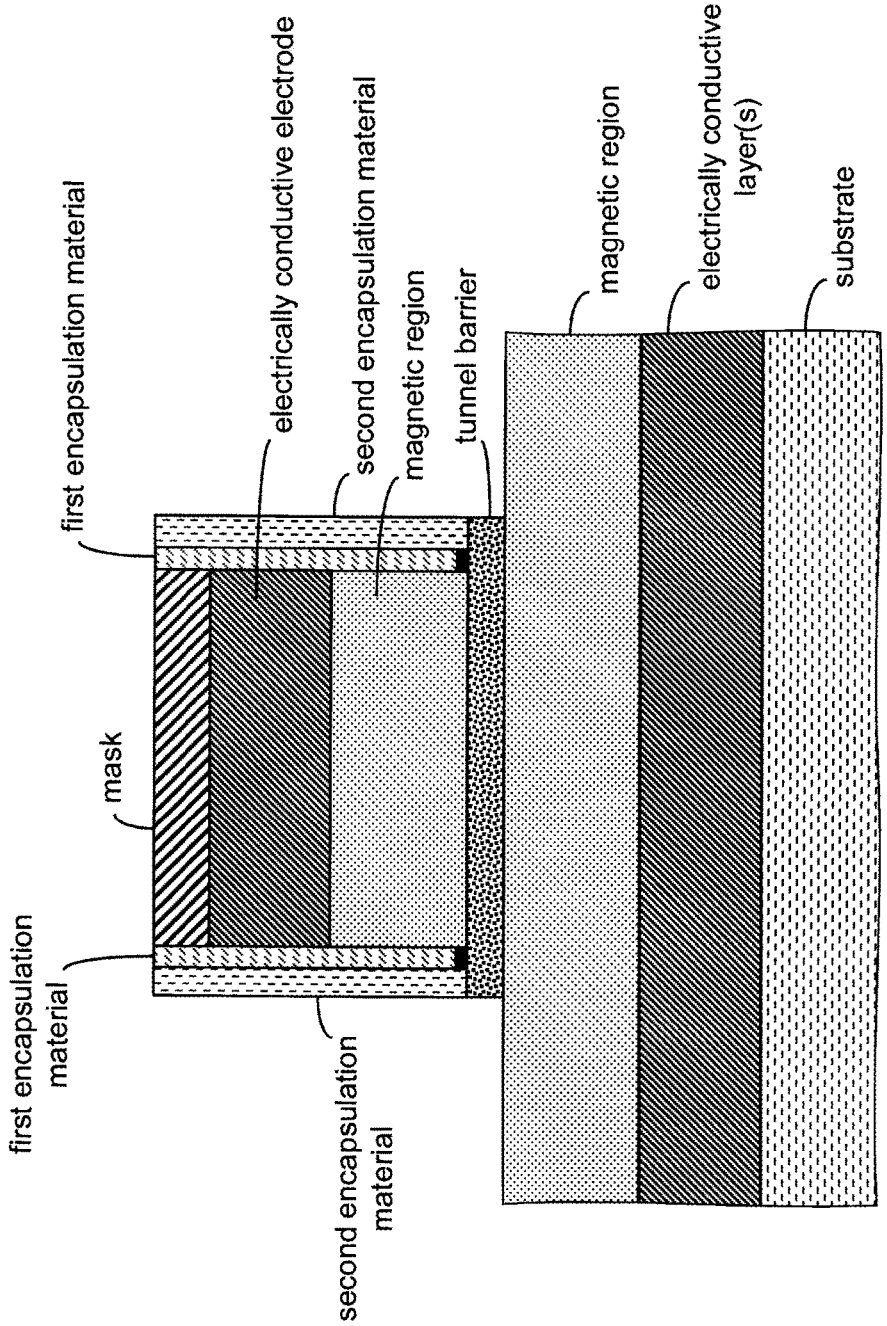
Figure 3C:
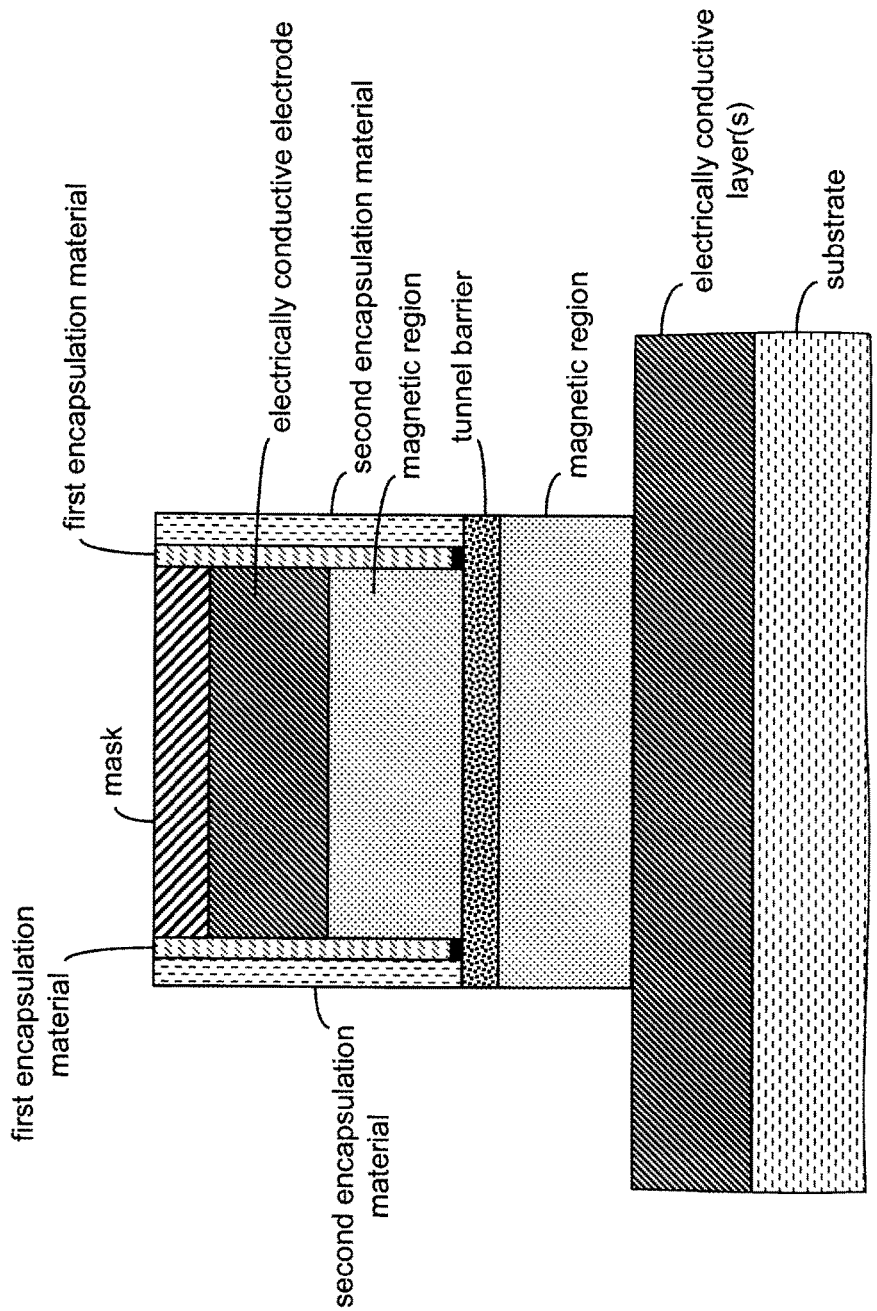
Figure 3D:
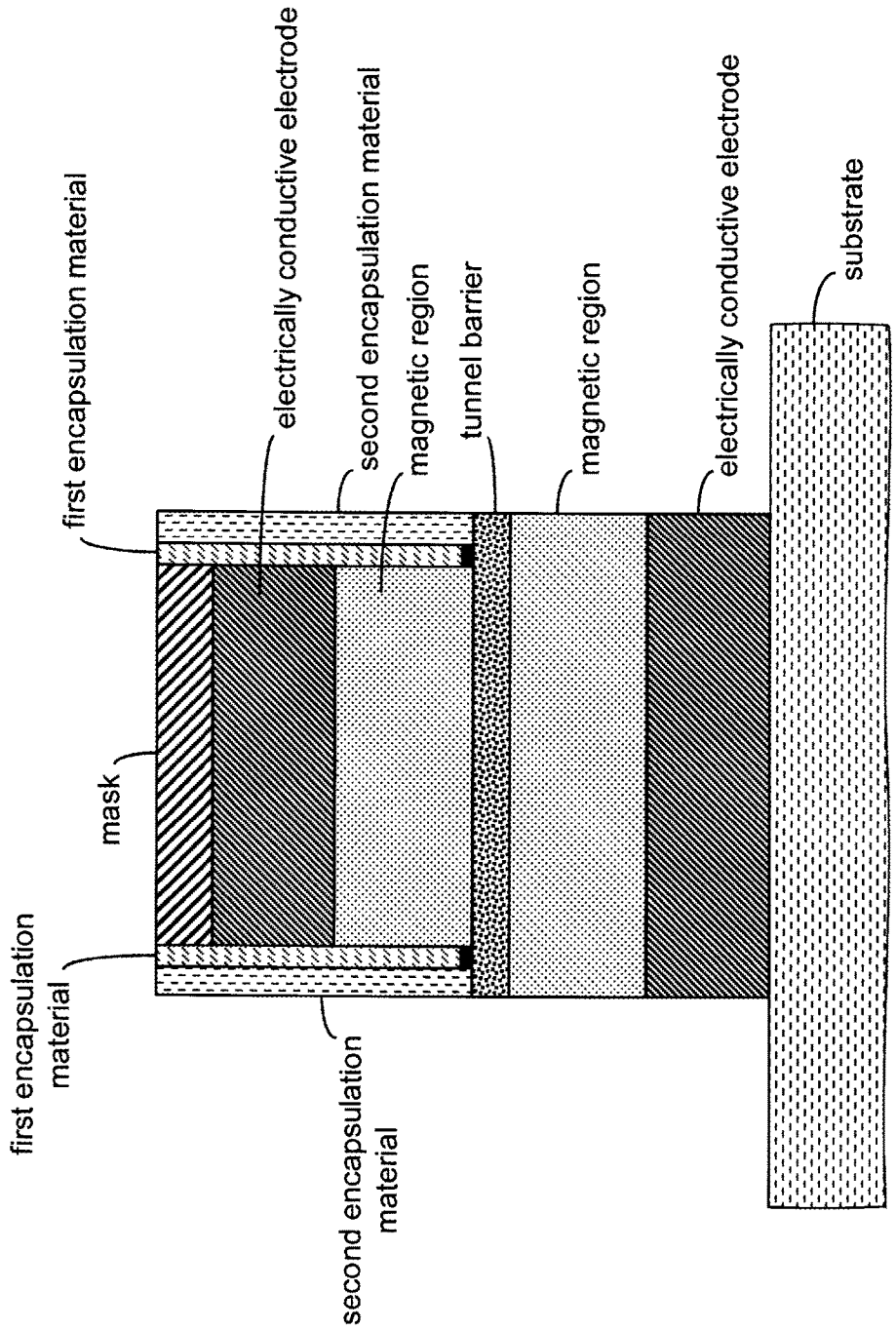

After deposition of the second encapsulation material, one or more etch processes may be employed to remove portions of the dielectric material layer(s) to form the tunnel barrier (see FIG. 3B), the magnetic region beneath the tunnel barrier (see FIG. 3C), and the electrically conductive electrode beneath the tunnel barrier (see FIG. 3D). Such etching may also be via conventional techniques. Indeed, any techniques and/or recipes now known or later developed may be employed to form the tunnel barrier, magnetic region (which, in operation, is either the free magnetic region or the fixed magnetic region) and electrically conductive electrode beneath the tunnel barrier.

Figure 4A:
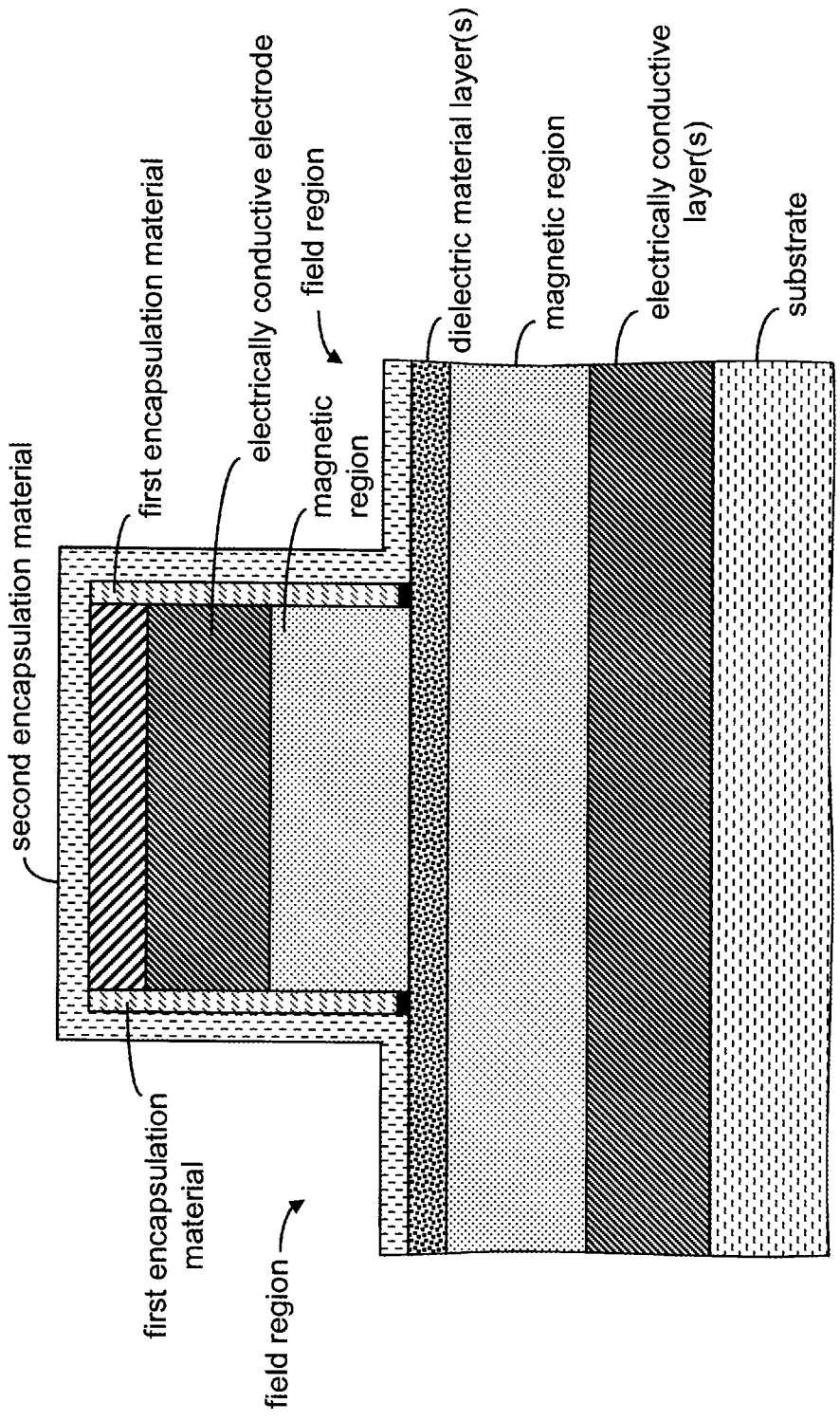
FIGS. 4A-4E illustrate cross-sectional views of a magnetoresistive stack/structure at selected stages of manufacturing in accordance with yet another embodiment of the present inventions.
Figure 4B:
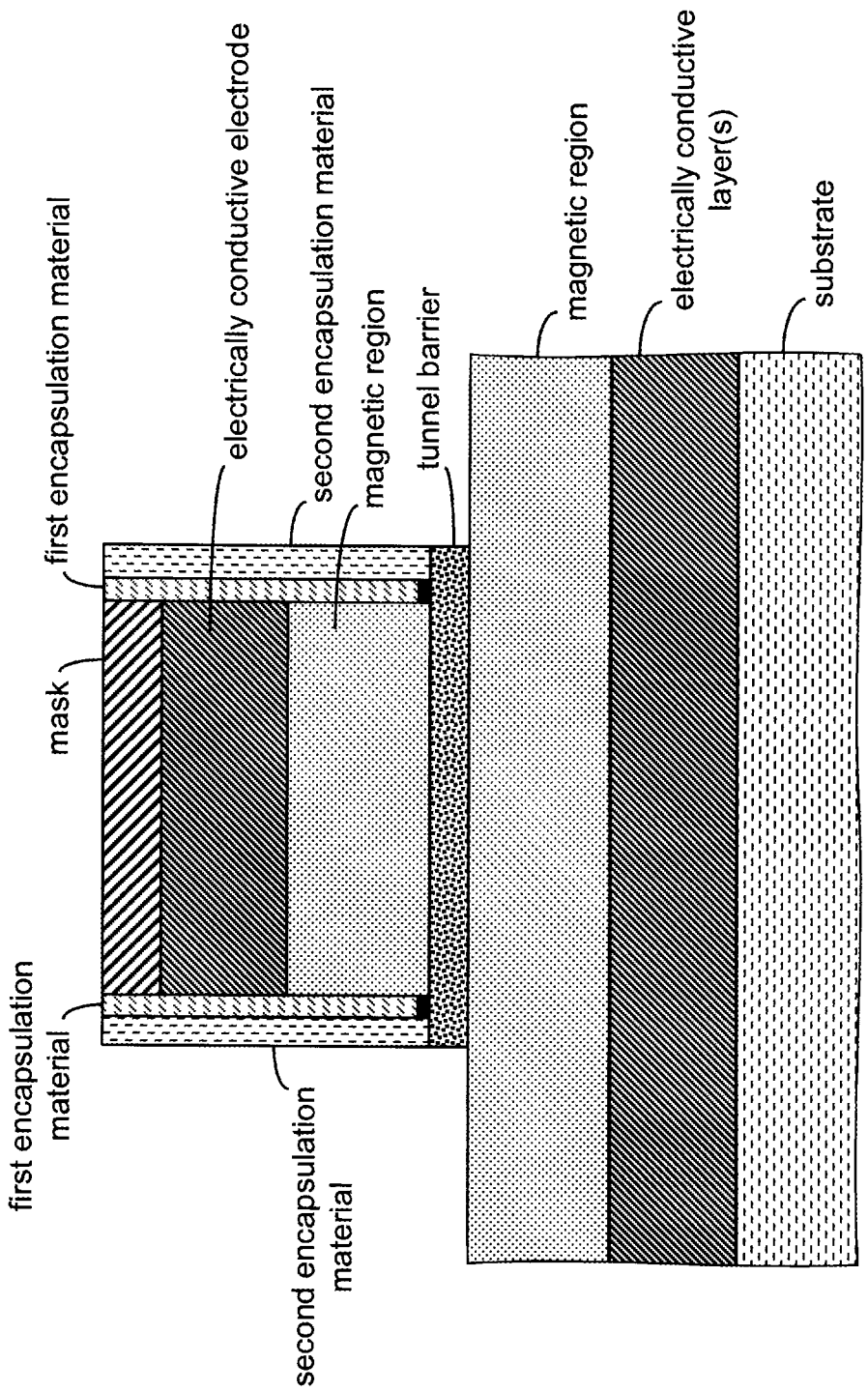
Figure 4C:
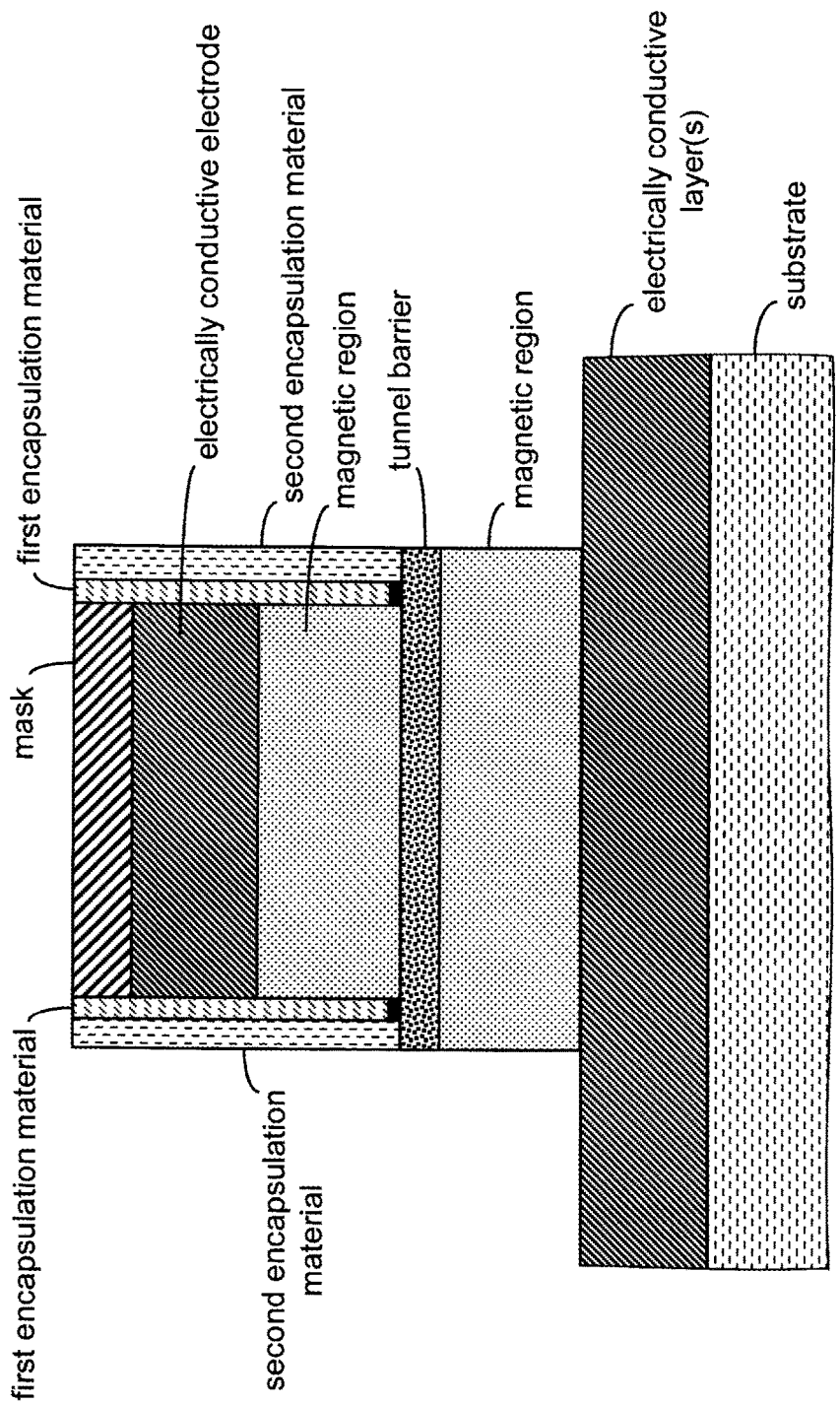
Figure 4D:
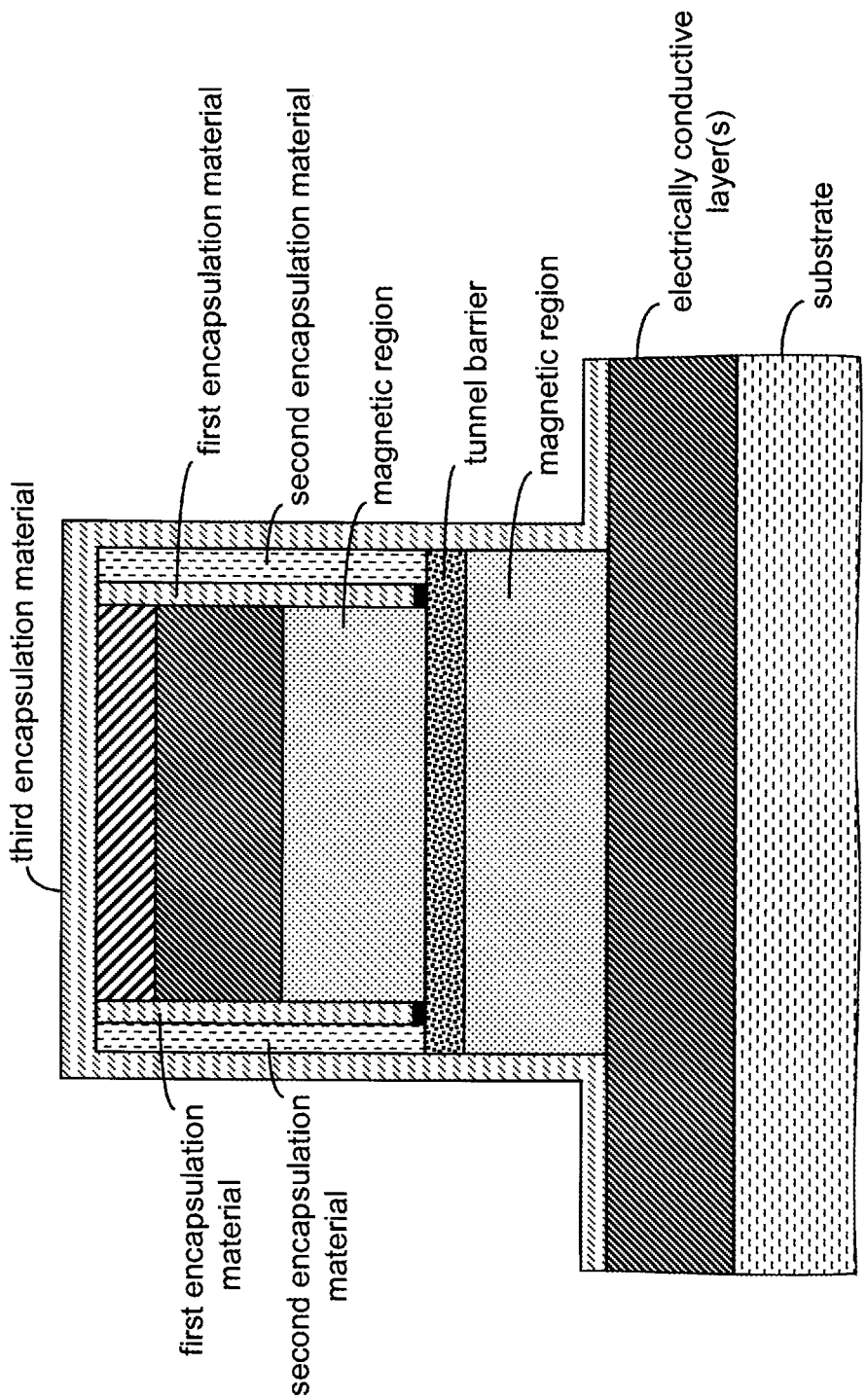

In yet another embodiment, with reference to FIGS. 1A-1G and 4A-4E, after removal of all or substantially all of the re-deposited materials, a second encapsulation material is deposited on the partially formed structure and in the field regions, and the dielectric material layer(s) are etched to form the tunnel barrier (see FIG. 4B) and the one or more layers of the magnetic region are etched to form a second magnetic region (for example, a fixed magnetic region) of the magnetoresistive stack/structure (see FIG. 4C). Thereafter, a third encapsulation material is deposited (see FIG. 4D) on the partially formed MTJ stack/structure. The third encapsulation material may also be, for example, an aluminum oxide, a silicon oxide, a silicon nitride, a TEOS, an aluminum nitride or one or more combinations or alloys thereof. It may be advantageous that the amount of third encapsulation layer on the exposed surfaces (i.e., the sidewalls) of second magnetic region (i.e., the magnetic region beneath the tunnel barrier) be sufficiently thick to protect the tunnel barrier and magnetic region beneath the tunnel barrier from damage or contamination during etching of the electrically conductive layer(s) to form the electrically conductive electrode. As noted above, the thicknesses of the first, second and third encapsulation layer may be different from each other. Indeed, the encapsulation layers disposed on the sidewalls of the partially formed stack/structure may be employed in a self-aligned etch process when forming other portions of the stack/structure.

Figure 4E:
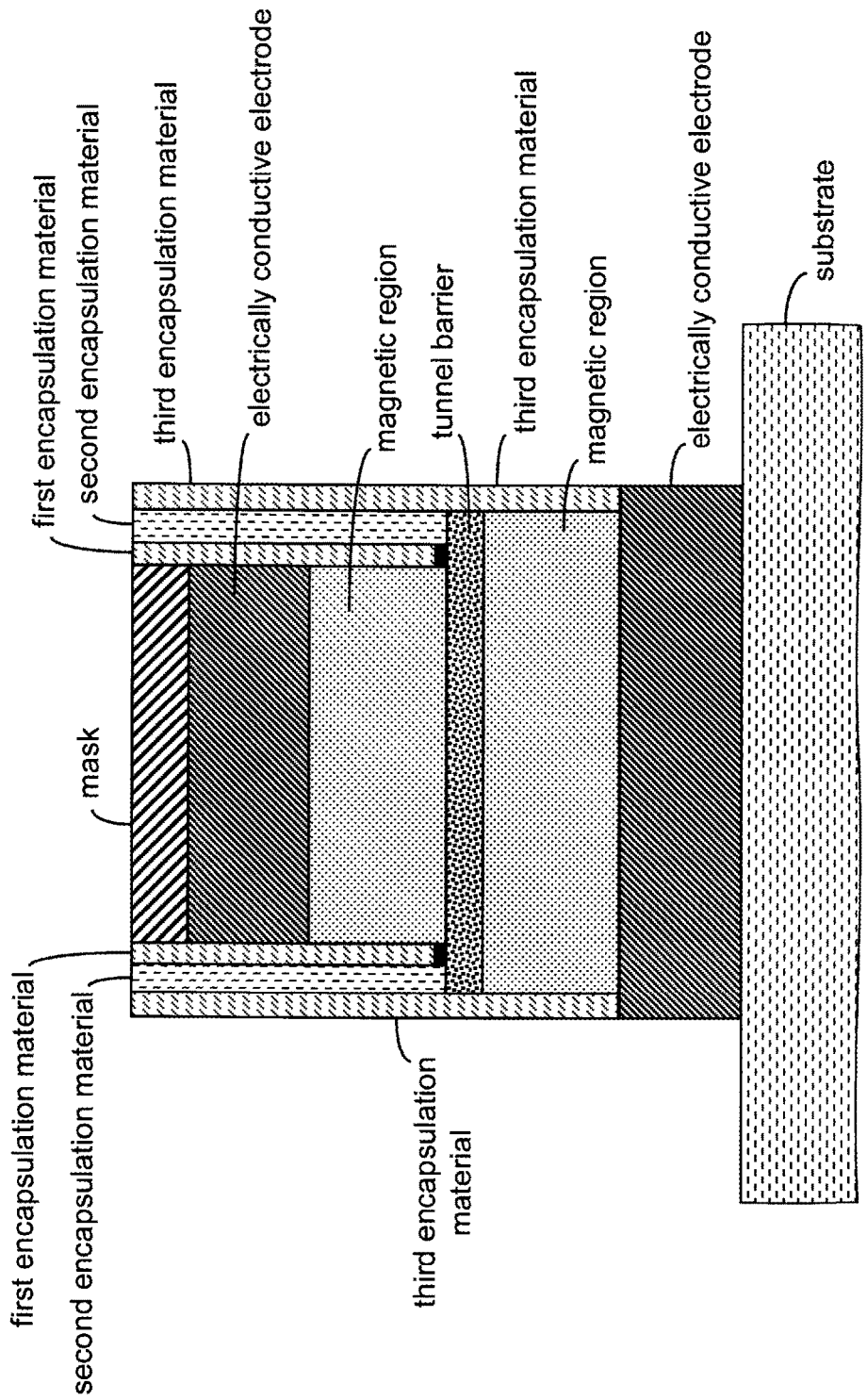

To that end, after deposition of the third encapsulation material, one or more etch processes may be employed to form the electrically conductive electrode beneath the tunnel barrier (see FIG. 4E). Such etching may also be via conventional techniques. Indeed, any techniques and/or recipes now known or later developed may be employed to form the tunnel barrier, magnetic region beneath the tunnel barrier (which may be either the free magnetic region or the fixed magnetic region of the magnetoresistive stack/structure) and electrically conductive electrode beneath the tunnel barrier. (See, FIGS. 4B-4E).

Notably, one or more, or all of the materials of the encapsulation layers described herein may consist or include the same materials or different materials—for example, one of the encapsulation materials includes an aluminum oxide, another encapsulation material includes a silicon nitride or a silicon oxide, and yet another encapsulation material (in those embodiments where more than two encapsulation layers are employed) includes a TEOS, aluminum nitride, an aluminum oxide or a magnesium oxide, or one or more combinations thereof. Indeed, the encapsulation techniques and materials may employ the subject matter described and/or illustrated in U.S. Provisional App. No. 62/249,196, entitled "Magnetoresistive Device and Method of Manufacturing Same", filed Oct. 31, 2015 (which, as indicated above, is incorporated herein by reference in its entirety). Here, the inventions/embodiments of U.S. Provisional App. No. 62/249,196 may be employed in conjunction with the inventions/embodiments described and/or illustrated herein. Moreover, the technique employed in connection with depositing the encapsulation layers on the partially formed MTJ stack/structure and on or in the field region may be the same or different. All combination and permutations of materials and techniques are intended to fall within the scope of the present inventions.

Figure 5A:
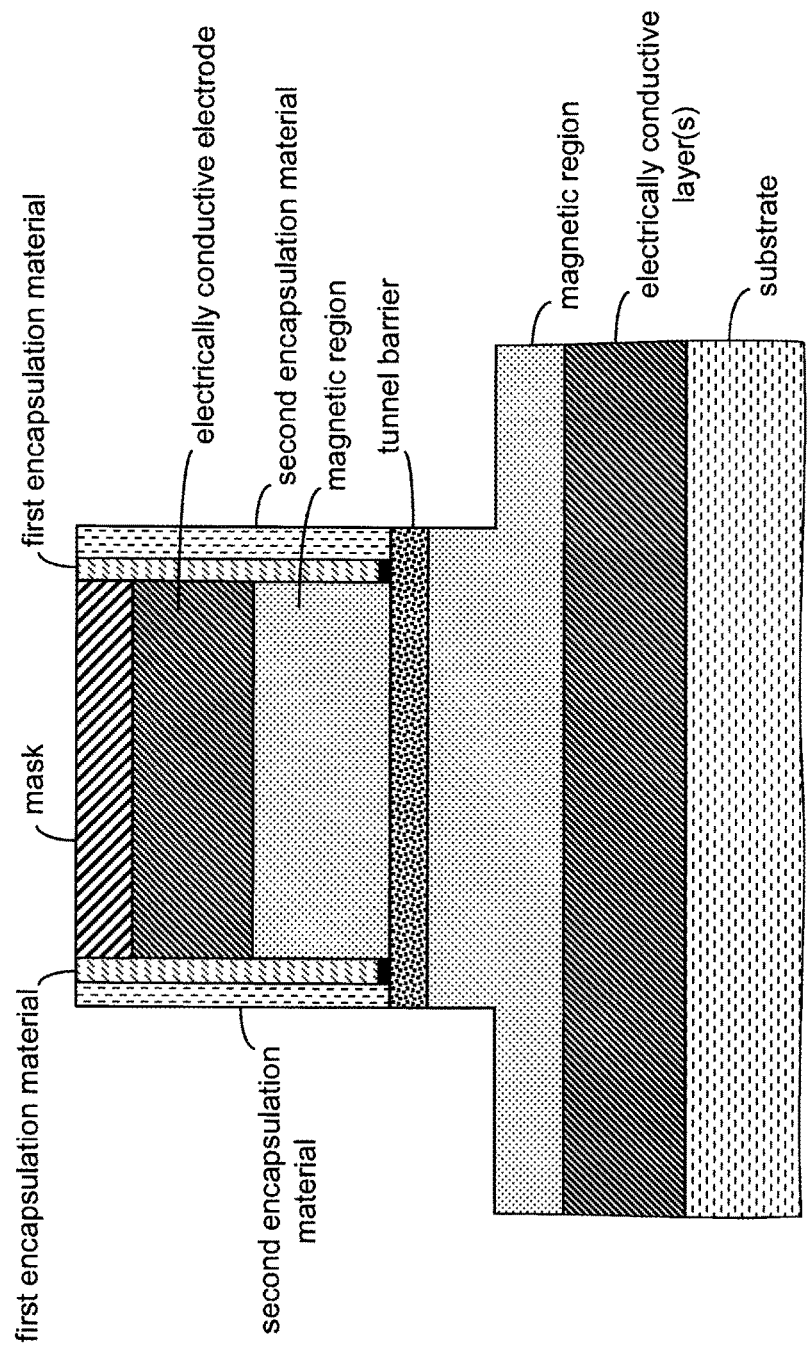
FIGS. 5A-5D illustrate cross-sectional views of a magnetoresistive stack/structure at selected stages of manufacturing in accordance with another embodiment of the present inventions.
Figure 5B:
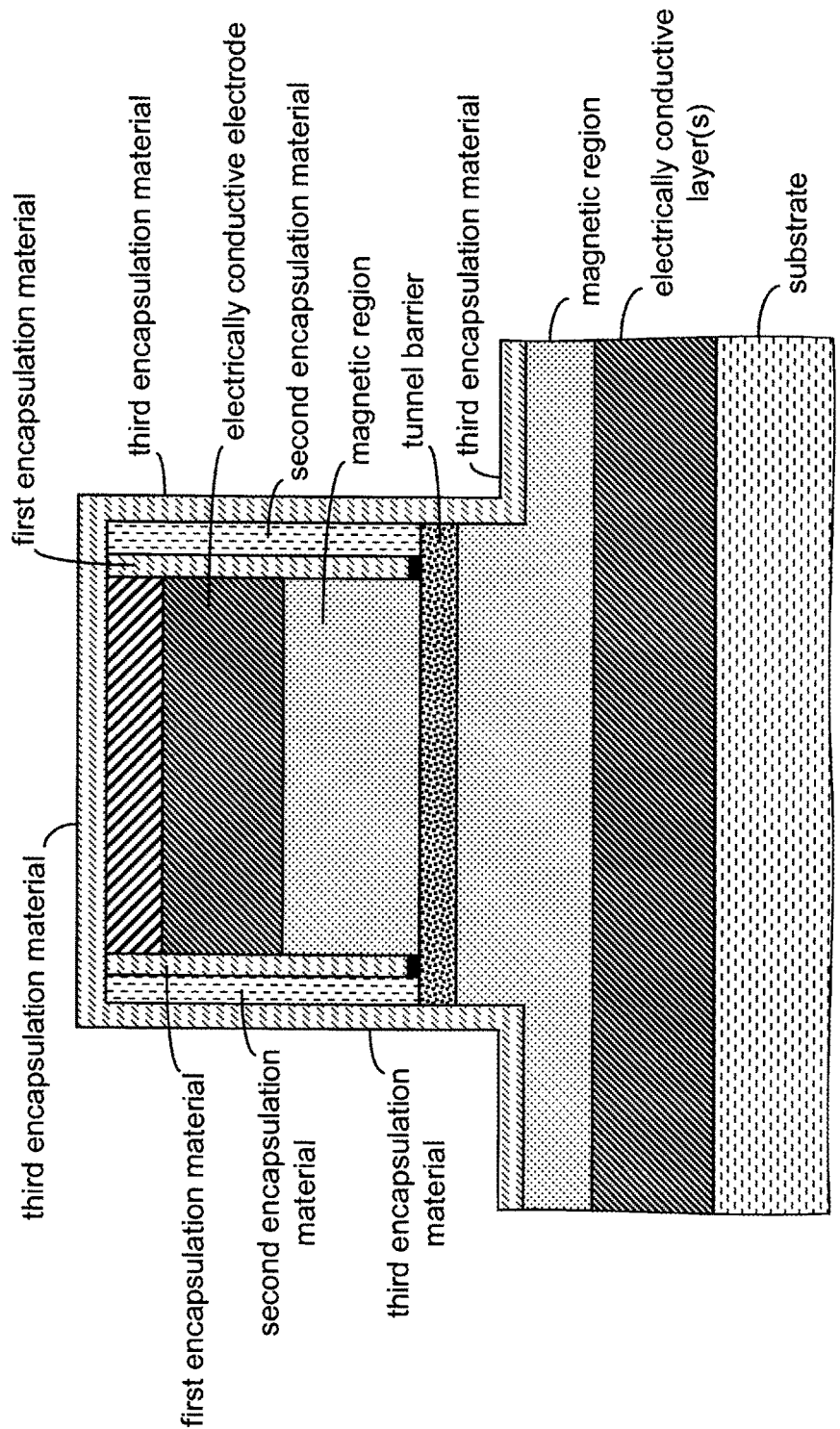
Figure 5C:
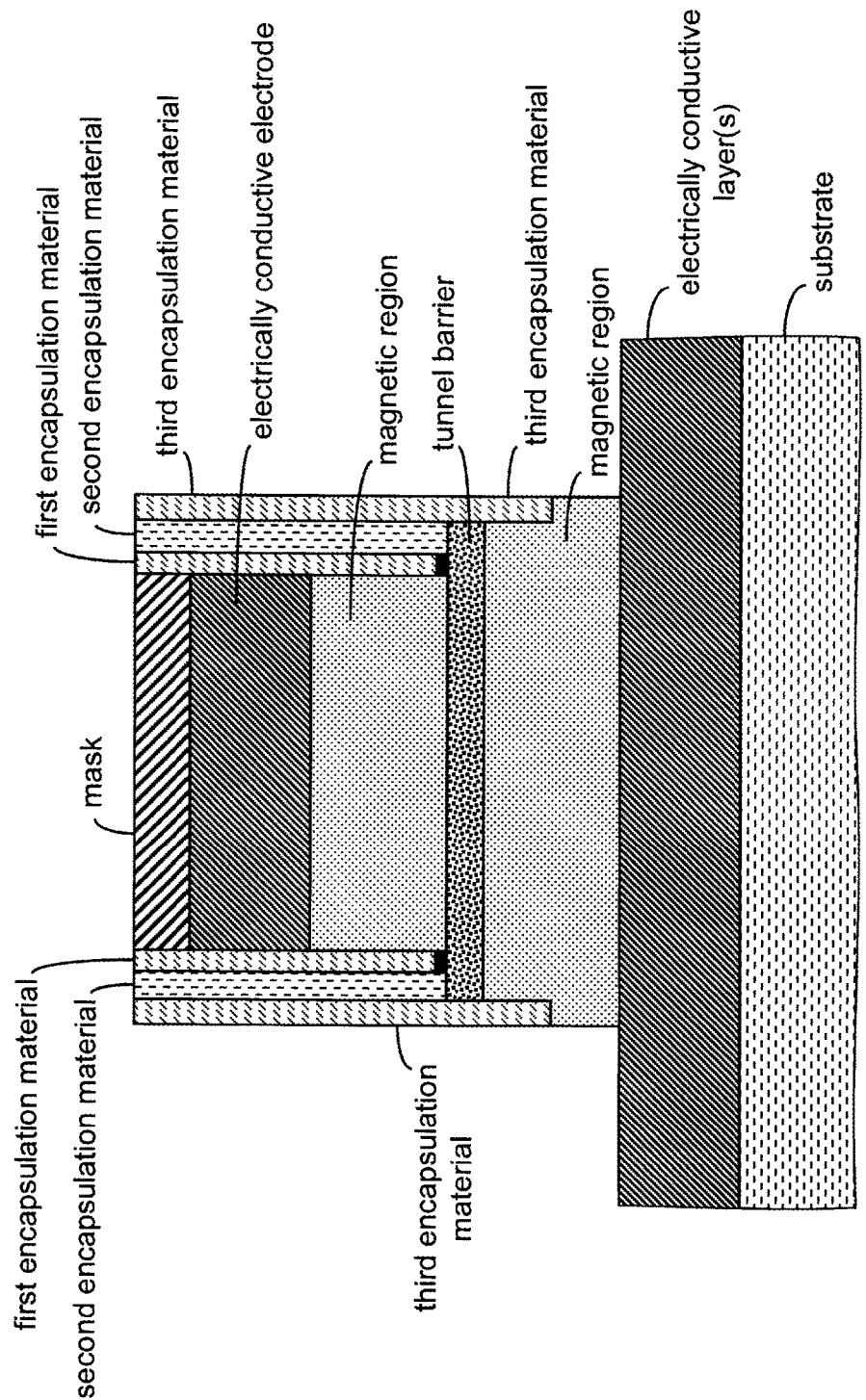
Figure 5D:
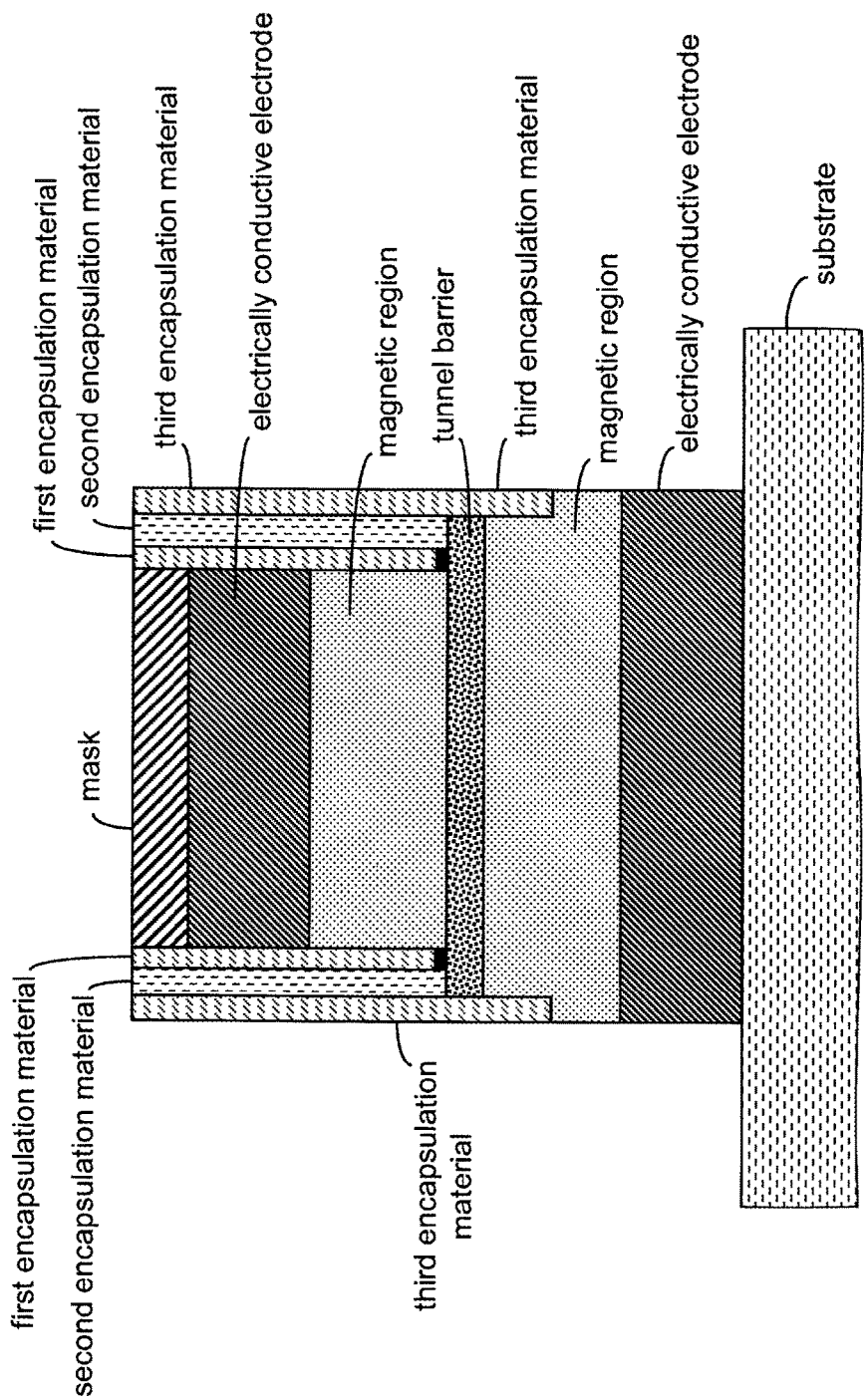

In another embodiment, with reference to FIGS. 1A-1G, 4A, 4B and 5A-5D, after removal of all or substantially all of the re-deposited materials, a second encapsulation material is deposited, the tunnel barrier layer(s) and a portion of the magnetic region disposed or located below the tunnel barrier layer(s) are etched thereby forming the tunnel barrier and a portion of the second magnetic region of the magnetoresistive stack/structure. (See FIG. 5A) Thereafter, a third encapsulation material is deposited (see FIG. 5B) on the partially formed MTJ stack/structure including the partially etched magnetic region located under or below the tunnel barrier layer(s).

The MTJ stack/structure may then be completed by etching the remaining portion of the magnetic region and the electrically conductive layer(s). That is, with reference to FIGS. 5C and 5D, the remaining portion of the magnetic region and the electrically conductive layer(s) are then etched to form the second magnetic region (located beneath the tunnel barrier) and a bottom electrically conductive electrode, respectively. Such etching may also be via conventional techniques. Indeed, any techniques and/or recipes now known or later developed may be employed to form such the second magnetic region (which, in operation, is the free magnetic region or the fixed magnetic region of, for example, a magnetoresistive memory stack/structure) and electrically conductive electrode under or beneath the tunnel barrier (which provides a bottom electrode for the magnetoresistive stack/structure).

Notably, certain aspects of the manufacturing embodiment of FIGS. 1A-1G, 4A, 4B and 5A-5D are similar to the embodiments described and/or illustrated in U.S. patent application Ser. No. 14/296,153, entitled "Isolation of Magnetic Layers During Etch in a Magnetoresistive Device", filed Nov. 3, 2014. The inventions/embodiments of U.S. patent application Ser. No. 14/296,153 may be employed in conjunction with the inventions/embodiments described and/or illustrated herein. The contents of U.S. patent application Ser. No. 14/296,153 are incorporated herein by reference.

Figure 6A:
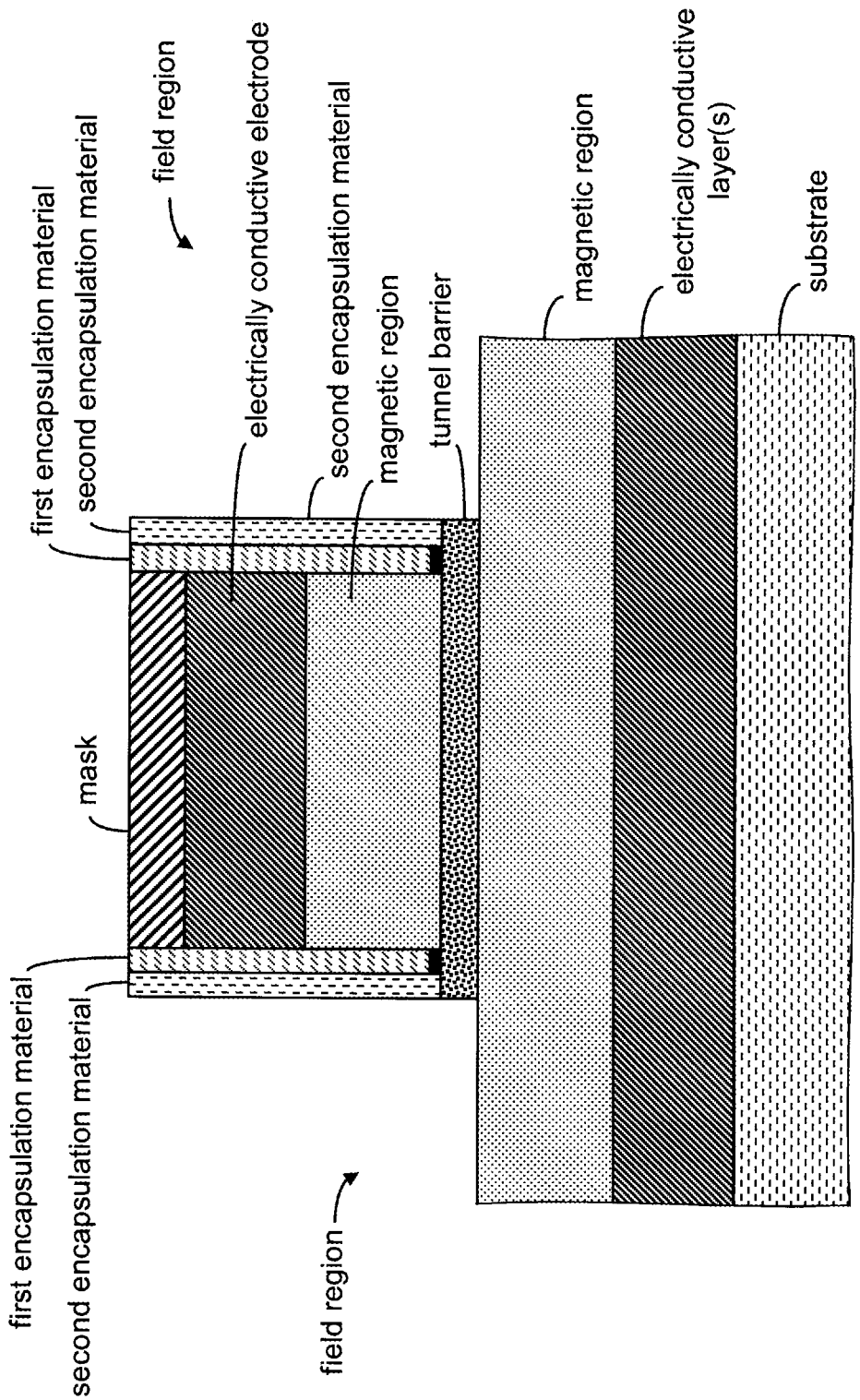
FIGS. 6A-6D illustrate cross-sectional views of a magnetoresistive stack/structure at selected stages of manufacturing in accordance with another embodiment of the present inventions.
Figure 6B:
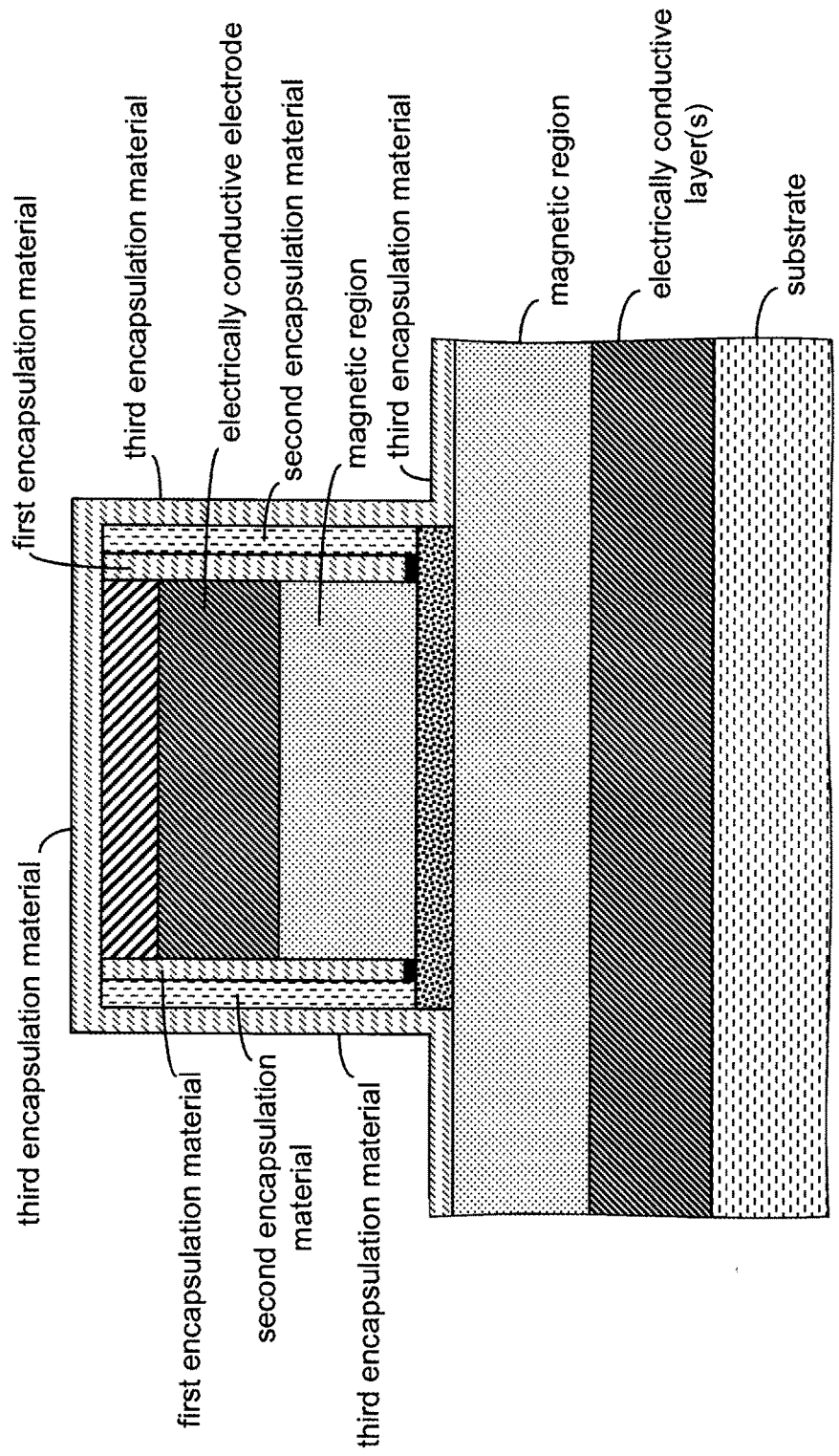
Figure 6C:
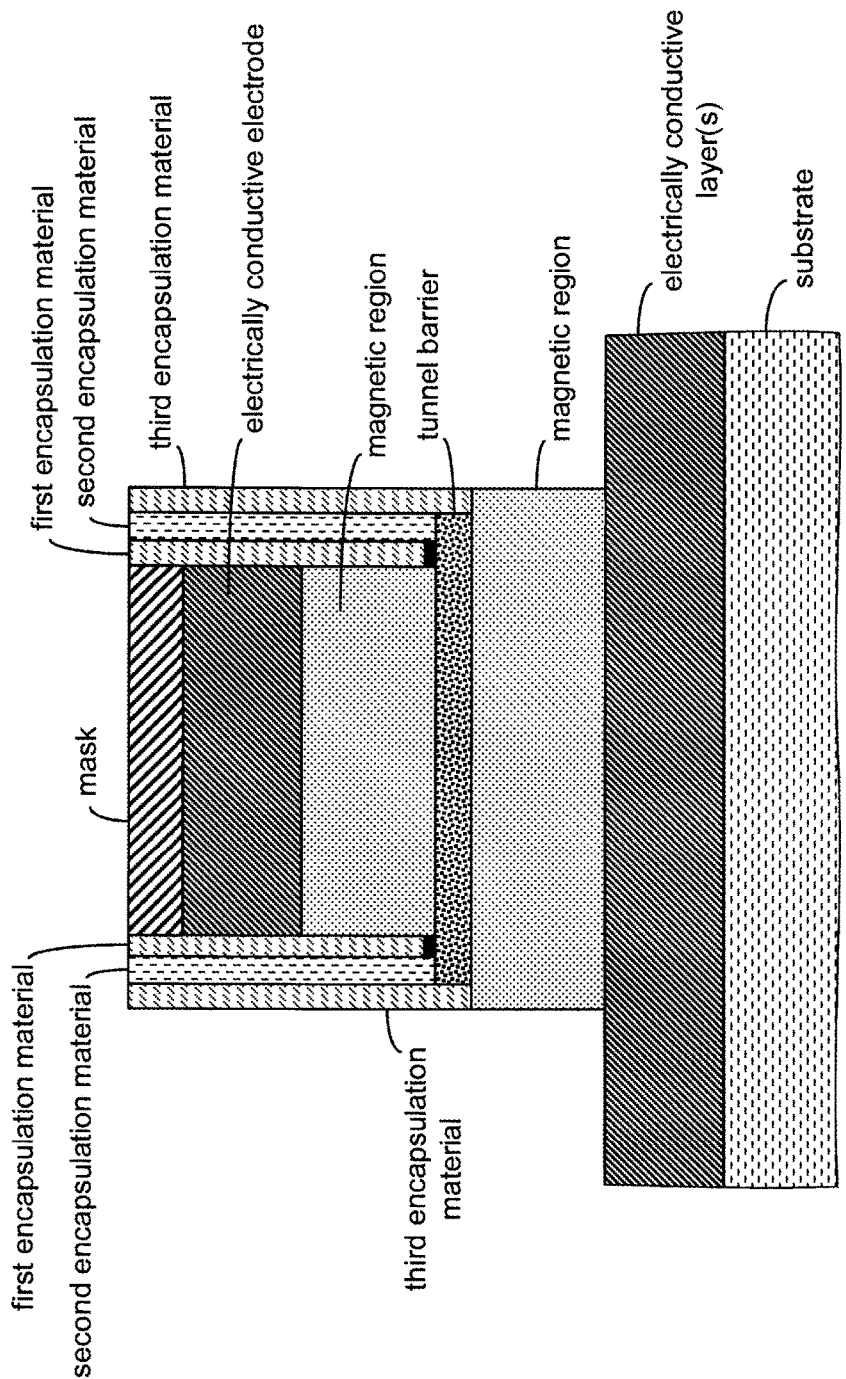

With reference to FIGS. 1A-1G, 4A and 6A-6D, in another embodiment, after removal of all or substantially all of the re-deposited materials (see FIGS. 1F and 1G), a second encapsulation material is deposited on the partially formed stack/structure (see FIG. 4A) and one or more etch processes are performed on the dielectric material layer(s) to form the tunnel barrier (see FIG. 6A). A third encapsulation material is deposited (see FIG. 6B) on the partially formed MTJ stack/structure (for example, on all or substantially all of the exposed portions of the partially formed stack/structure—including the sidewalls of the tunnel barrier).

Figure 6D:
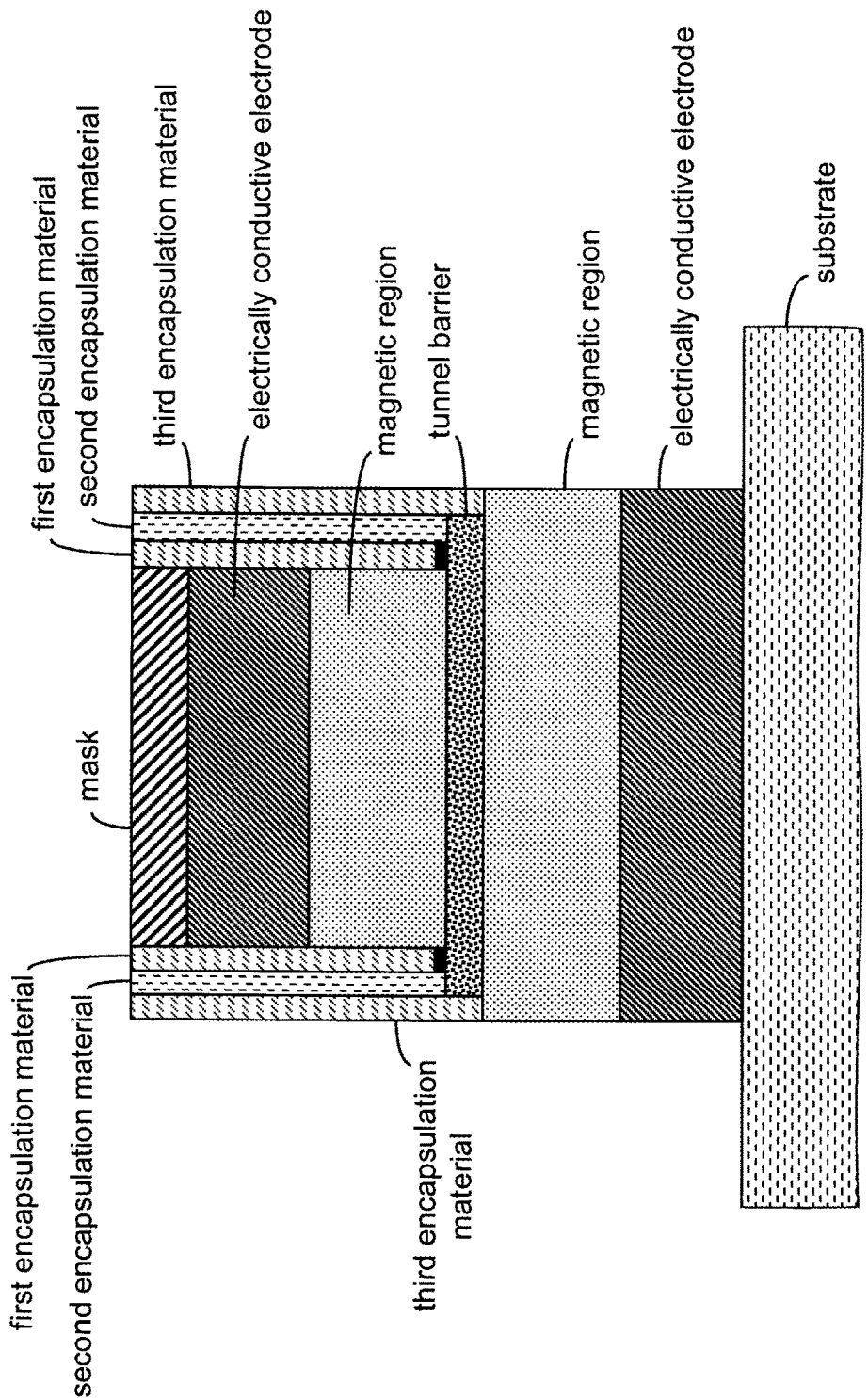

After deposition of the third encapsulation material, one or more etch processes may be employed to remove the third encapsulation material in the field region and form the magnetic region beneath the tunnel barrier (see FIG. 6C) and the bottom electrically conductive electrode (see FIG. 6D). Such etch processes may also be via conventional techniques. Indeed, any techniques and/or recipes now known or later developed may be employed to form the tunnel barrier and second magnetic region (which may be either the free magnetic region or the fixed magnetic region of the magnetoresistive device (for example, MTJ stack/structure)) and electrically conductive electrode beneath the tunnel barrier. (See, FIGS. 6C and 6D).

Notably, each of the thicknesses and material(s) of the first, second and/or third encapsulation layers may be the same or different. Moreover, the deposition and/or formation techniques of each of the first, second and/or third encapsulation layers may be the same or different. Indeed, as noted above, the encapsulation techniques and materials employed herein may be the same as those described and/or illustrated in U.S. Provisional App. No. 62/249,196 (which, as indicated above, is incorporated herein by reference in its entirety).

Further, the encapsulation layers disposed on the sidewalls of the partially formed stack/structure may be employed in a self-aligned etch process when forming other portions of the stack/structure. It may be advantageous to provide first, second and third encapsulation layers having thicknesses that, in total, facilitate differentiation of the magnetic edges of the magnetic material layer above the tunnel barrier from the magnetic material layer below the tunnel barrier so that the width, dimensions or diameter (depending on the shape of the stack/structure) of the upper or top magnetic region (i.e., the magnetic region disposed on or above the tunnel barrier) is a predetermined amount less than the width, dimensions or diameter of the lower or bottom magnetic region (i.e., the magnetic region upon which the tunnel barrier is disposed or located above).

Figure 7A:
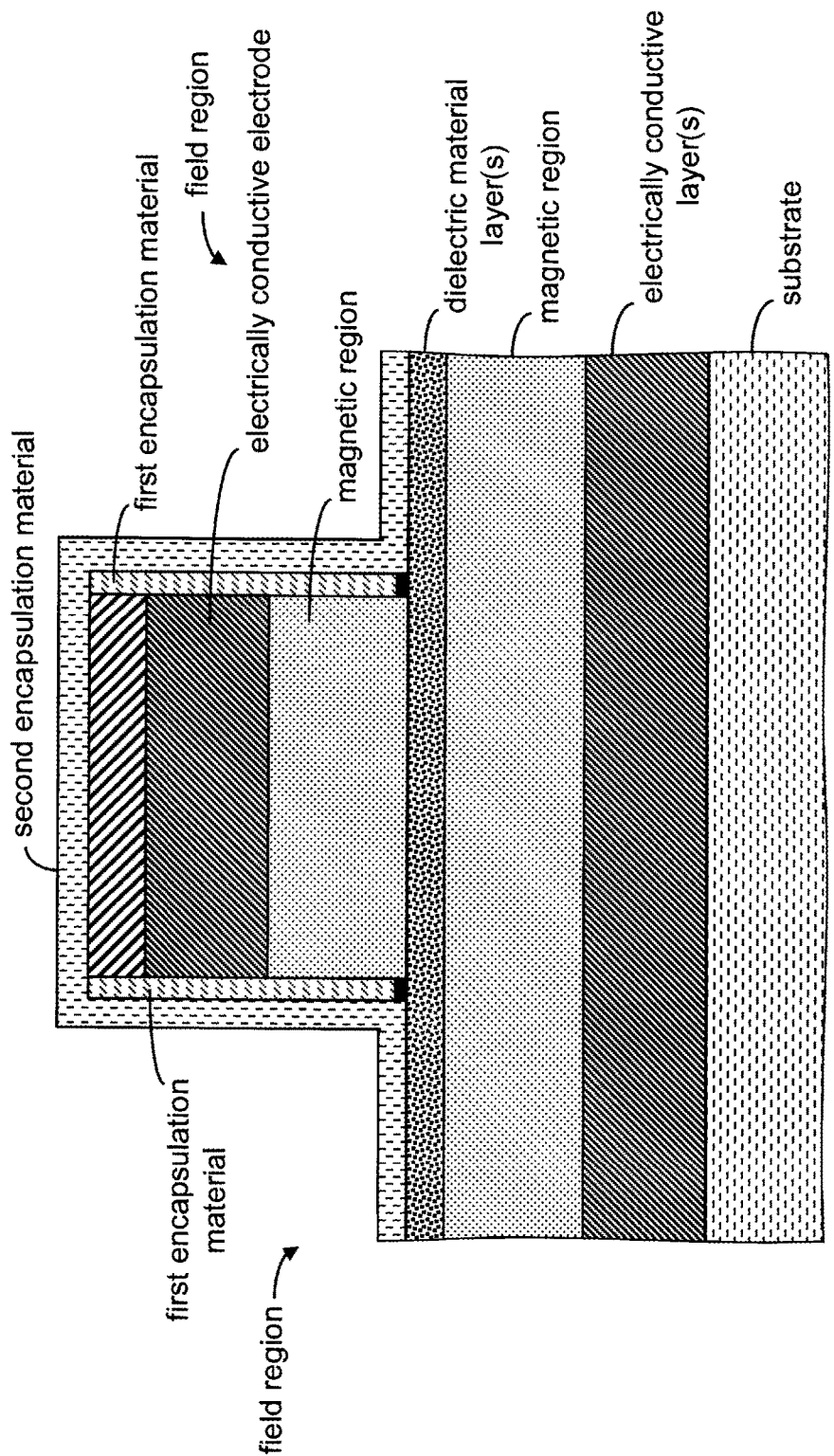
Figure 7B:
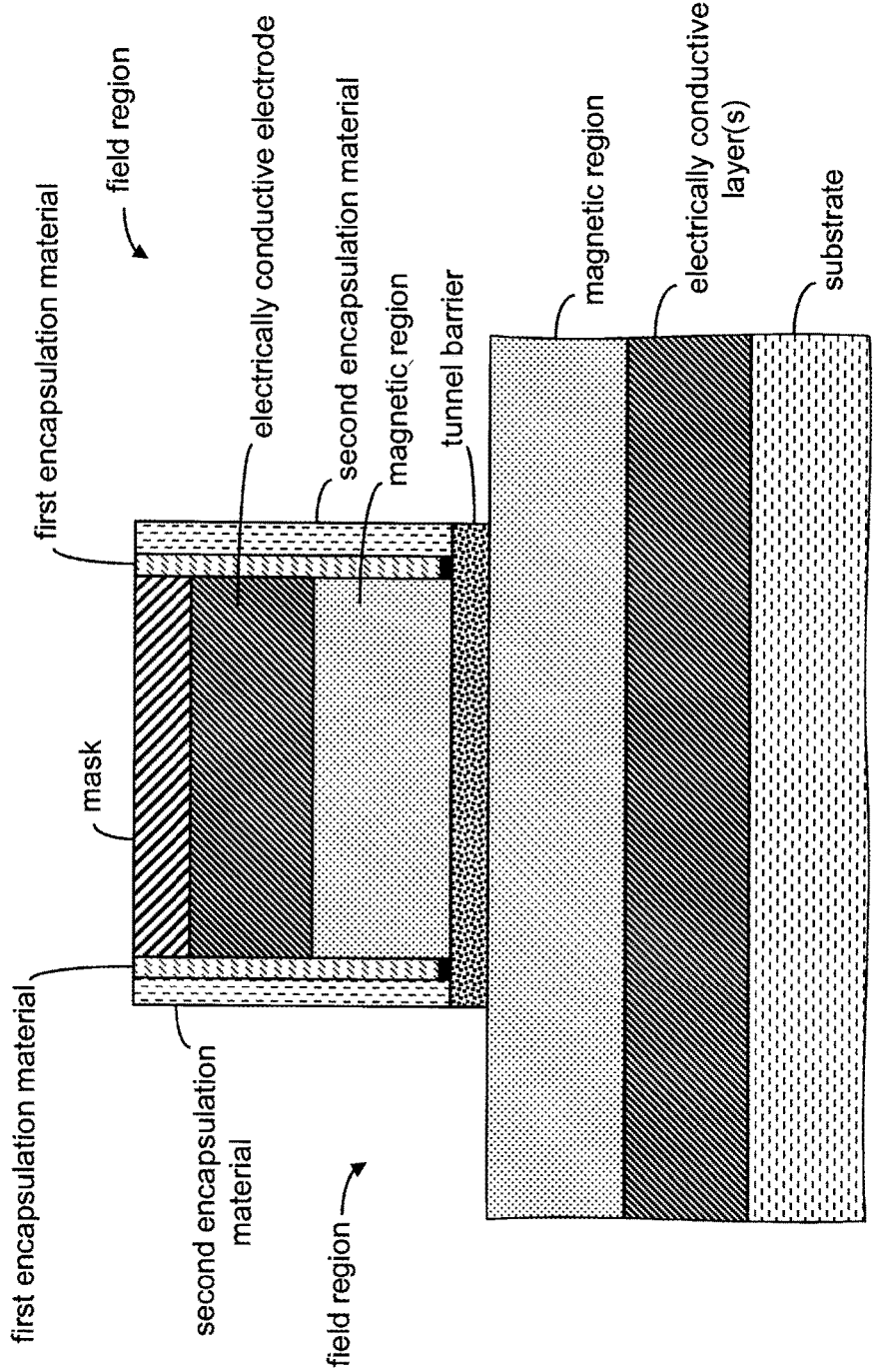
Figure 7C:
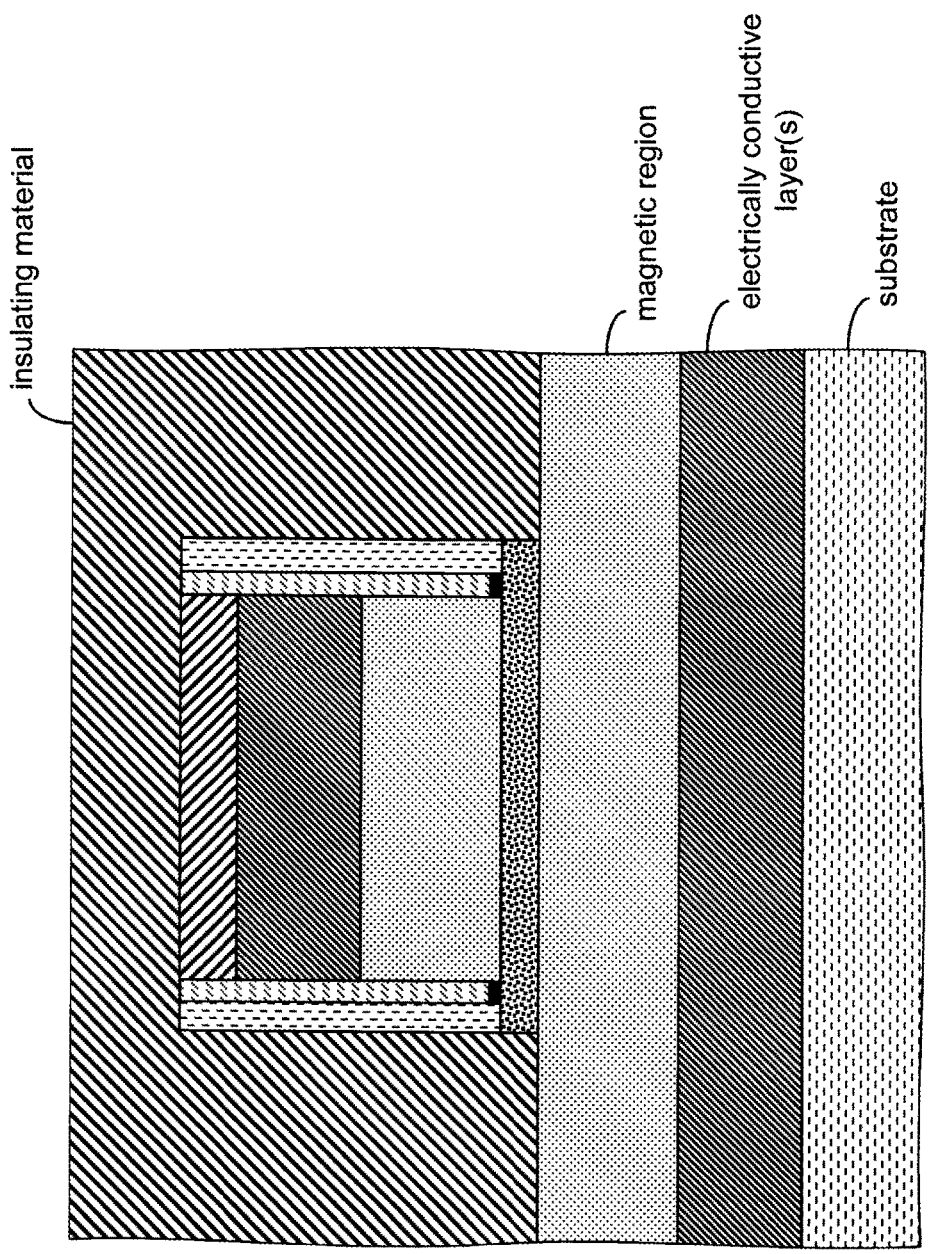
Figure 7D:
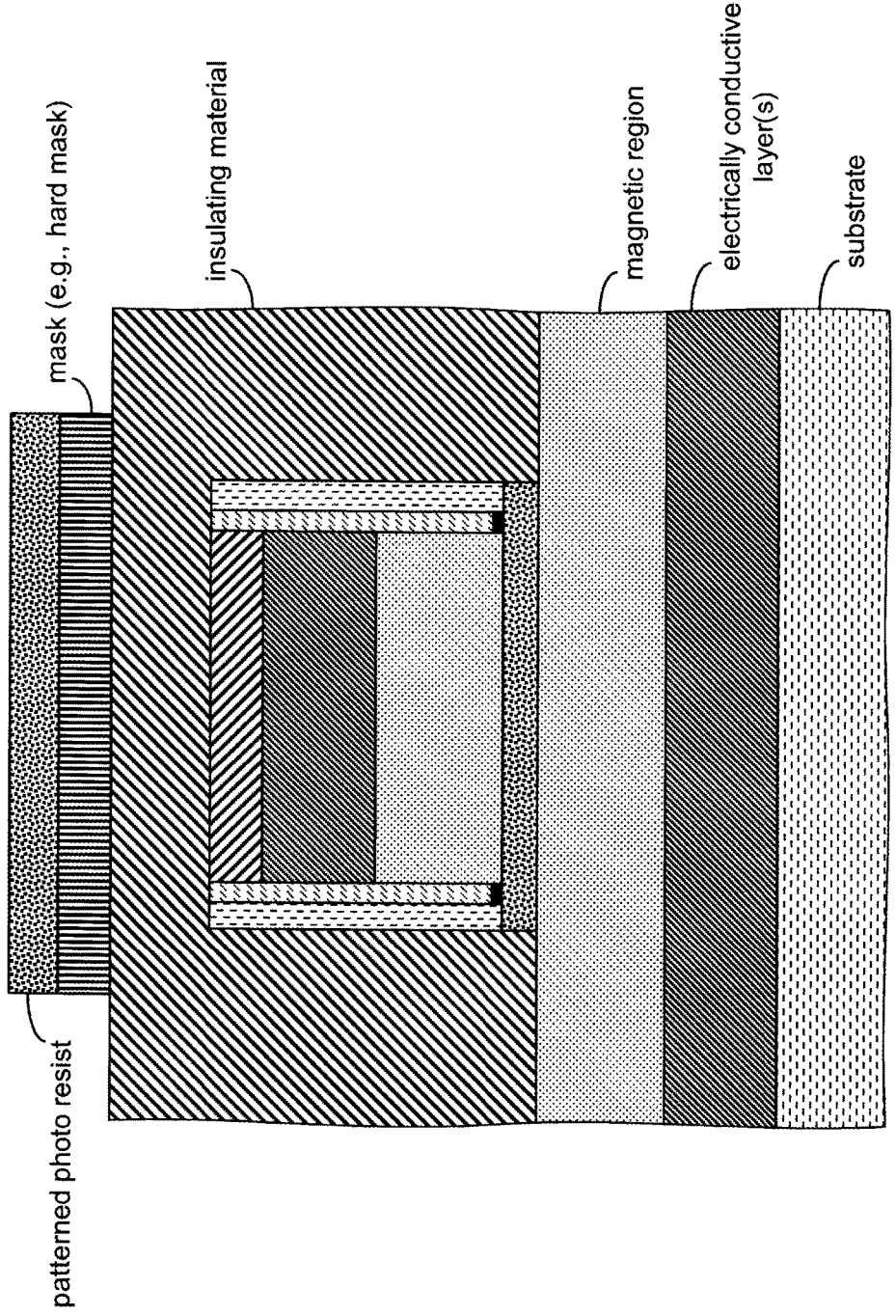
Figure 7E:
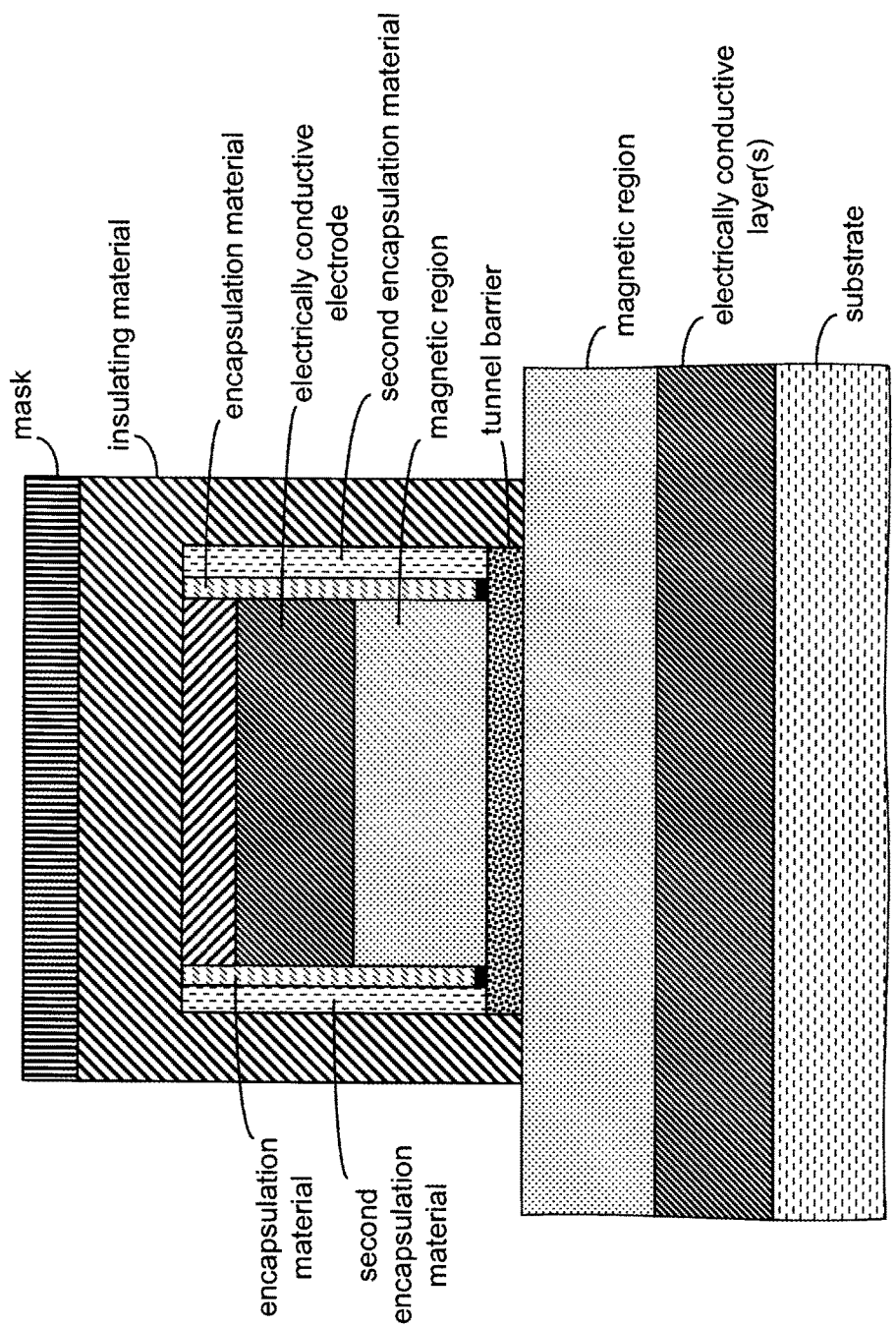

With reference to FIGS. 1A-1G and 7A-7H, in another embodiment, after removal of all or substantially all of the re-deposited materials (see FIGS. 1F and 1G), a second encapsulation material is deposited (see FIG. 7A) on the partially formed stack/structure—including on the first encapsulation material on the sidewalls of the magnetic region (i.e., free or fixed magnetic region). One or more etch processes are then performed to remove the second encapsulation material in the field region and form the tunnel barrier (see FIG. 7B). Thereafter, an insulating material (for example, a silicon oxide, silicon nitride and/or TEOS) is deposited (see FIG. 7C) and patterned using conventional techniques (see FIGS. 7D and 7E).

Figure 7F:
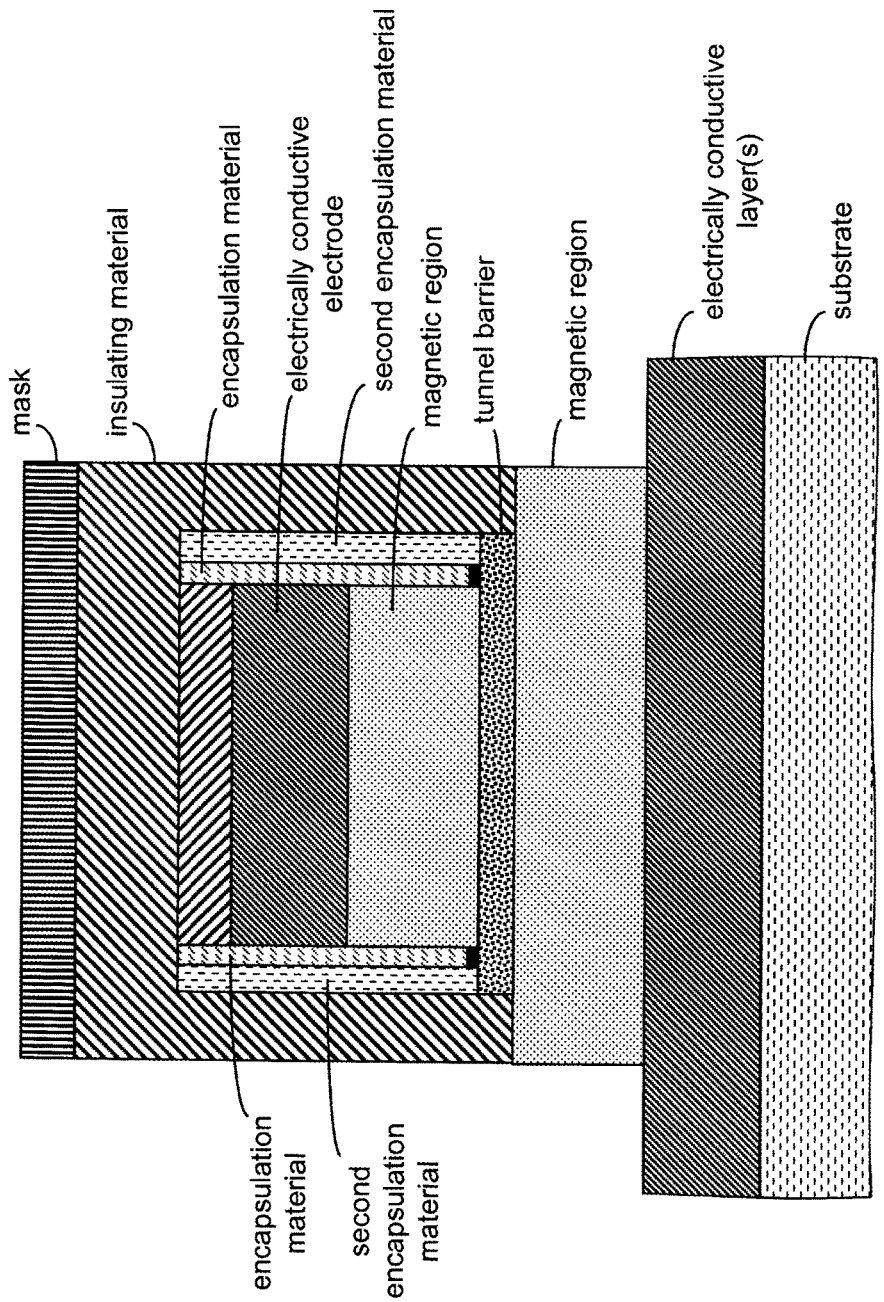
Figure 7G:
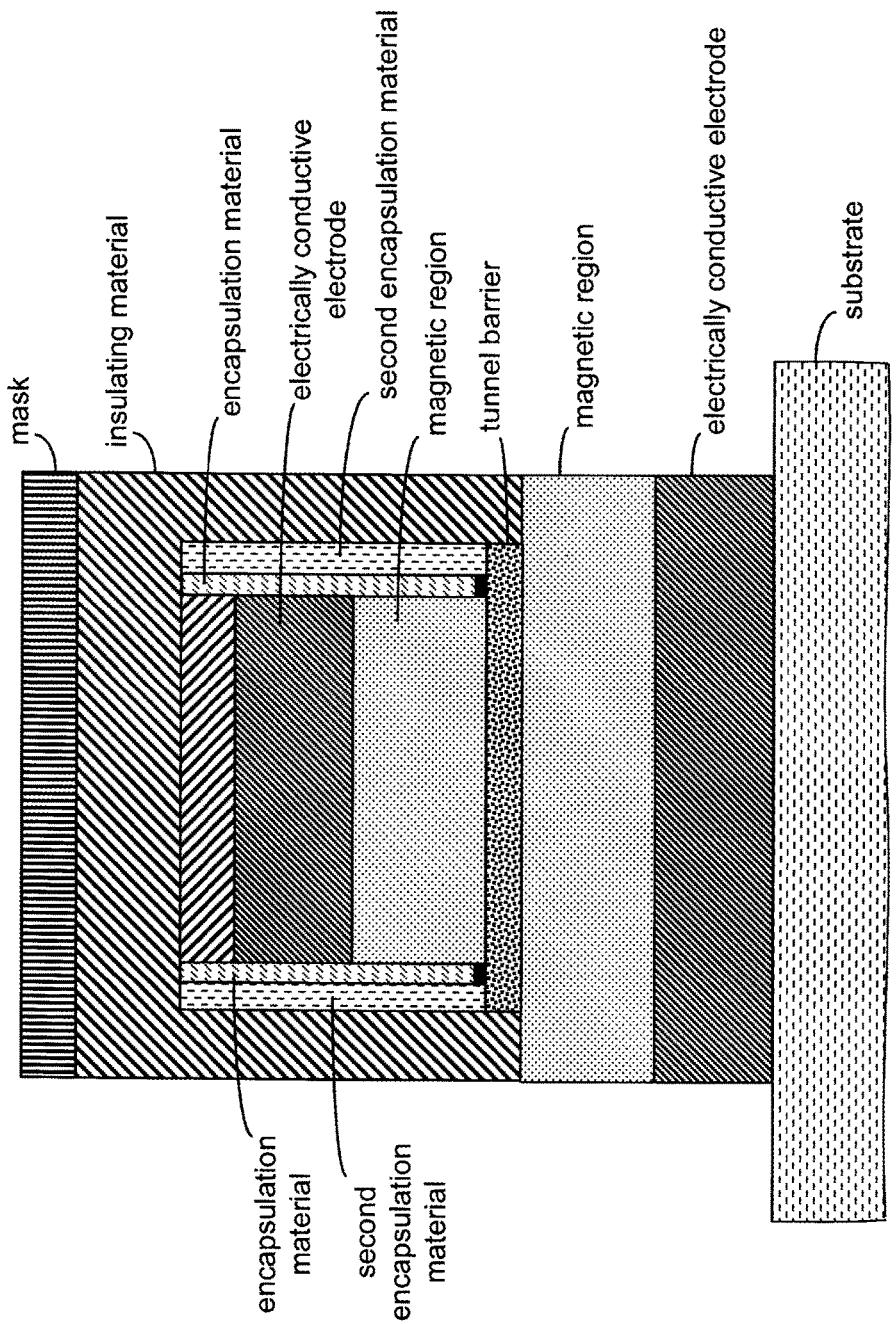

With reference to FIG. 7F, after patterning the insulating material, the magnetic layer(s) under or beneath the tunnel barrier may be etched to form the magnetic region. Thereafter, the electrically conductive layer(s) may be etched, using the insulating material as a mask, to form the electrically conductive bottom electrode. (See FIG. 7G). The insulating material, during the process of forming the magnetic region and electrically conductive bottom electrode, protects the tunnel barrier (and the magnetic region on or above the tunnel barrier). Notably, in another embodiment, the mask employed to pattern the insulating material may be removed (see FIG. 7H) and a via window formed in the insulating material (see FIG. 7I) to facilitate electrical contact (through a metal or conductive via) to the electrically conductive top electrode. Here, after forming the via window in the insulating material, an electrically conductive via is formed therein to contact the exposed electrically conductive electrode to provide connection to, for example, sense, read and/or write conductors, through a via (see FIG. 7J).

As noted above, the magnetoresistive structures/stacks of the present inventions may be formed on a via/conductor. In addition thereto, or in lieu thereof, a via/conductor may be formed on the magnetoresistive structures/stacks of the present inventions. In these embodiments, one or both separate electrodes are omitted and the via/conductor provide electrical connection to the magnetoresistive structure/stack thereby allowing for or facilitating electrical connectivity to circuitry and other elements of the device. Under these circumstances, the via(s)/conductor(s) is/are substitute(s) for electrode(s) formed from separate and distinct electrically conductive layer(s).

Figure 8A:
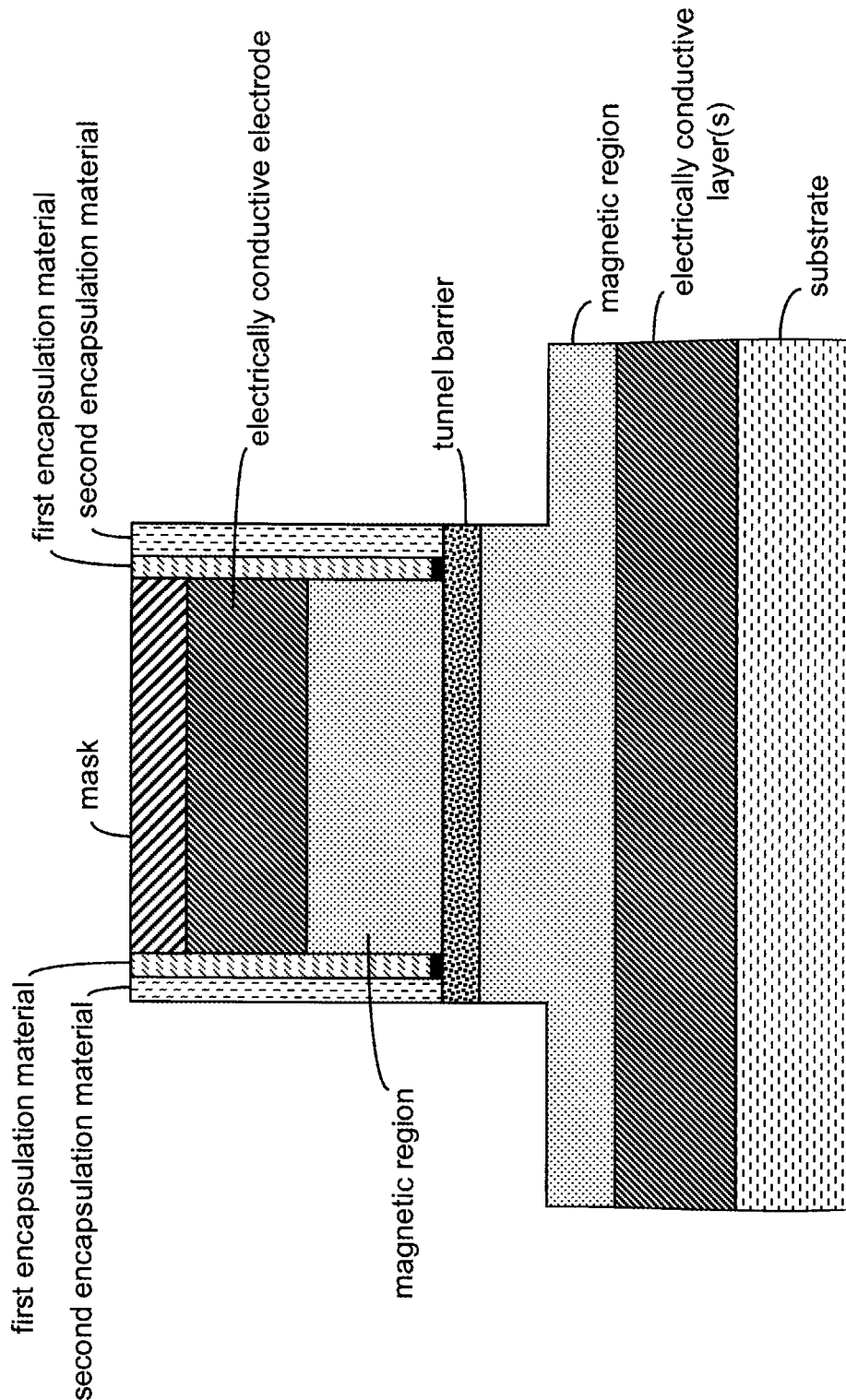
FIGS. 8A-8G illustrate cross-sectional views of a magnetoresistive stack/structure at selected stages of manufacturing in accordance with another embodiment of the present inventions.
Figure 8B:
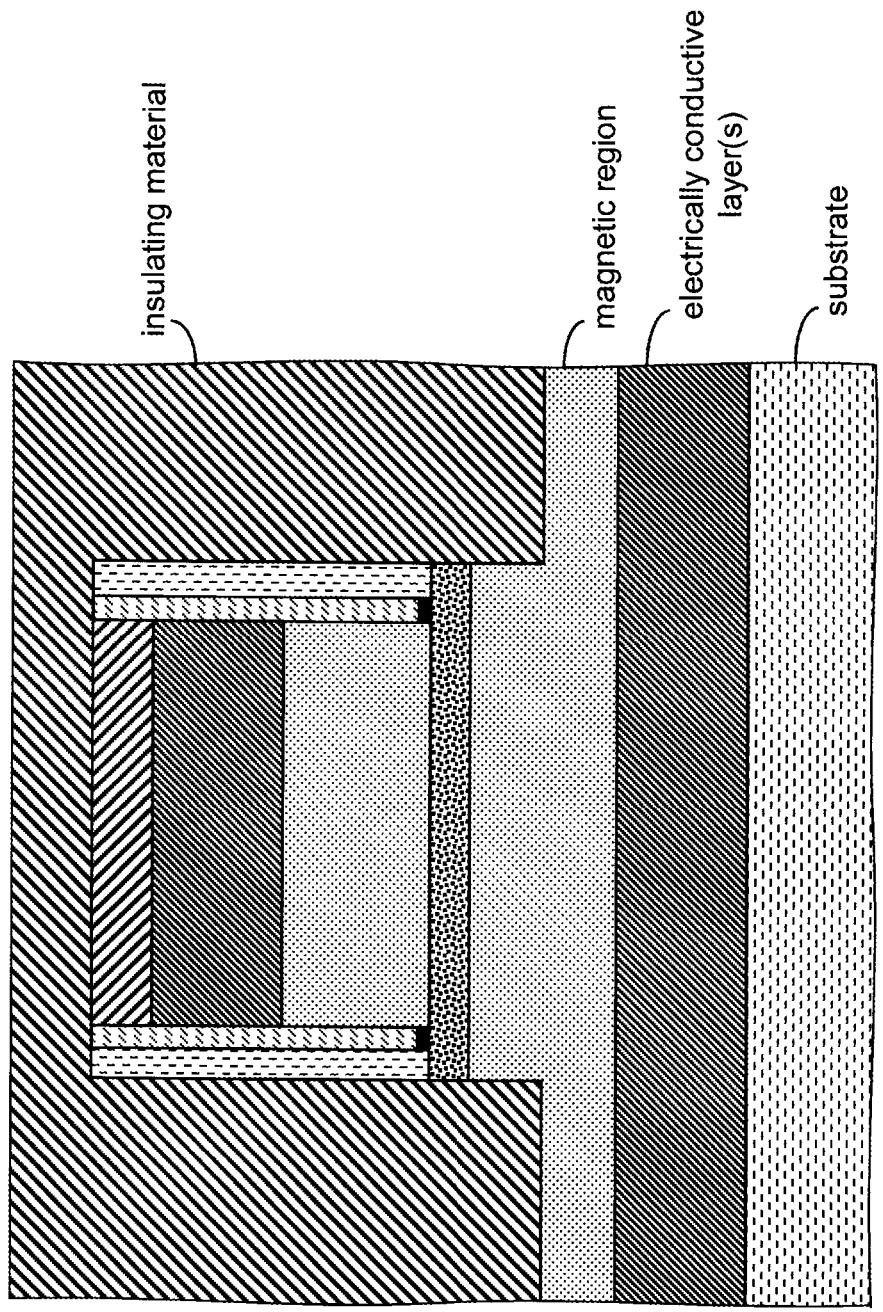
Figure 8C:
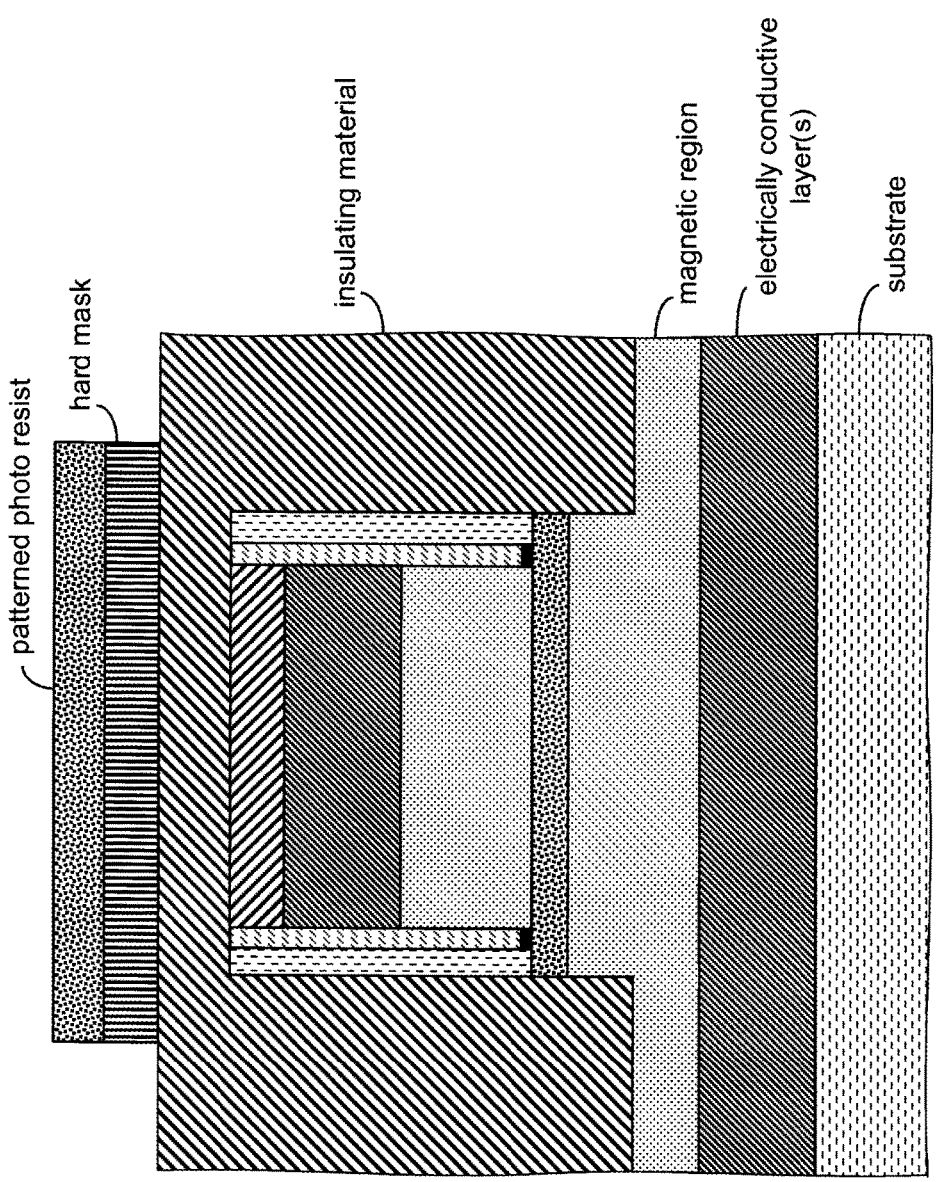
Figure 8D:
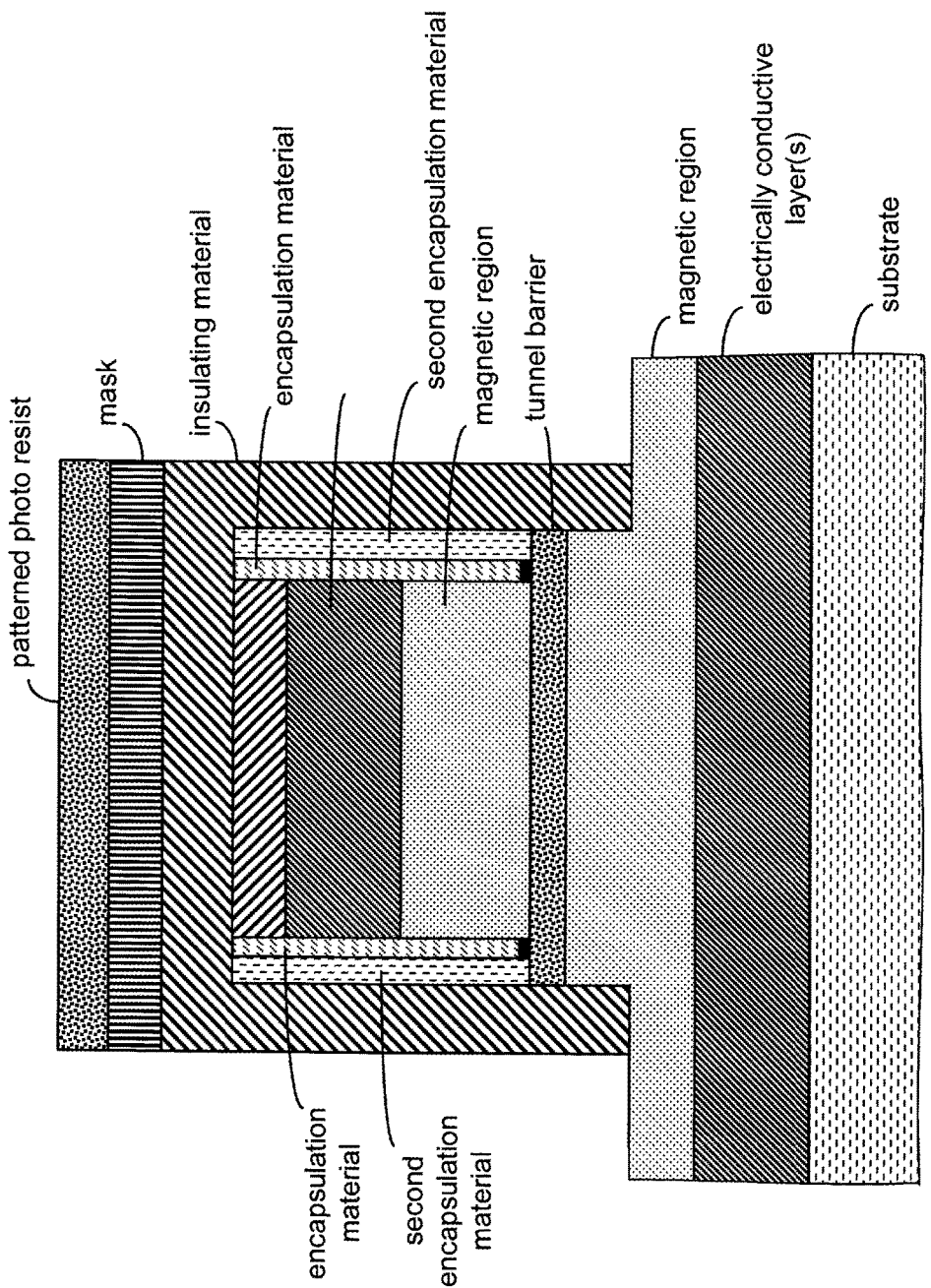
Figure 8E:
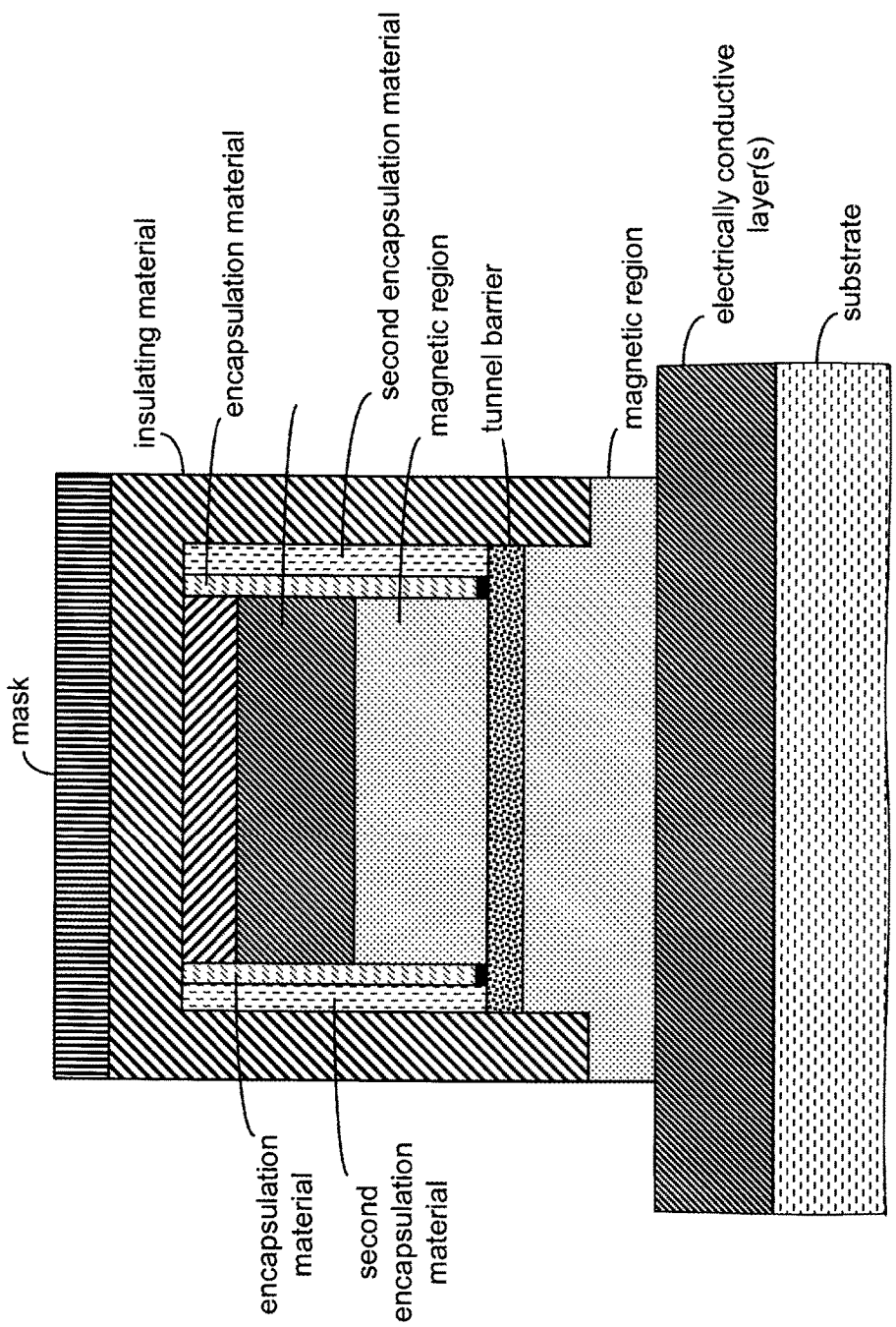
Figure 8F:
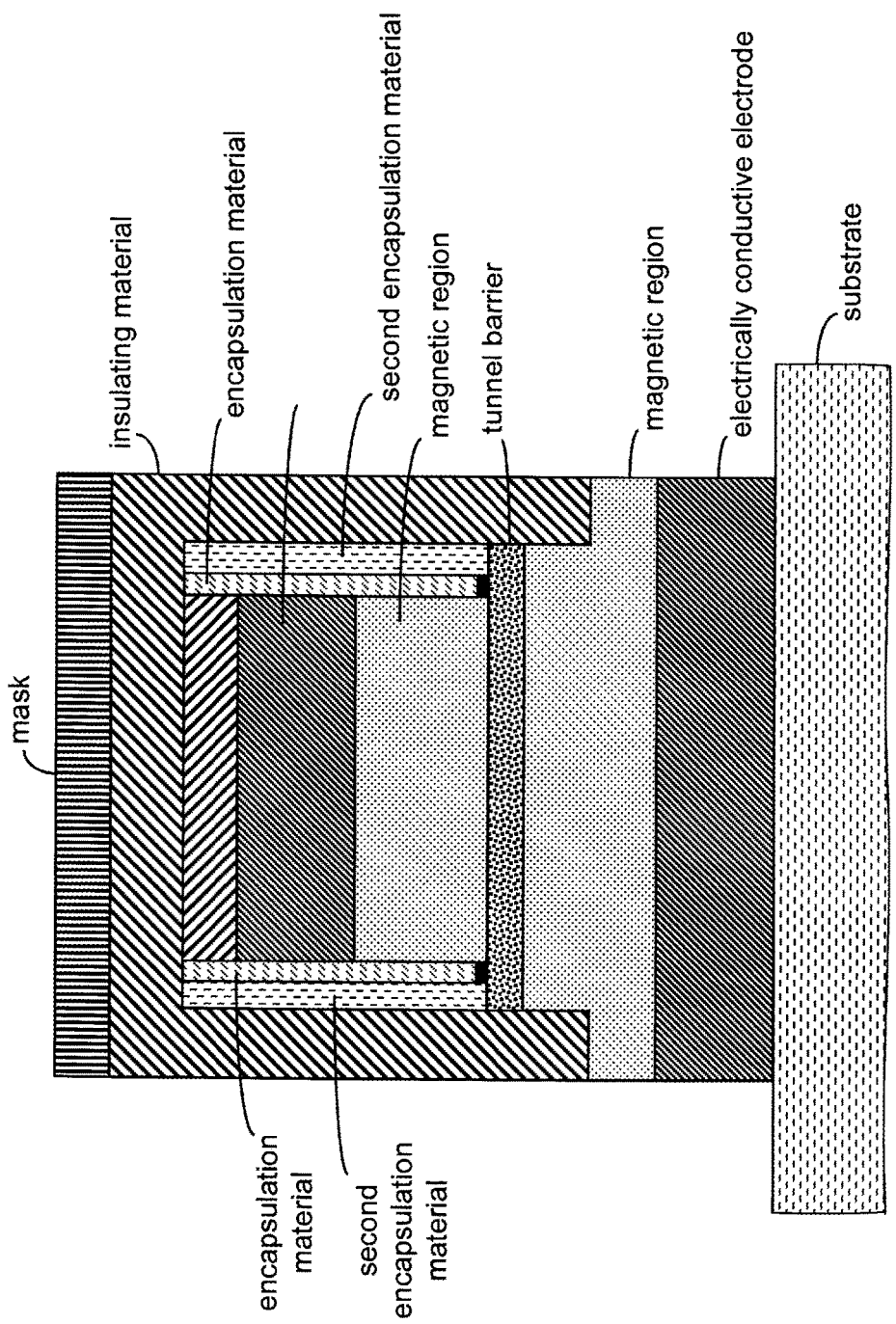
Figure 8G:
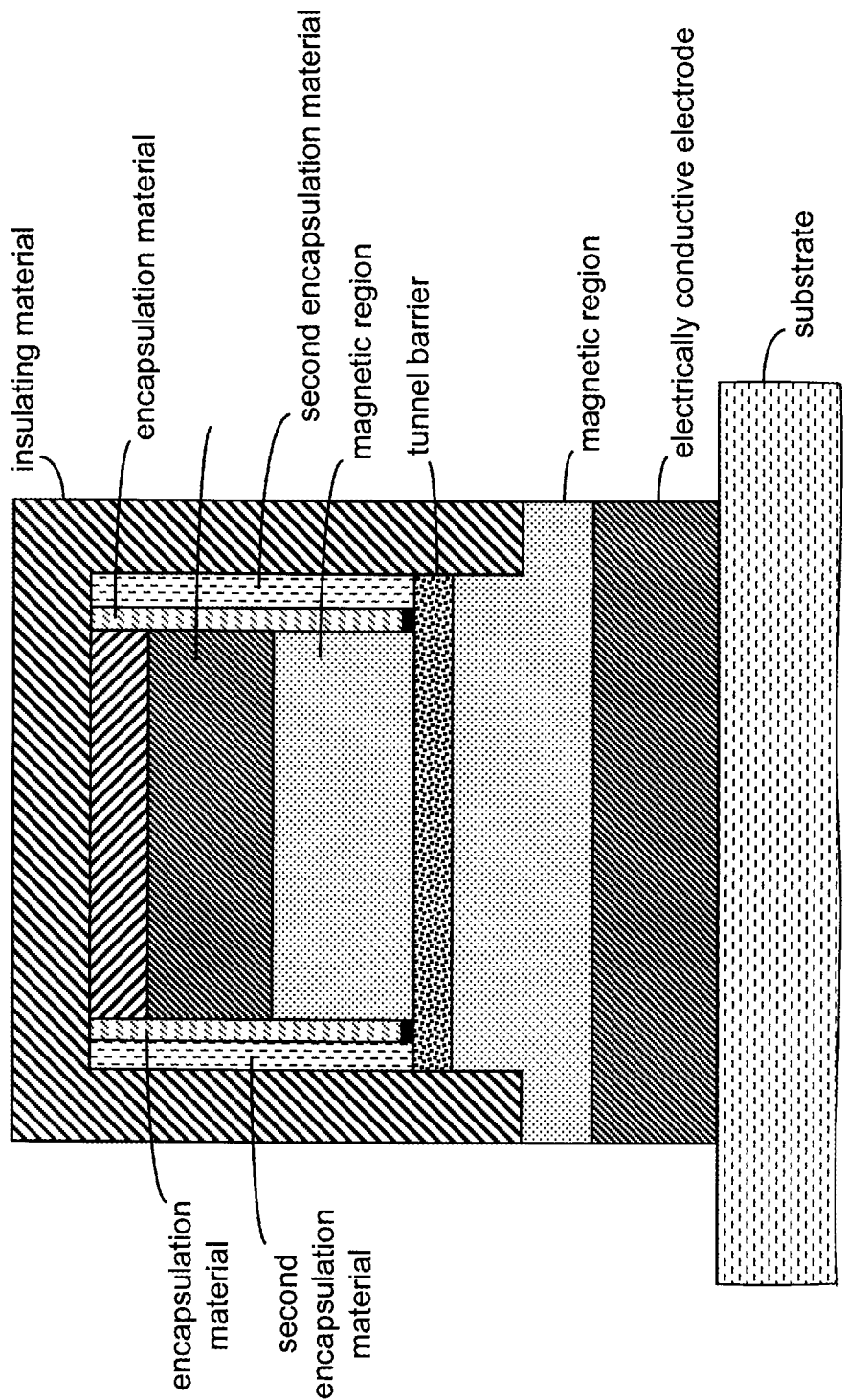

With reference to FIGS. 1A-1G, 4A, 4B and 8A-8G, in yet another embodiment, after removal of all or substantially all of the re-deposited materials (see FIGS. 1F and 1G), a second encapsulation material is deposited (see FIG. 4A) on the partially formed stack/structure and one or more etch processes are then performed to remove the second encapsulation material in the field region, form the tunnel barrier (see FIG. 4B) and partially etch the magnetic region under or beneath the tunnel barrier. Thereafter, an insulating material (for example, a silicon oxide, silicon nitride and/or TEOS) is deposited (see FIG. 8B) and may be patterned using conventional techniques (see FIGS. 8C and 8D).

The MTJ stack/structure may then be completed by etching the remaining portion of the magnetic region and the electrically conductive layer(s) using the patterned insulating material as a mask. That is, with reference to FIGS. 8E and 8F, the remaining portion of the magnetic region and the electrically conductive layer(s) are then etched to form a second magnetic region (i.e., a region under or beneath the tunnel barrier) and a bottom electrically conductive electrode, respectively. Such etching may also be via conventional techniques. Indeed, any techniques and/or recipes now known or later developed may be employed to form such the magnetic region (which, in operation, is either the free magnetic region or fixed magnetic region) and electrically conductive electrode beneath the tunnel barrier. As described above in connection with the embodiment of FIGS. 7A-7J, the mask used to pattern the insulating material may be removed (see FIG. 8G) and, through additional processing, facilitate electrical contact (through a metal or electrically conductive via) to the top electrode of the MTJ stack/structure.

With reference to FIGS. 9A-9J, in one embodiment where the magnetoresistive stack/structure includes an out-of-plane magnetic anisotropy (for example, perpendicular magnetic anisotropy) and a pinned or unpinned fixed magnetic region is disposed on or above the tunnel barrier (i.e., one or more layer(s) of dielectric material), which is disposed on or above a free magnetic region, a mask layer is deposited (for example, a hard mask layer) on one or more layers of electrically conductive materials. (See, FIG. 9A). The mask layer may be deposited using any technique now known or later developed, for example, well known conventional techniques.

After deposition of the mask layer, a photo resist is deposited thereon and patterned to predetermined dimensions consistent with or correlated to selected dimensions of the electrically conductive electrode to be formed. (See, FIG. 9B). The photo resist may be deposited and patterned using any technique now known or later developed, for example, well known conventional deposition and lithographic techniques.

Figure 9A:
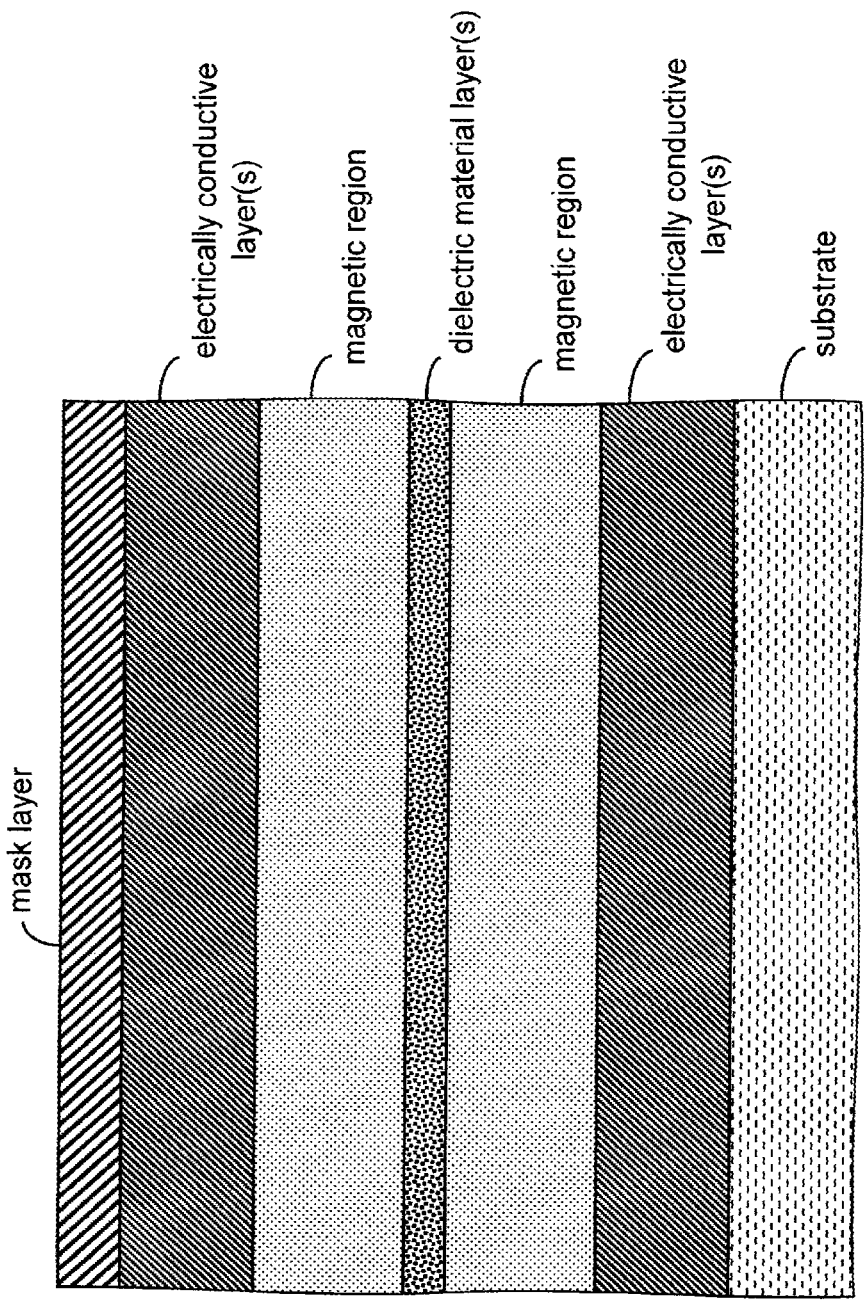
FIGS. 9A-9J illustrate cross-sectional views of layers included in a magnetoresistive stack/structure (for example, an out-of-plane magnetic anisotropic magnetoresistive stack/structure (for example, fixed and/or free magnetic regions having perpendicular magnetic anisotropy)) wherein the pinned or unpinned fixed magnetic region is disposed on or above a dielectric layer (i.e., the tunnel barrier), which is disposed on or above a free magnetic region) at various stages of manufacturing of an exemplary magnetoresistive device according to at least certain aspects of certain embodiments of the present inventions.
Figure 9B:
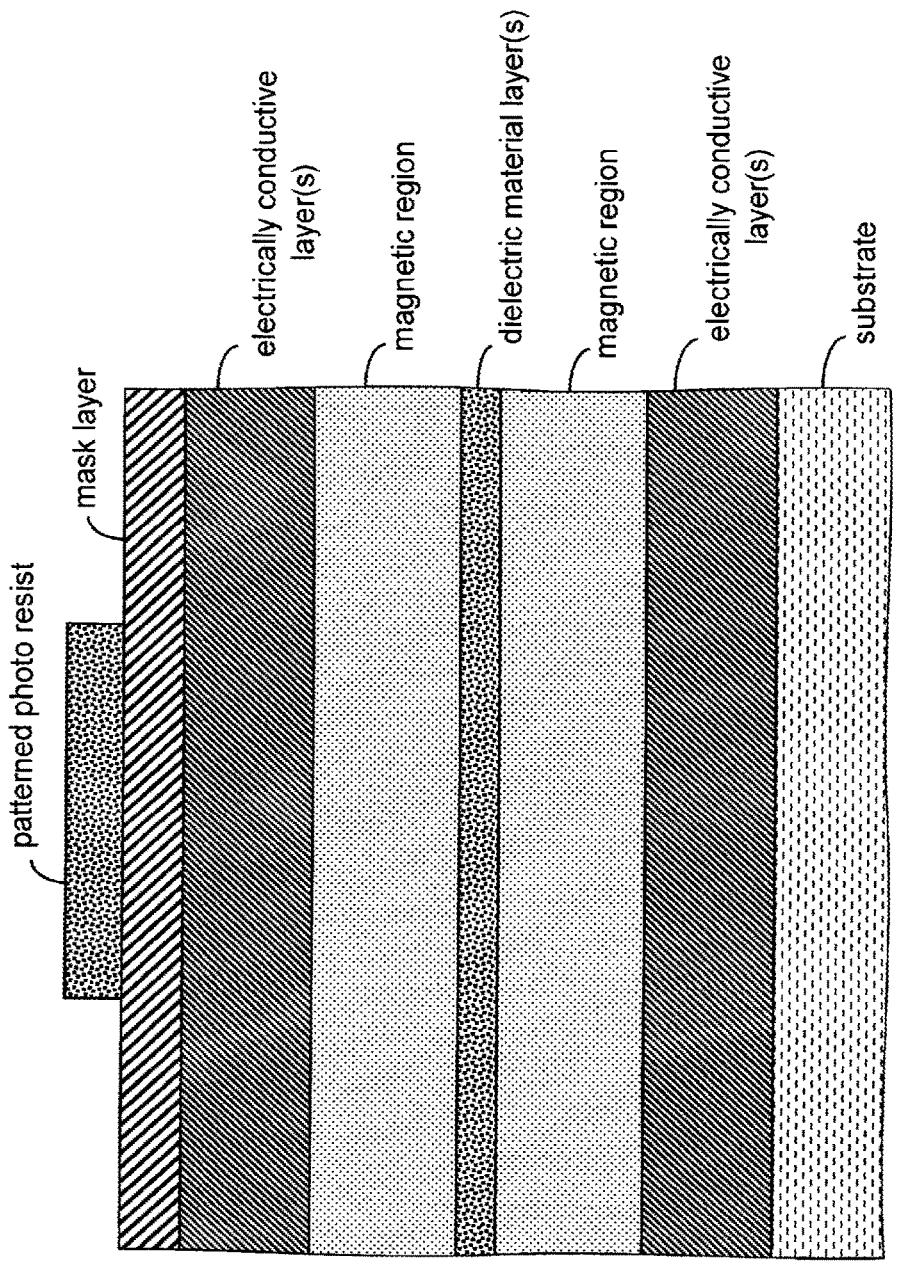
Figure 9C:
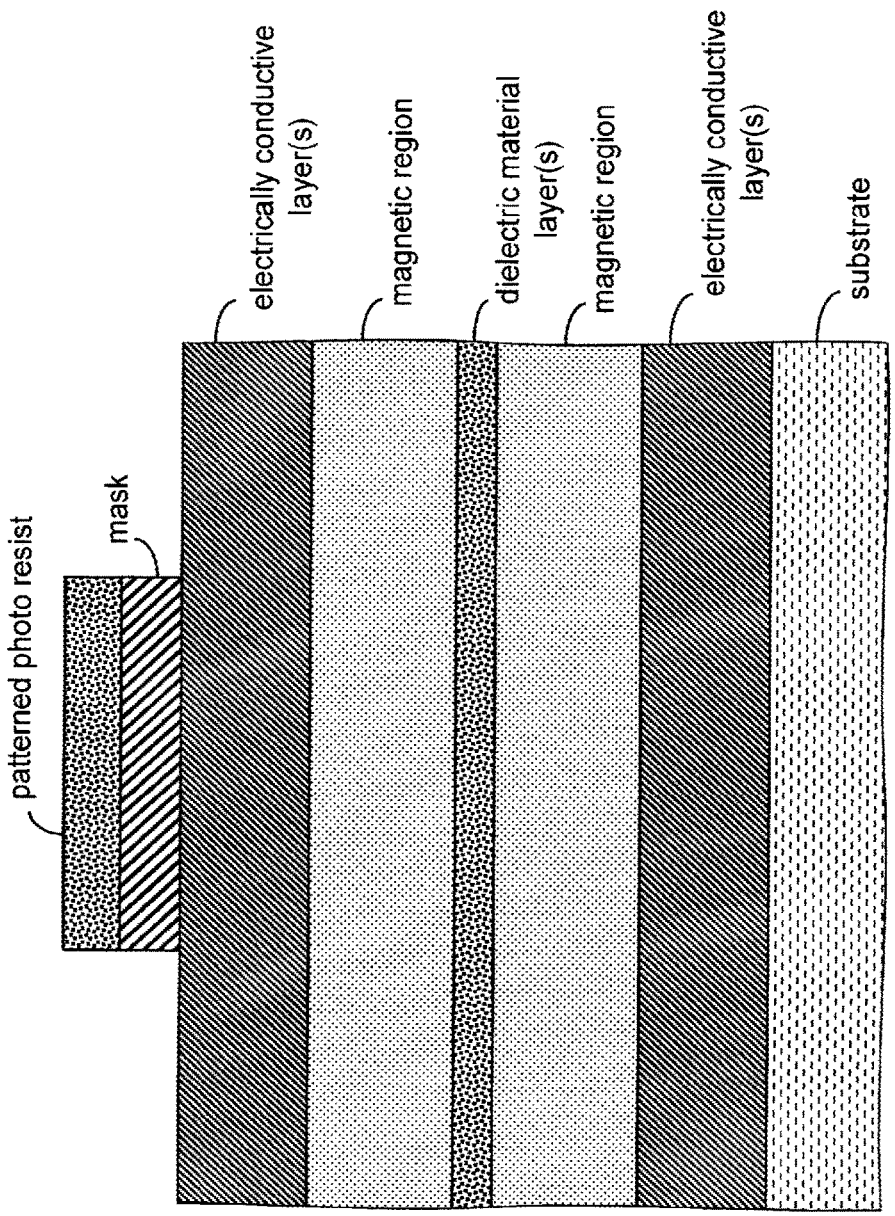

With reference to FIG. 9C, the mask layer is then etched, for example, via mechanical etching (such as, for example, via sputter etching techniques) or chemical etching, to form or provide the mask. After forming or patterning the mask (having a predetermined pattern which is at least partially defined by the patterned photo resist), it may be advantageous to remove or strip the photo resist, for example, using conventional techniques.

Figure 9D:
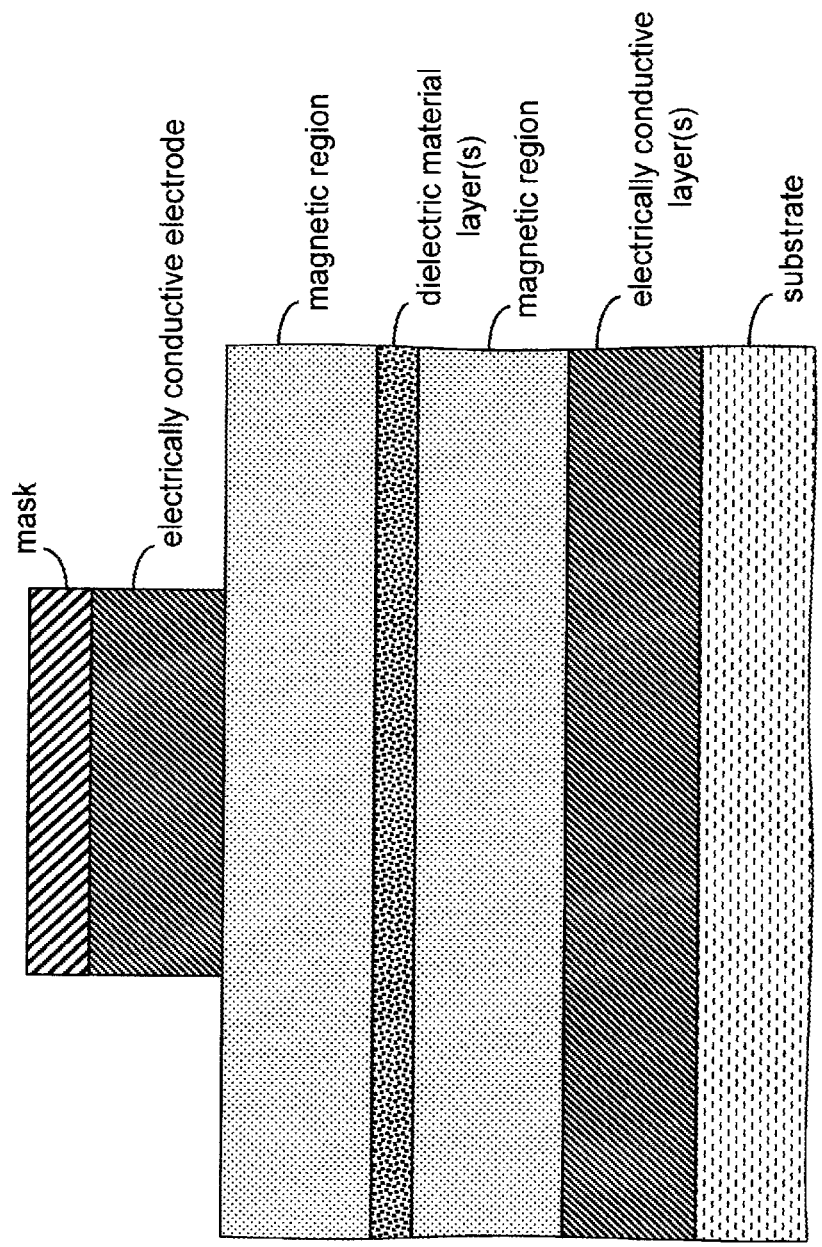

With reference to FIG. 9D, one or more layers of electrically conductive materials are then etched with the mask "protecting" certain portions thereof, to form, define, pattern and/or provide an electrically conductive electrode. The one or more layers of electrically conductive materials (for example, Tantalum (Ta), Tantalum-Nitride (TaN) or Ta—TaN composite) may be etched, formed and/or patterned using any etchants and/or technique now known or later developed—for example, using mechanical etchants and techniques (for example, sputter etchants and techniques) or chemical etching techniques.

Figure 9E:
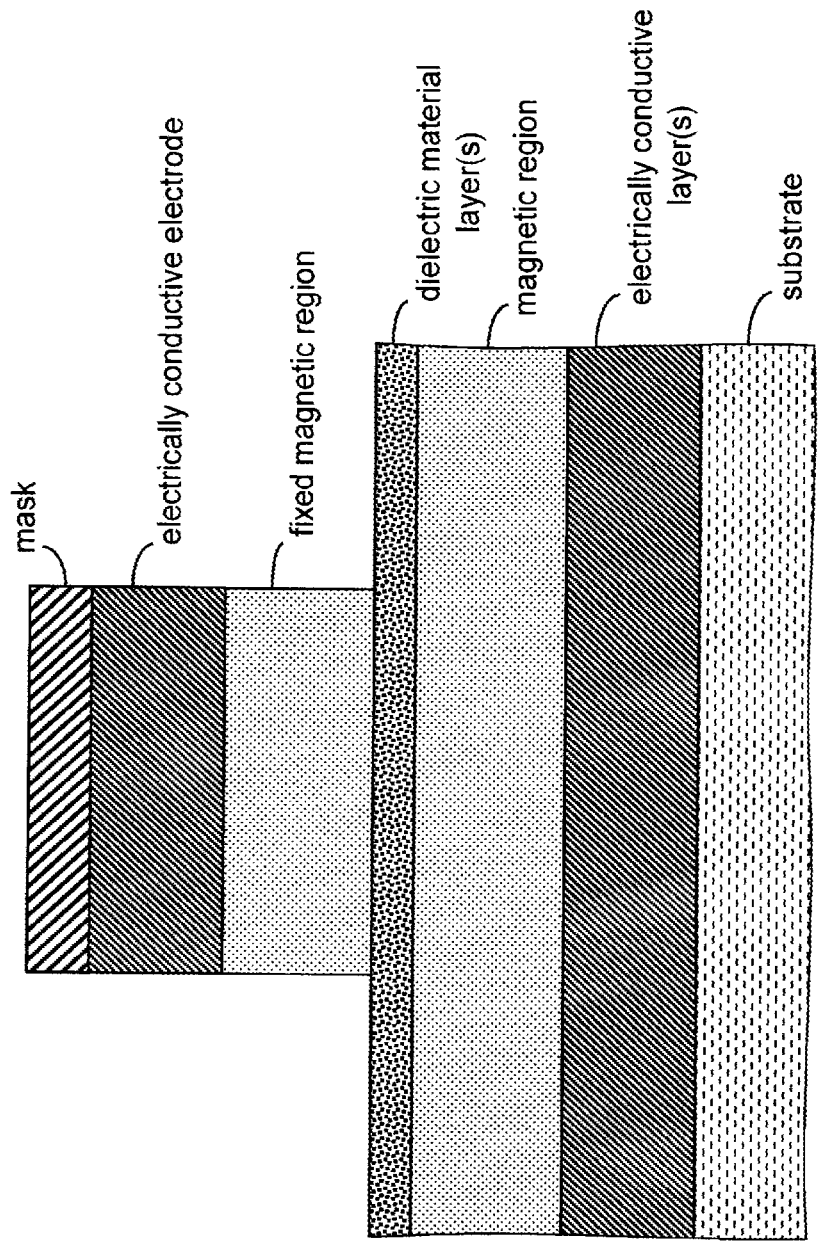

With reference to FIG. 9E, after forming the electrically conductive electrode, the layer(s) of the fixed magnetic region are etched to form, define, pattern and/or provide a fixed magnetic region of the MTJ stack/structure of the out-of-plane magnetic anisotropic magnetoresistive stack/structure (for example, perpendicular magnetic anisotropy). The fixed magnetic region of the MTJ stack/structure may be a pinned or unpinned fixed region. The fixed magnetic region may include one or more magnetic material layers of Nickel (Ni), Iron (Fe), Cobalt (Co), Platinum (Pt), and alloys thereof. The magnetic material layers of the fixed magnetic region may be configured in one or more pinned or unpinned fixed SAFs wherein the fixed magnetic region may also include one or more non-magnetic materials layers (for example, ruthenium (Ru), copper (Cu), aluminum (Al), tantalum (Ta), titanium (Ti), niobium (Nb), vanadium (V), zirconium (Zr) and one or more alloys thereof, and in certain embodiments, tungsten (W) and molybdenum (Mo)); such materials and/or structures may be arranged in any combination or permutation now known or later developed.

Figure 9F:
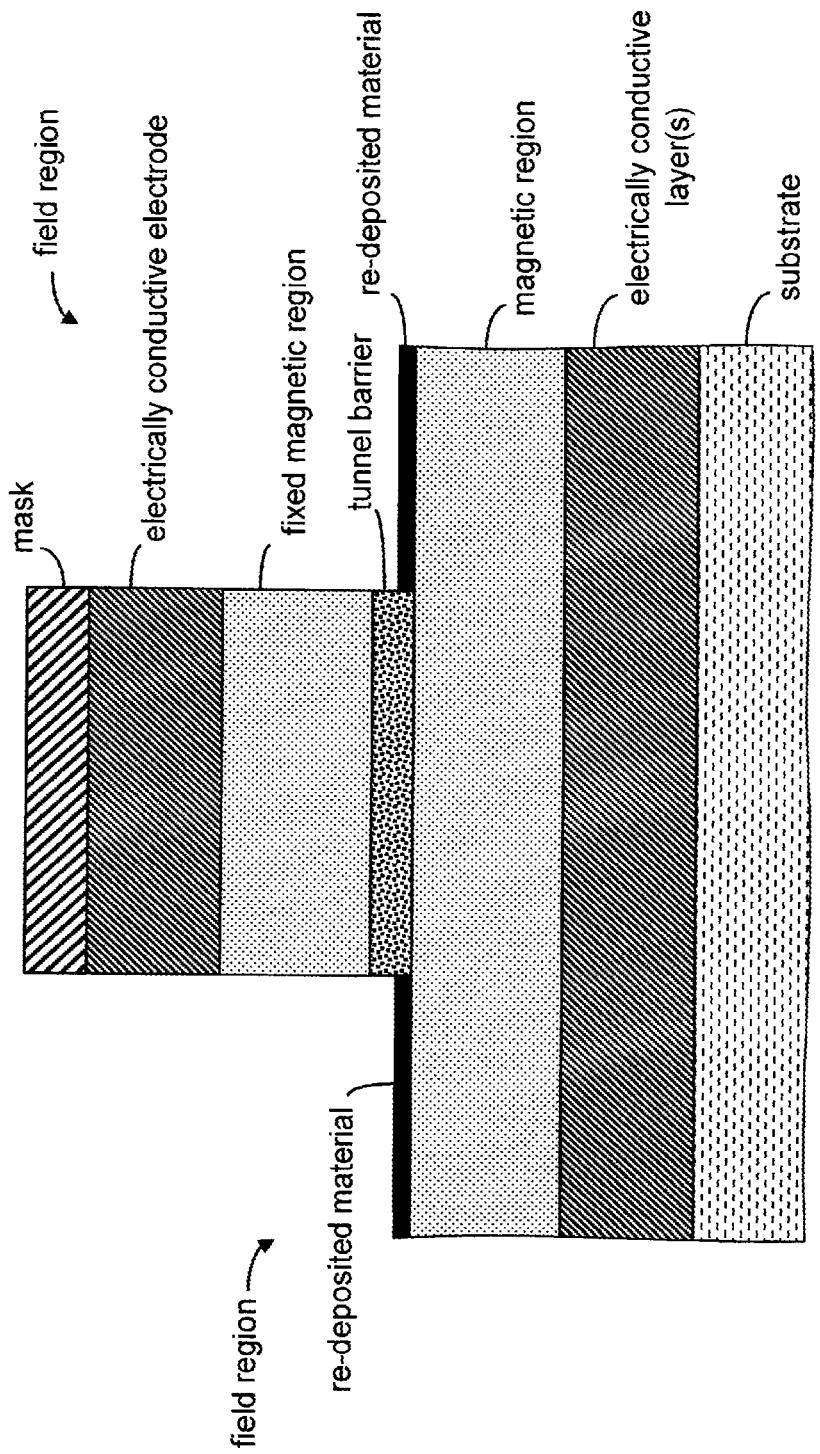

With reference to FIG. 9F, the dielectric material layer(s) (i.e., one or more layer(s) of dielectric material(s)) are etched to form the tunnel barrier of the magnetoresistive structure/stack. The dielectric material layer(s) (for example, Al, AlOx, Mg or MgO) may be etched and/or patterned using any etchants and/or technique now known or later developed—for example, using physical etchants and etching techniques (for example, sputter etching techniques). It should be noted that the present inventions may employ any suitable etchants and techniques, whether now known or later developed, to etch the one or more layers of electrically conductive materials and thereby form, define and/or provide the tunnel barrier.

With continued reference to FIG. 9F, after etching the tunnel barrier layer(s) to form the tunnel barrier, a re-deposited material may form on the exposed surfaces—and, in particular, on or in the field regions. The presence of such re-deposited material may impact one or more operating characteristics of the magnetoresistive stack/structure (for example, switching voltage to increase as a result of such material in magnetoresistive memory stacks/structures). Moreover, removing such material, without more (for example, without protecting sidewalls of the previously formed fixed magnetic region of the partially formed magnetoresistive stack/structure), may result in damage to the magnetic properties thereby impacting switching distributions for the switching field (Hc) of the free magnetic region.

Figure 9G:
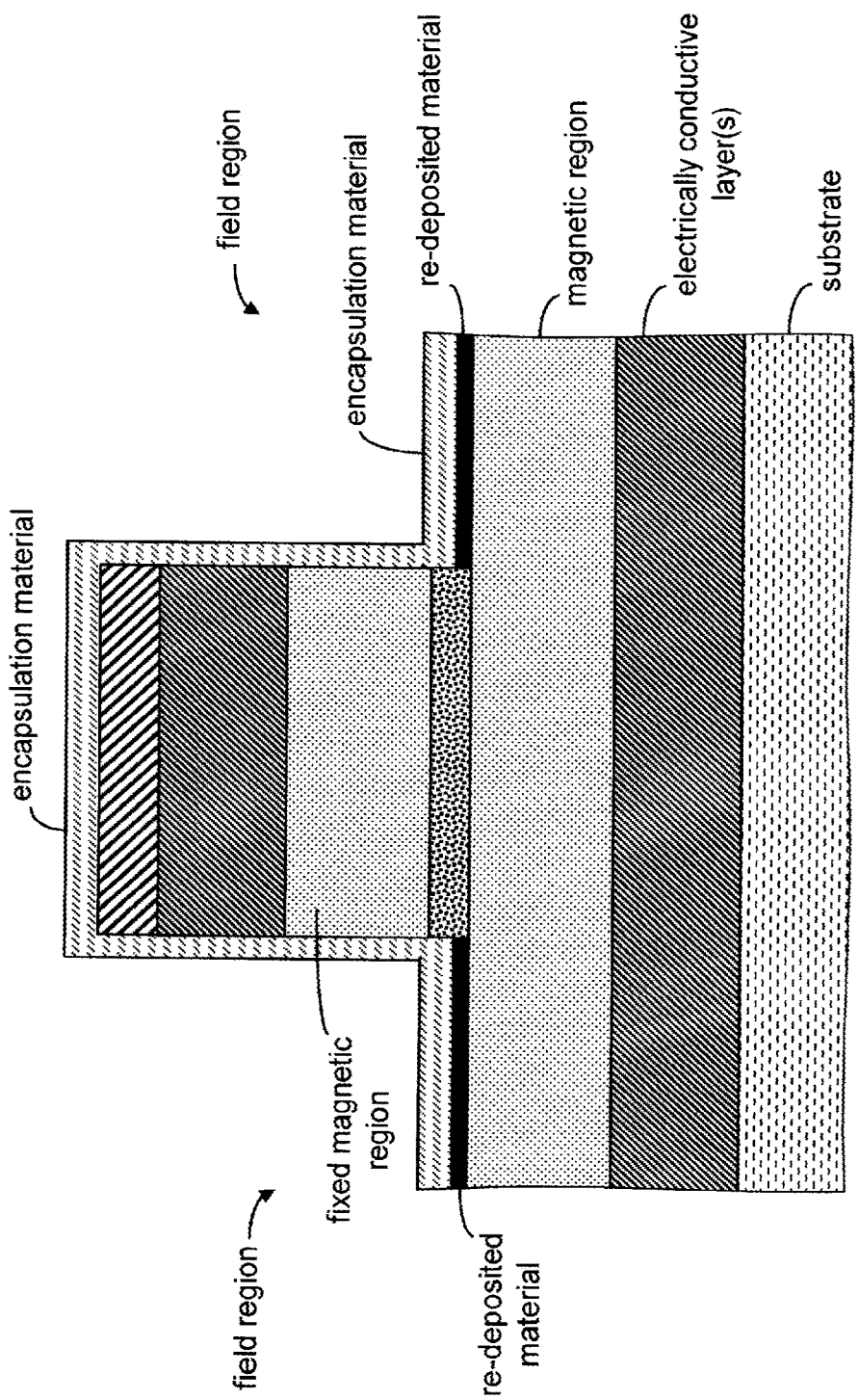

With reference to FIG. 9G, after etching/forming the fixed magnetic region, an encapsulation material (for example, an aluminum oxide (such as $Al_2O_3$), a silicon oxide (such as $SiO_2$), a silicon nitride (such as $Si_3N_4$), a magnesium oxide (such as MgO), a TEOS, an aluminum nitride (such as AlN), or one or more combinations thereof) is deposited on (i) the re-deposited material disposed in the field regions and (ii) the partially formed stack/structure (for example, on all or substantially all of the exposed portions of the partially formed stack/structure—including the sidewalls thereof). It may be advantageous that the amount of encapsulation layer on the exposed surfaces of magnetic regions (in the illustrative embodiment, the sidewalls of the fixed magnetic region) be sufficiently thick to protect the fixed magnetic region from damage or contamination during removal of the re-deposited materials via subsequent processing.

Figure 9H:
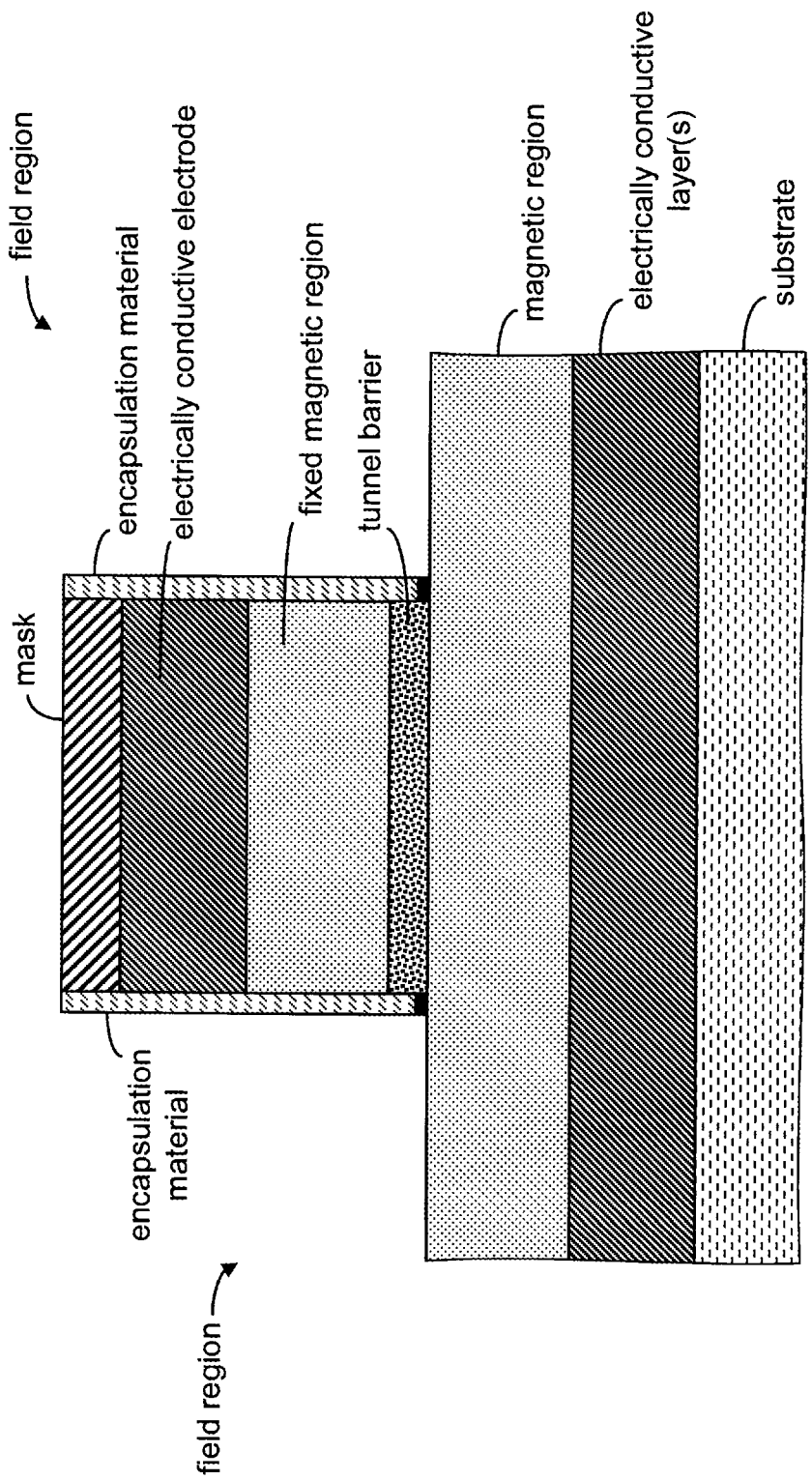

With reference to FIG. 9H, after deposition of the encapsulation material, one or more etch processes are employed to remove the re-deposited material in the field region and/or on the partially formed stack/structure. For example, in one embodiment, the one or more etch processes is or includes a physical etching (for example, sputter etching, ion etching or milling, and/or ion-beam etching or milling). Here, an Argon or Xenon sputter etch may be employed to remove the encapsulation material and the re-deposited material in the field regions and thereby "clear" the field of the re-deposited material. With continued reference to FIG. 9H, a portion of the encapsulation material may remain on the partially formed stack/structure (for example, on sidewalls of the partially formed stack/structure—including the fixed magnetic region).

As intimated above, the methods of the present inventions may employ one or more etch processes (which may be, for example, different etch recipes and/or mechanisms) to eventually remove the re-deposited material. For example, a first etch process (for example, a reactive ion etch) may be employed to remove at least (or all) of the encapsulation material overlying the re-deposited materials portions and thereafter a second etch process (for example, a physical etch including a sputter or ion milling etch) may be employed to remove all or the remaining portions of the re-deposited materials.

Figure 9I:
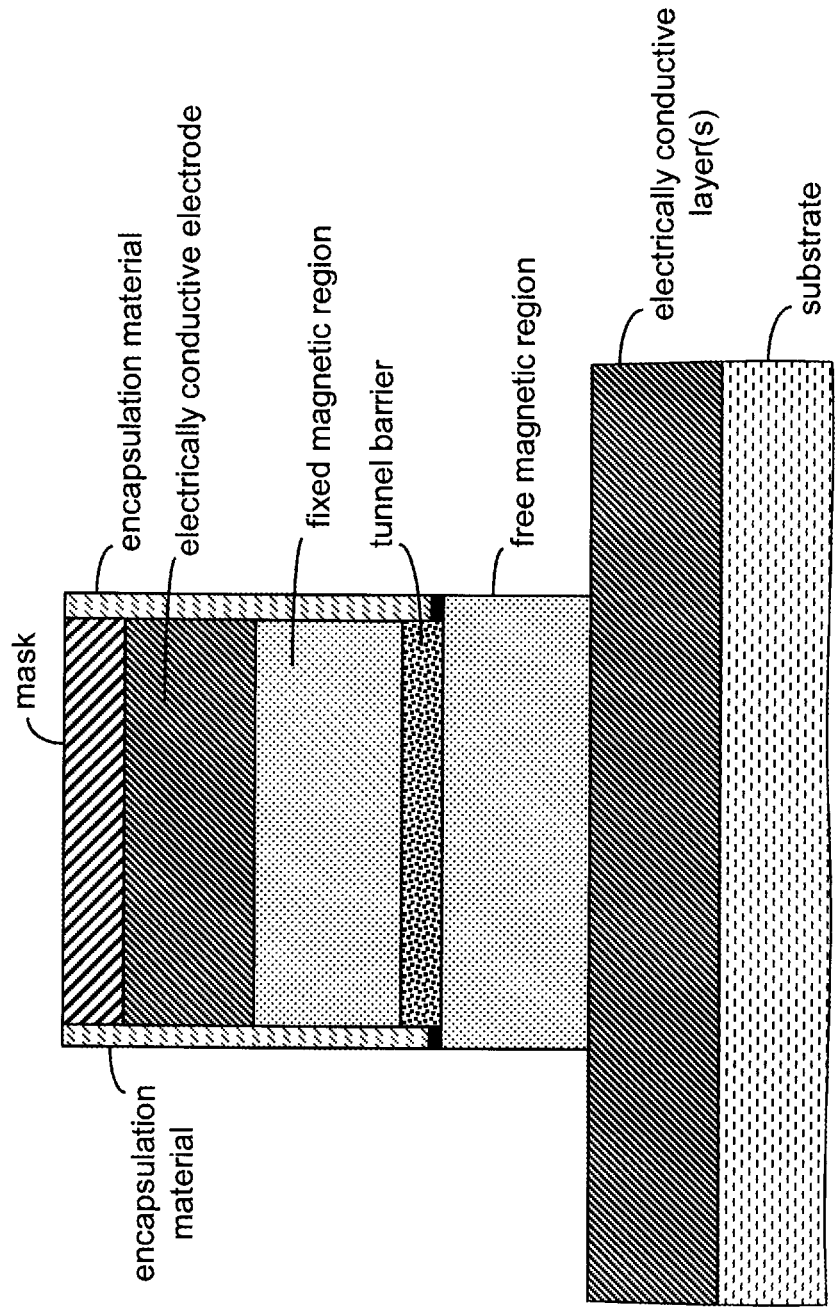
Figure 9J:
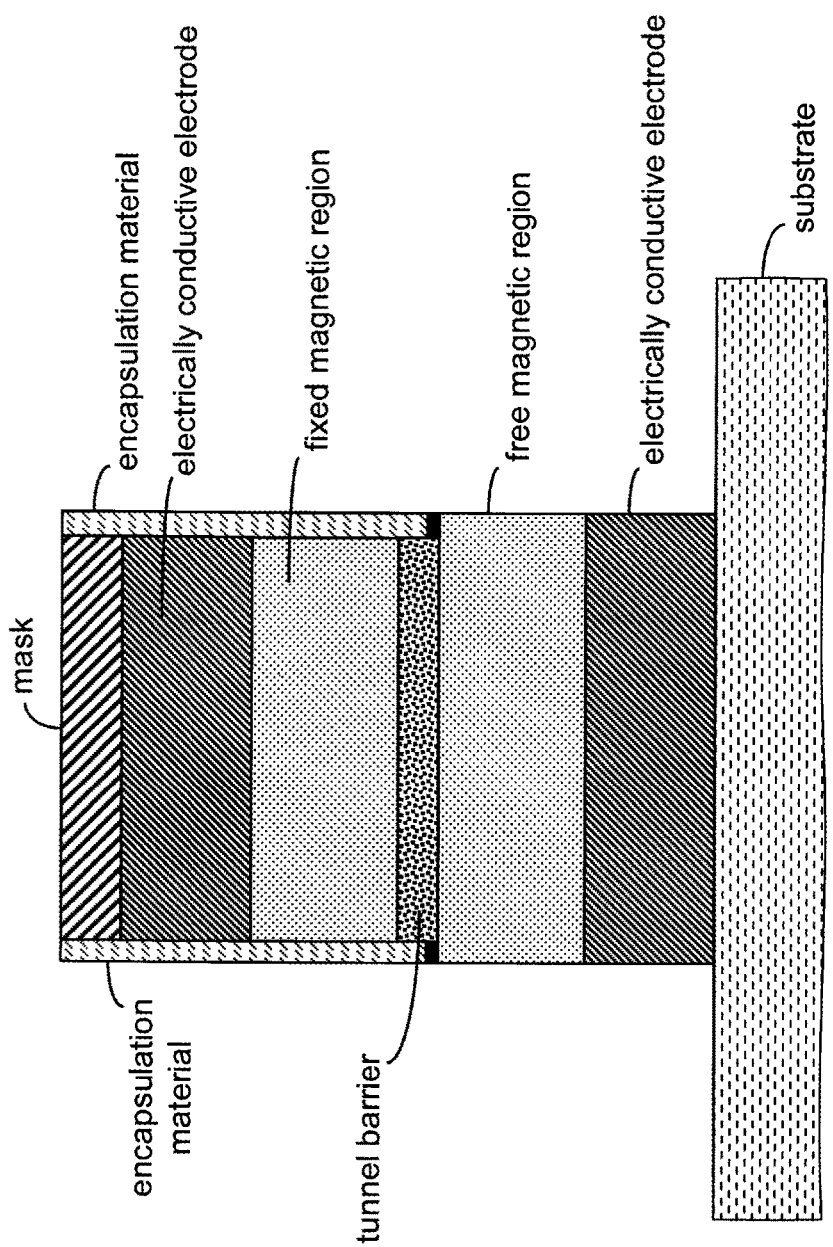

With reference to FIGS. 9I and 9J, the one or more layer(s) of the free magnetic region and the electrically conductive layer(s) under beneath the tunnel barrier are then etched to form the free magnetic region of the magnetoresistive stack/structure and electrically conductive electrode, respectively. Such etching may also be via conventional techniques. Indeed, any techniques and/or recipes now known or later developed may be employed to form the free magnetic region and electrically conductive electrode beneath the tunnel barrier.

Notably, the one or more layers of magnetic materials of the free magnetic region may be, for example, nickel (Ni), iron (Fe), cobalt (Co), palladium (Pd), platinum (Pt), magnesium (Mg), manganese (Mn) and alloys thereof. The free magnetic region may also include non-magnetic materials (for example, aluminum (Al), tantalum (Ta), titanium (Ti), niobium (Nb), vanadium (V), zirconium (Zr), tungsten (W) and molybdenum (Mo)). Such etching may be using any etchants and/or technique now known or later developed—for example, using mechanical and/or chemical techniques (for example, a low bias power sputter technique or a chemical etch technique such as a conventional fluorine and/or chlorine based etch technique). The materials and/or structures of the free magnetic region may be arranged in any combination or permutation now known or later developed.

As indicated above, after formation, definition and/or patterning of the MTJ stack/structure, the mask may be removed or stripped using, for example, conventional techniques, to facilitate electrically contact to the exposed electrically conductive electrode. Indeed, after removing or stripping the mask, the exposed electrically conductive electrode may be connected to sense, read and/or write conductors and the magnetoresistive stack/structure completed using any processes and/or structures now known or later developed. In another embodiment, the mask is not removed or stripped but the MTJ stack/structure may be completed as described in U.S. Pat. No. 8,747,680 (which, as mentioned above, is incorporated by reference). Notably, where the mask is a metal hard mask, the mask (or portion thereof) may be patterned and employed as the electrically conductive electrode (or a portion thereof).

With reference to FIGS. 10A-10J, in another embodiment, the MTJ stack/structure is implemented in an out-of-plane magnetic anisotropic magnetoresistive device (for example, perpendicular magnetic anisotropy) wherein the free magnetic region is disposed on or above the tunnel barrier, which is disposed on or above a pinned or unpinned fixed magnetic region. In this embodiment, after a mask layer (for example, a hard mask layer) is deposited and patterned on one or more layers of electrically conductive materials are etched, using the mask, to form an electrically conductive electrode. (See FIGS. 10A-10D).

After forming the electrically conductive electrode, the magnetic material layer(s) are etched to form, define, pattern and/or provide a free magnetic region of the magnetoresistive stack/structure having out-of-plane magnetic anisotropy (for example, perpendicular magnetic anisotropy). (See, FIG. 10E). As noted above, the fixed magnetic region may include one or more magnetic material layers of nickel (Ni), iron (Fe), cobalt (Co), platinum (Pt), and one or more alloys thereof and may be configured in one or more pinned or unpinned fixed SAFs wherein the fixed magnetic region may also include one or more layers of non-magnetic material (for example, ruthenium (Ru), copper (Cu), aluminum (Al), tantalum (Ta), titanium (Ti), niobium (Nb), vanadium (V), zirconium (Zr), tungsten (W) and molybdenum (Mo); such materials and/or structures may be arranged in any combination or permutation now known or later developed.

Figure 10A:
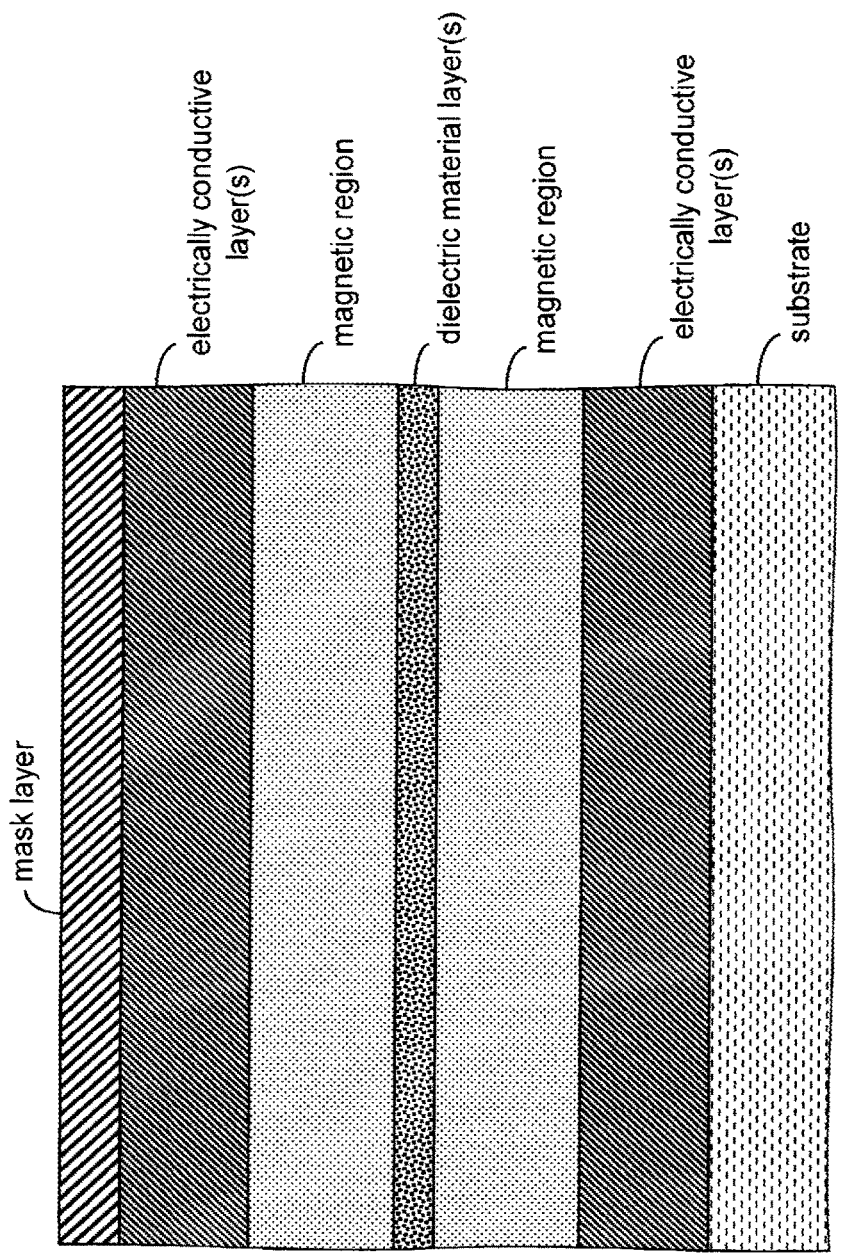
FIGS. 10A-10J illustrate cross-sectional views of layers included in a magnetoresistive stack/structure (for example, an out-of-plane magnetic anisotropic magnetoresistive stack/structure (for example, fixed and/or free magnetic regions having perpendicular magnetic anisotropy) wherein the free magnetic region is disposed on or above a dielectric layer (i.e., the tunnel barrier), which is disposed on or above a pinned or unpinned fixed magnetic region) at various stages of manufacturing of an exemplary magnetoresistive stack/structure according to at least certain aspects of an embodiment of the present inventions.
Figure 10B:
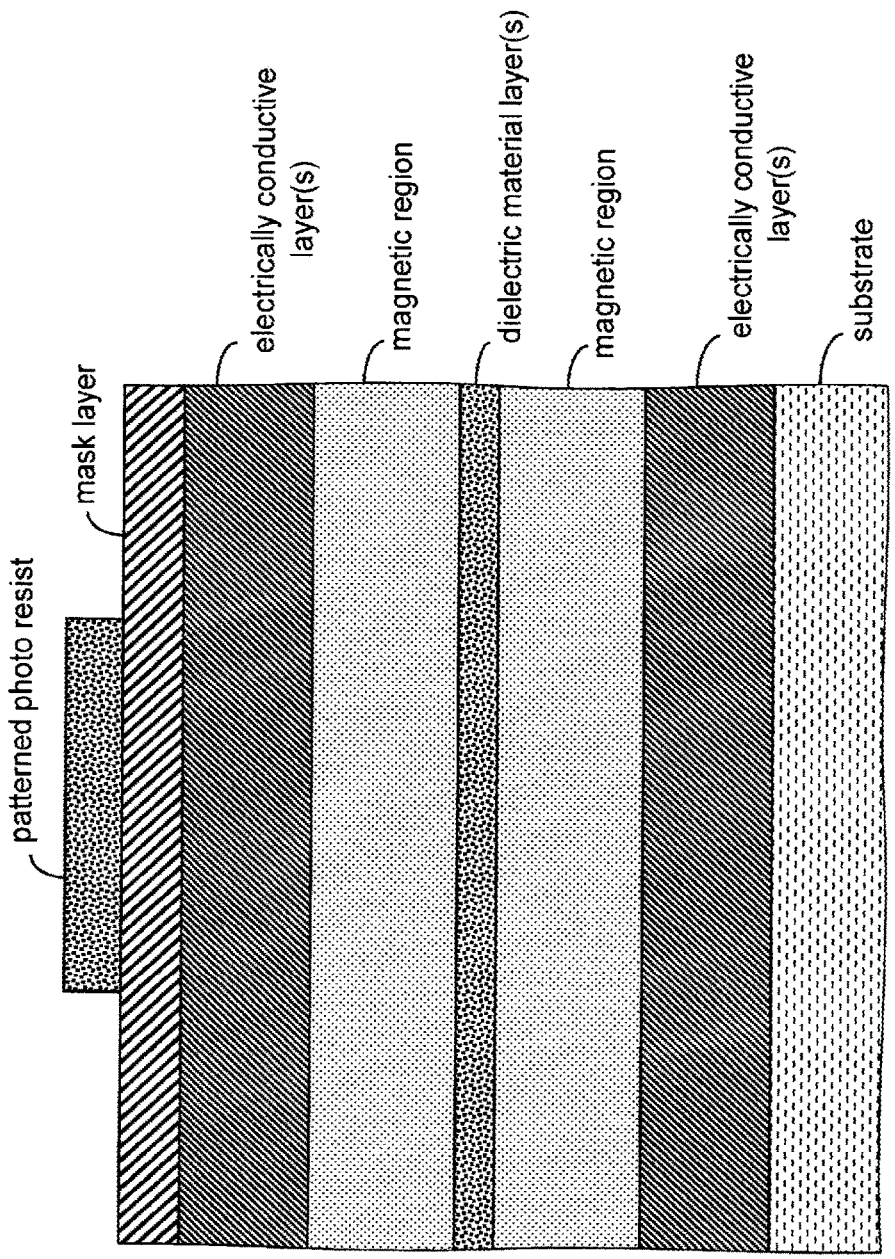
Figure 10C:
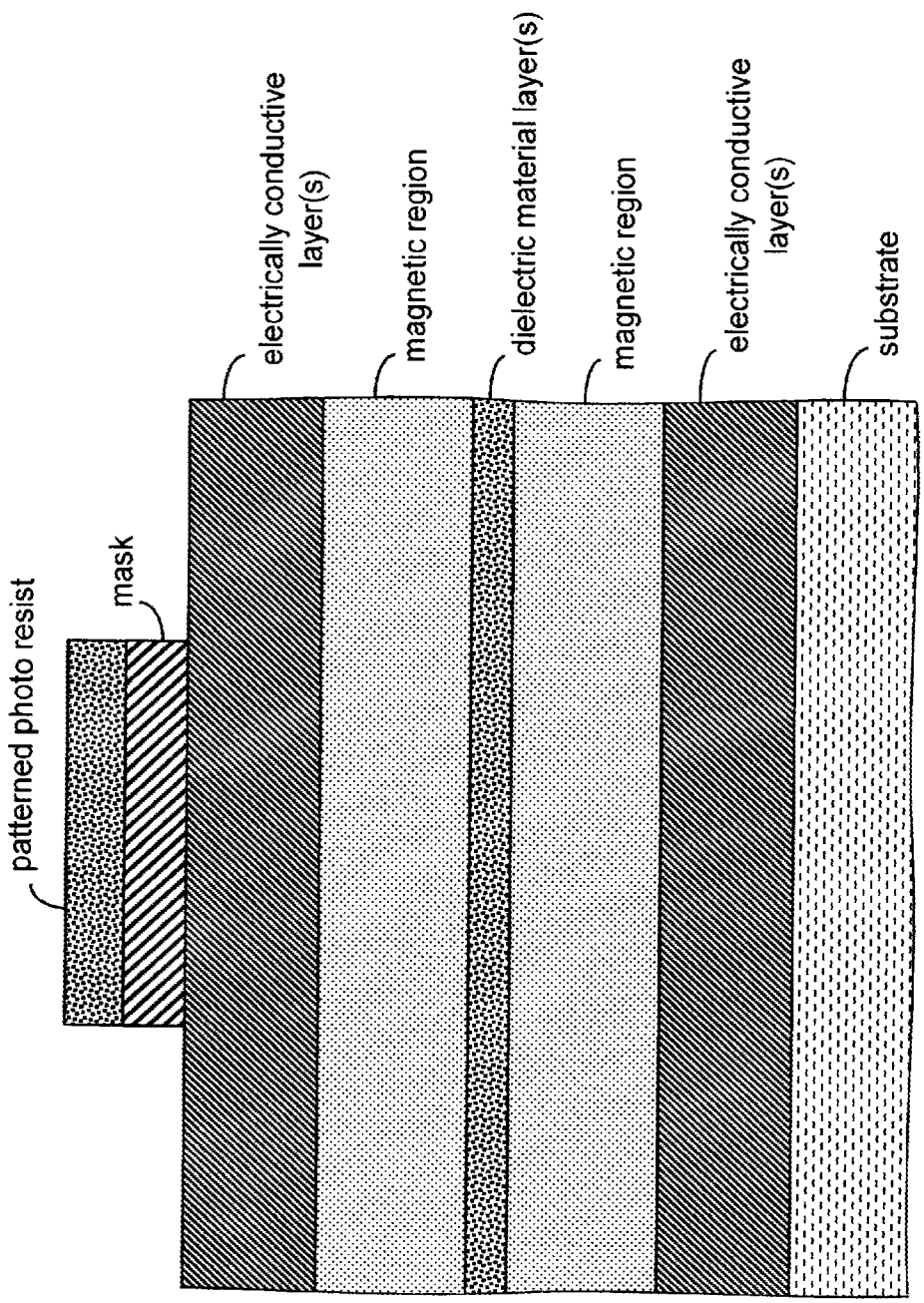
Figure 10D:
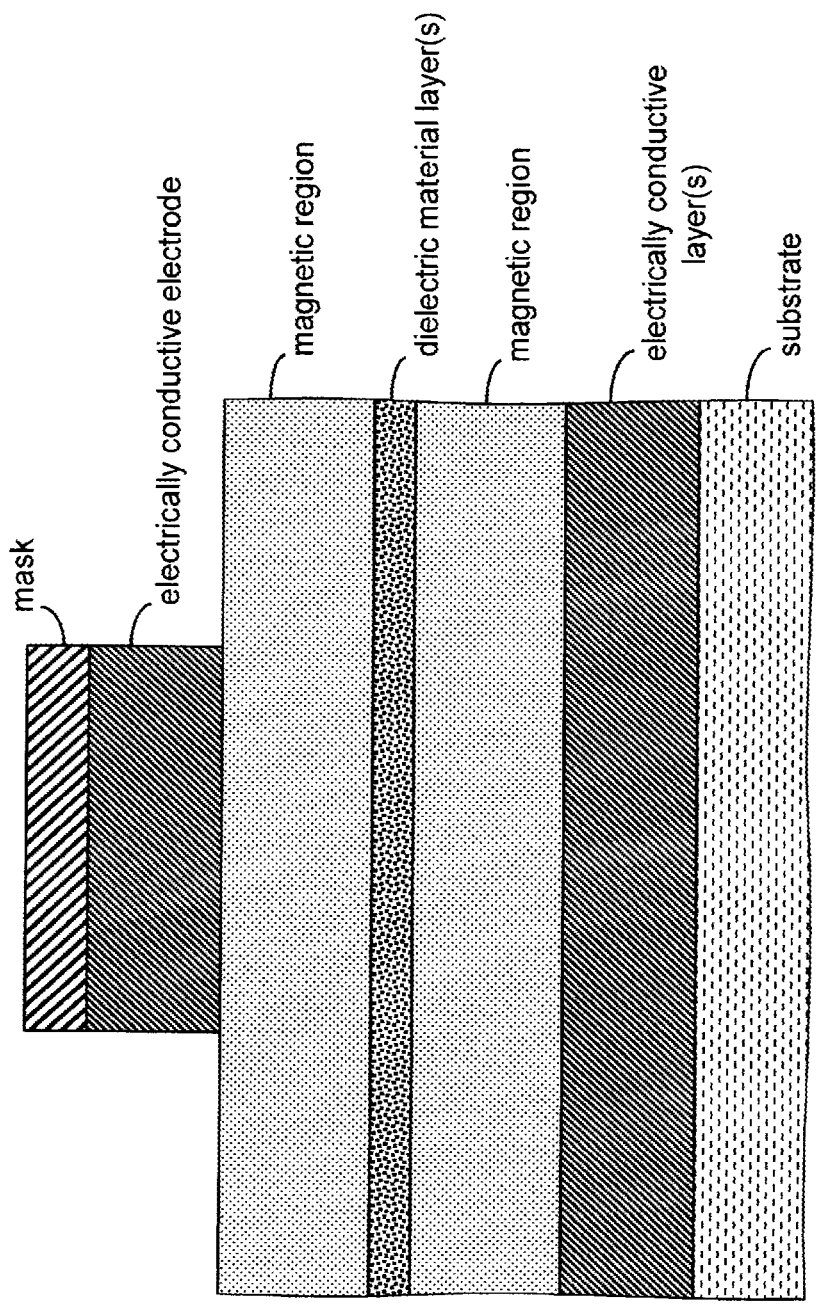
Figure 10E:
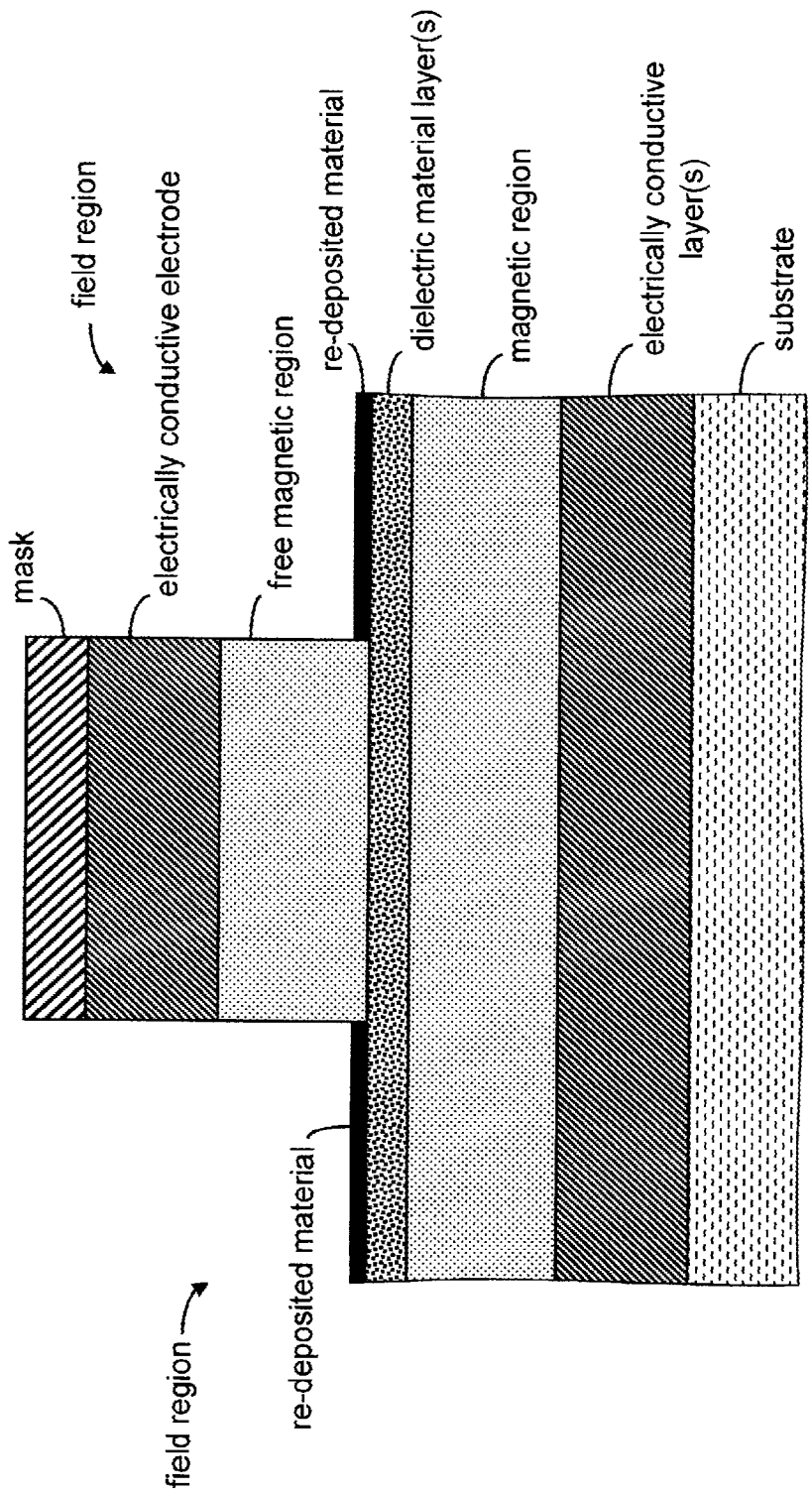
Figure 10F:
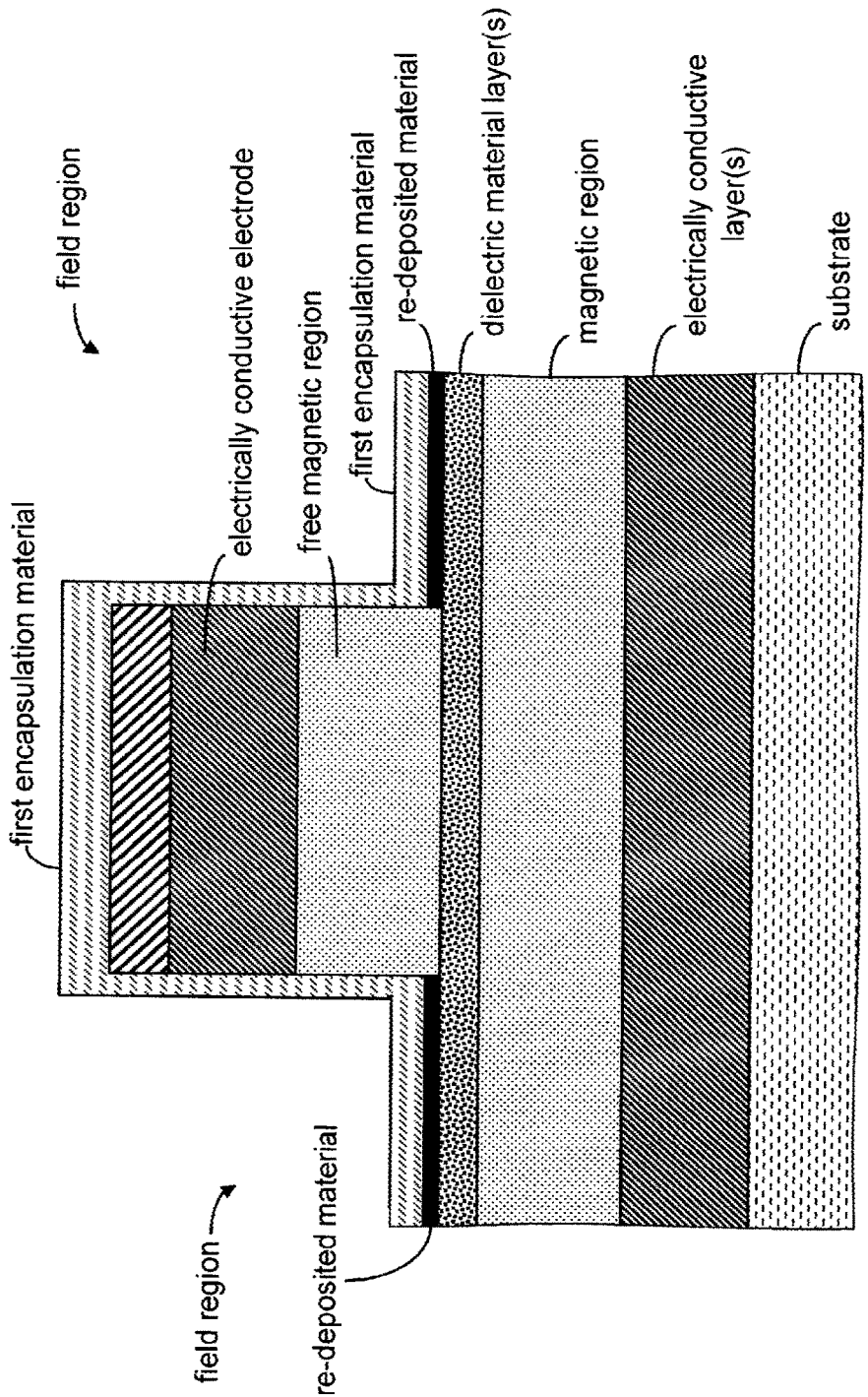

With continued reference to FIG. 10E, after etching the magnetic material layer(s) to form the free magnetic region, a re-deposited material may form on the exposed surfaces—and, in particular, on or in the field regions. With reference to FIG. 10F, an encapsulation material (for example, an aluminum oxide (such as $Al_2O_3$), a silicon oxide (such as $SiO_2$), a silicon nitride (such as $Si_3N_4$), a magnesium oxide (such as MgO), a TEOS, an aluminum nitride, or one or more combinations thereof) is deposited on (i) the re-deposited material disposed in the field regions and (ii) the partially formed stack/structure (for example, on all or substantially all of the exposed portions of the partially formed stack/structure—including the sidewalls thereof). Again, it may be advantageous that the amount of encapsulation layer on the exposed surfaces of the free magnetic region (in the illustrative embodiment, the sidewalls of the free magnetic region) be sufficiently thick to protect materials/layers of the free magnetic region from damage or contamination during removal of the re-deposited materials via subsequent processing (for example, not expose the sidewalls of the magnetic region to the processes of removing the re-deposited materials in the field regions).

In addition thereto, or in lieu thereof, the encapsulation layer disposed on the sidewalls of the partially formed stack/structure may have a thickness that provides or facilitates a predetermined self-aligned etch process when forming other portions of the stack/structure. Indeed, it may be advantageous to provide an encapsulation layer having thicknesses that, in total, facilitates or provides differentiation of the magnetic edges of the free layer and fixed layer so that the diameter of the fixed magnetic region is a predetermined amount greater than the diameter of the free magnetic region (for example, in one embodiment, greater than 1.5×, in another embodiment, greater than 1.7× to 1.75×, and in yet another embodiment, greater than 1.5× to 2.0×). Moreover, in those embodiments where two or more encapsulation layers are employed, it may be advantageous to provide a total thickness of the encapsulation layers that facilitate or provide a predetermined differentiation of the magnetic edges of the free magnetic region and fixed magnetic region so that the diameter of the fixed magnetic region is the predetermined amount greater than the diameter of the free magnetic region.

Figure 10G:
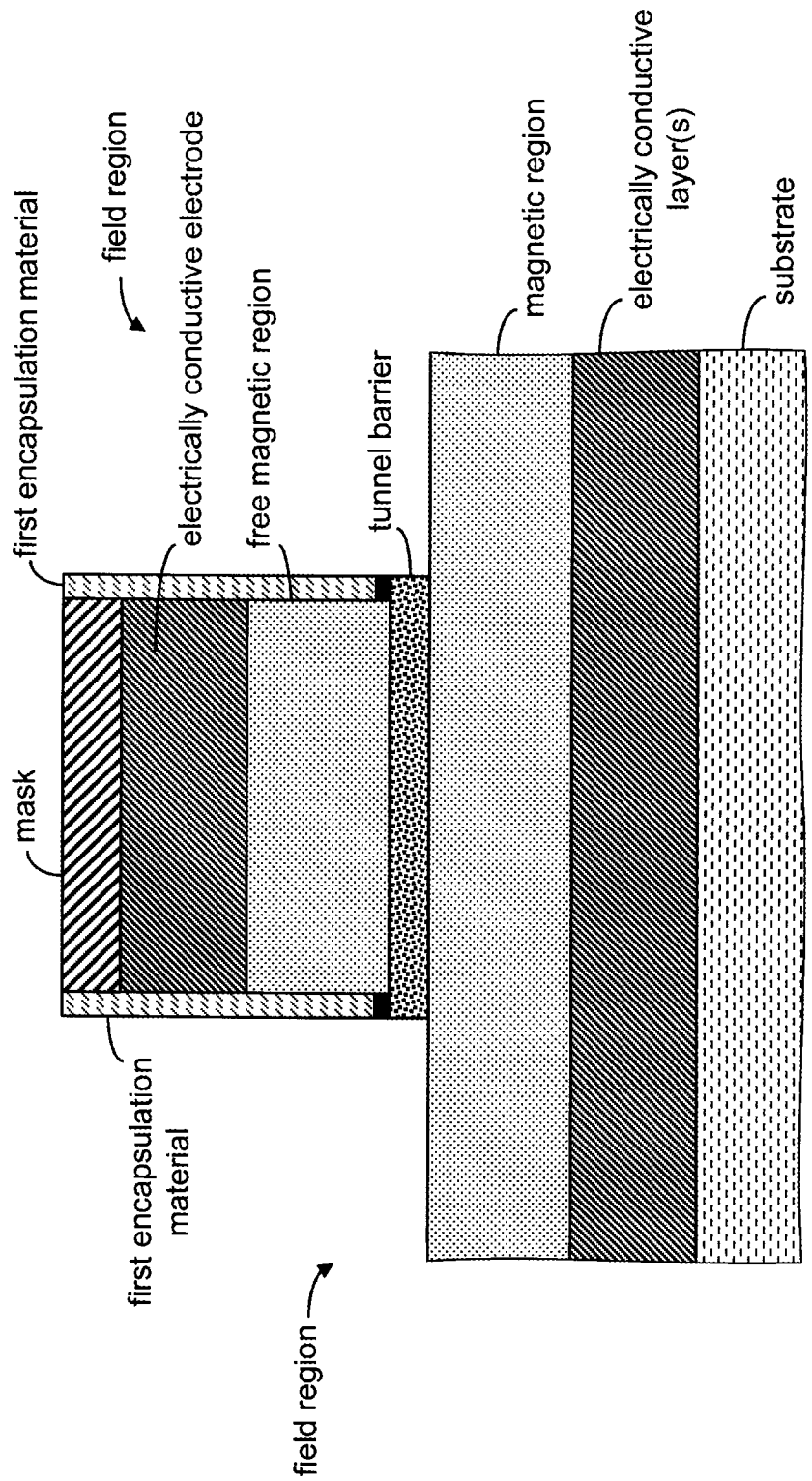
Figure 10H:
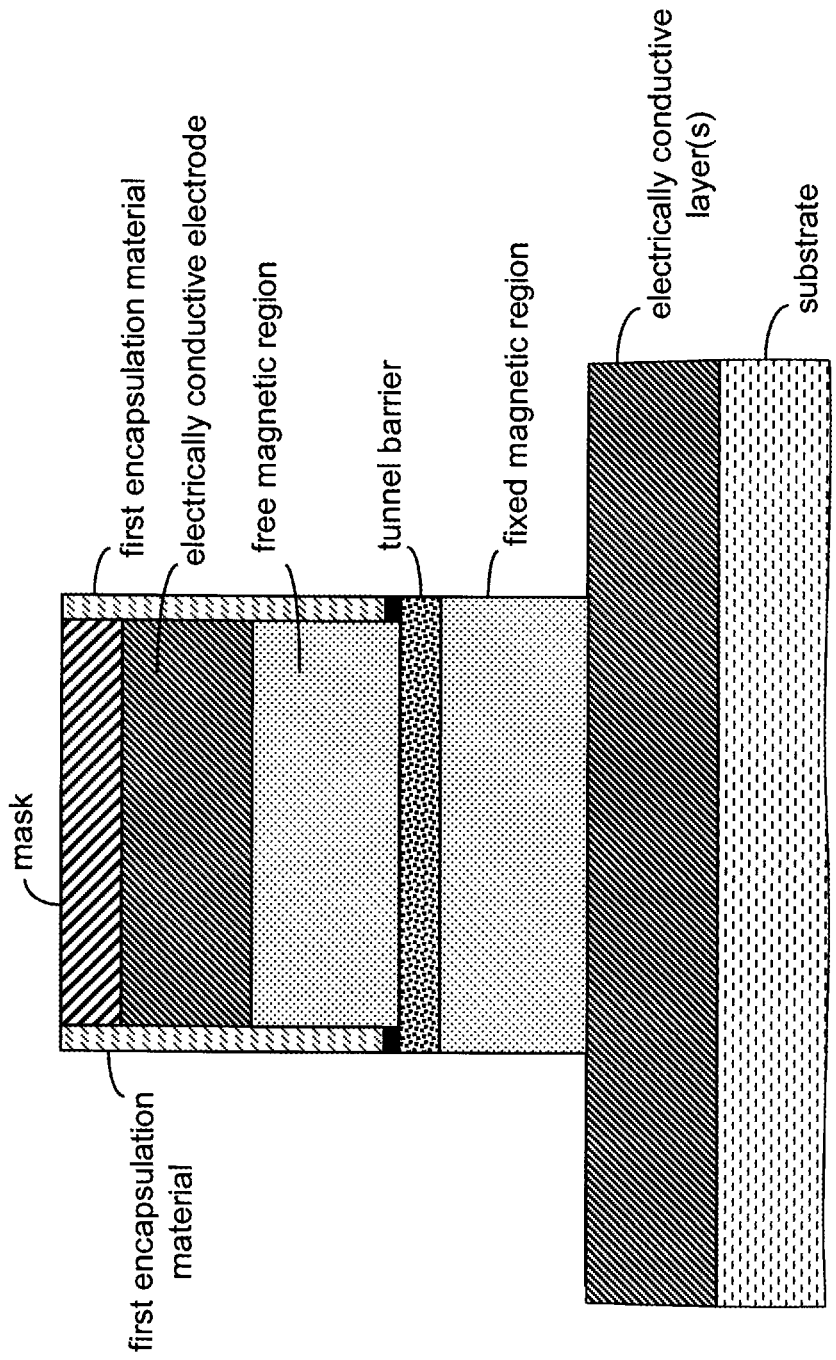

With reference to FIG. 10G, after deposition of the encapsulation material, one or more etch processes are employed to remove the encapsulation material and re-deposited material (for example, ferromagnetic material) in the field region and/or on the partially formed stack/structure. For example, in one embodiment, the etch processes includes a physical etching (for example, sputter etching, ion etching or milling, and/or ion-beam etching or milling). An Argon or Xenon sputter etch may be employed to remove the encapsulation material and the re-deposited material in the field regions and thereby "clear" the field of the re-deposited material. With continued reference to FIG. 10G, the dielectric material layer(s) (i.e., one or more layer(s) of dielectric material(s)) is also etched to form a tunnel barrier of the magnetoresistive stack/structure. Notably, a portion of the encapsulation material may remain on the partially formed stack/structure (for example, on sidewalls of the partially formed stack/structure—including the fixed magnetic region).

Figure 10I:
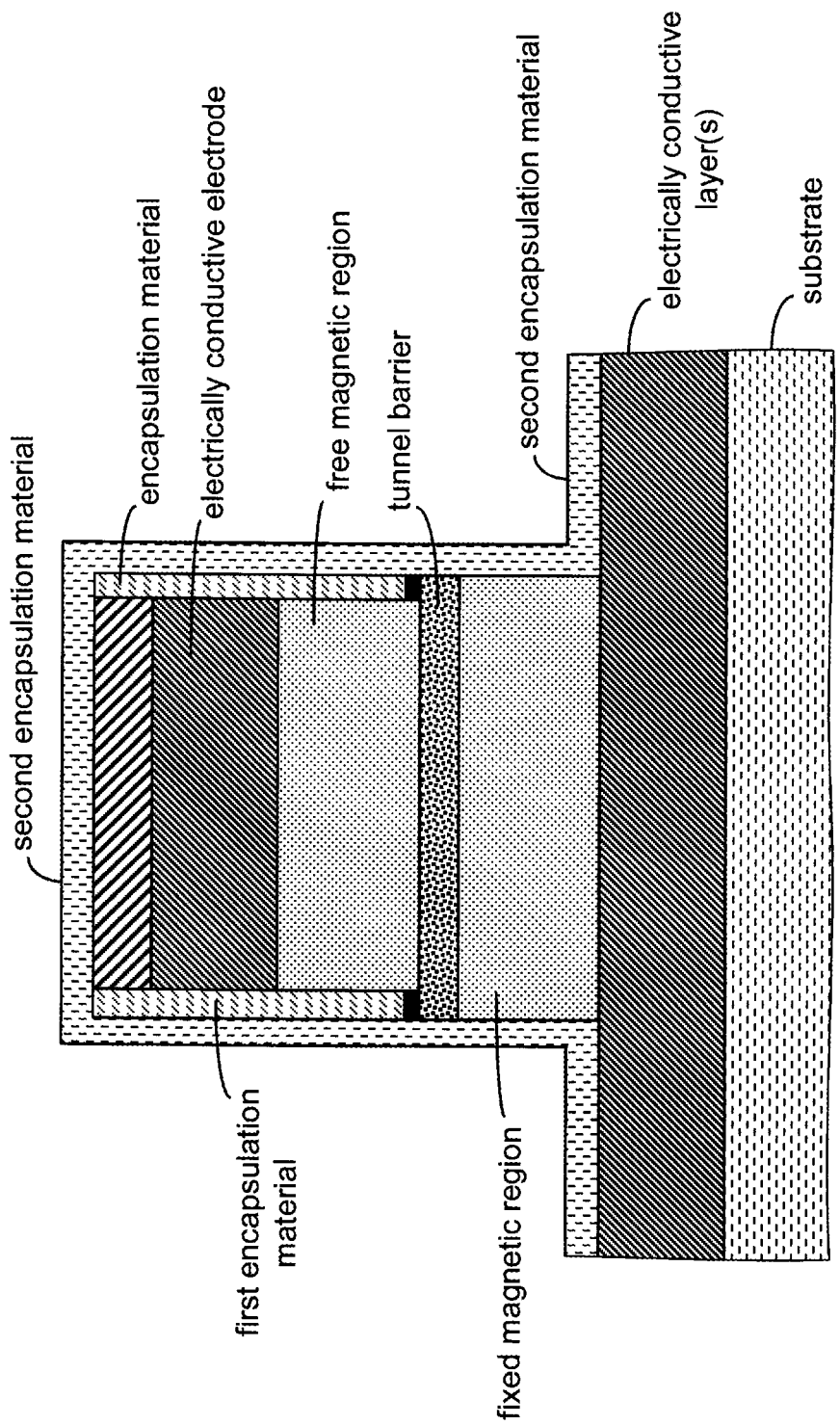

Thereafter, portions of the fixed magnetic region exposed by the removal of selected portions of the dielectric material layer(s) are etched. (See, FIG. 10H). With reference to FIG. 10I, after forming the fixed magnetic region of the magnetoresistive stack/structure, a second encapsulation material may be deposited on the magnetoresistive stack/structure (for example, on all or substantially all of the exposed portions of the partially formed stack/structure—including the sidewalls thereof). The second encapsulation material may be, for example, an aluminum oxide, silicon oxide, silicon nitride, TEOS, aluminum nitride, or one or more combinations thereof.

Figure 10J:
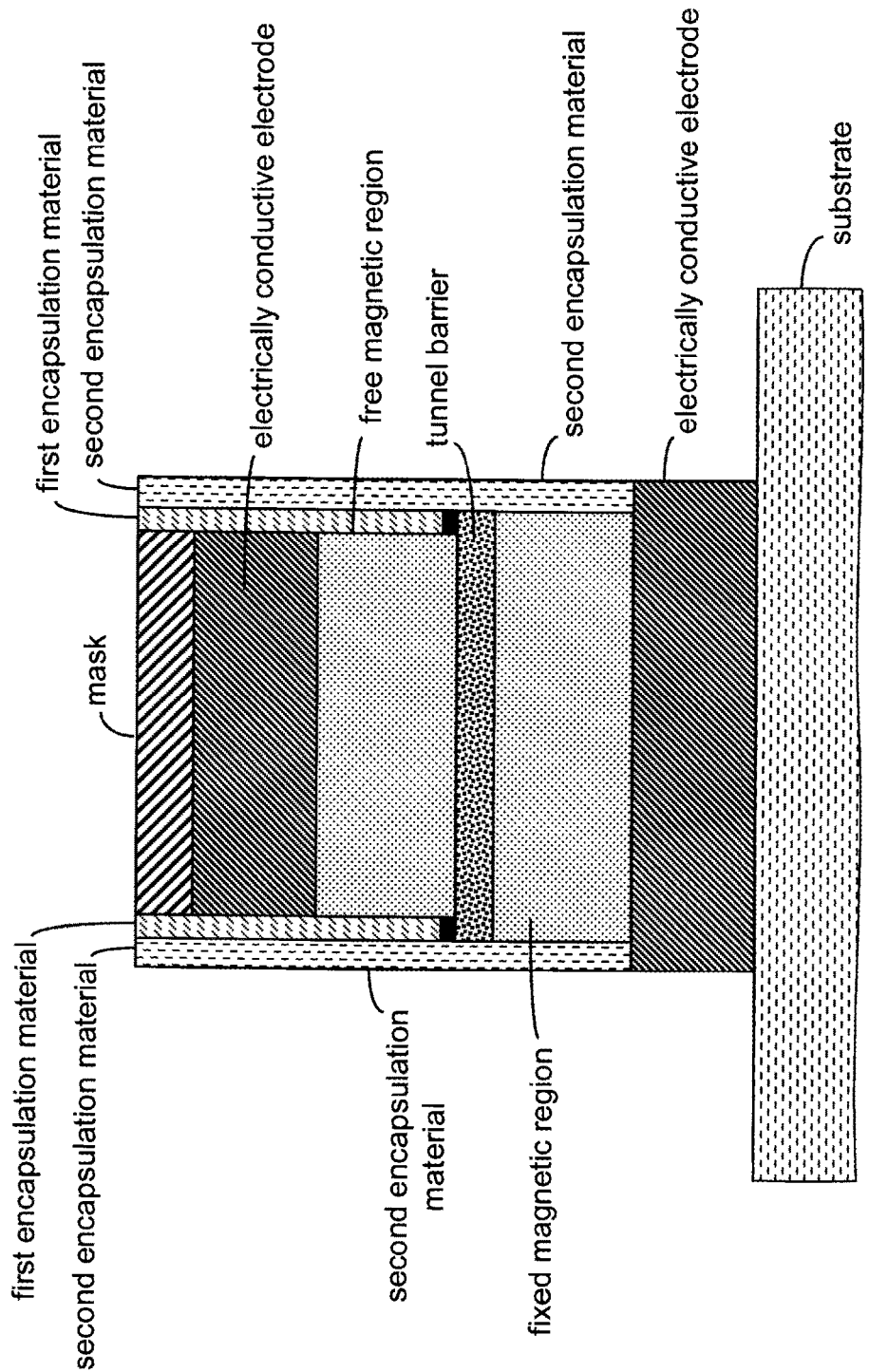

With reference to FIG. 10J, the electrically conductive layer(s) are then etched to form the electrically conductive electrode. Such etching may employ conventional techniques. Indeed, any techniques, materials and/or recipes now known or later developed may be employed to form the free magnetic region and electrically conductive bottom electrode.

Figure 11A:
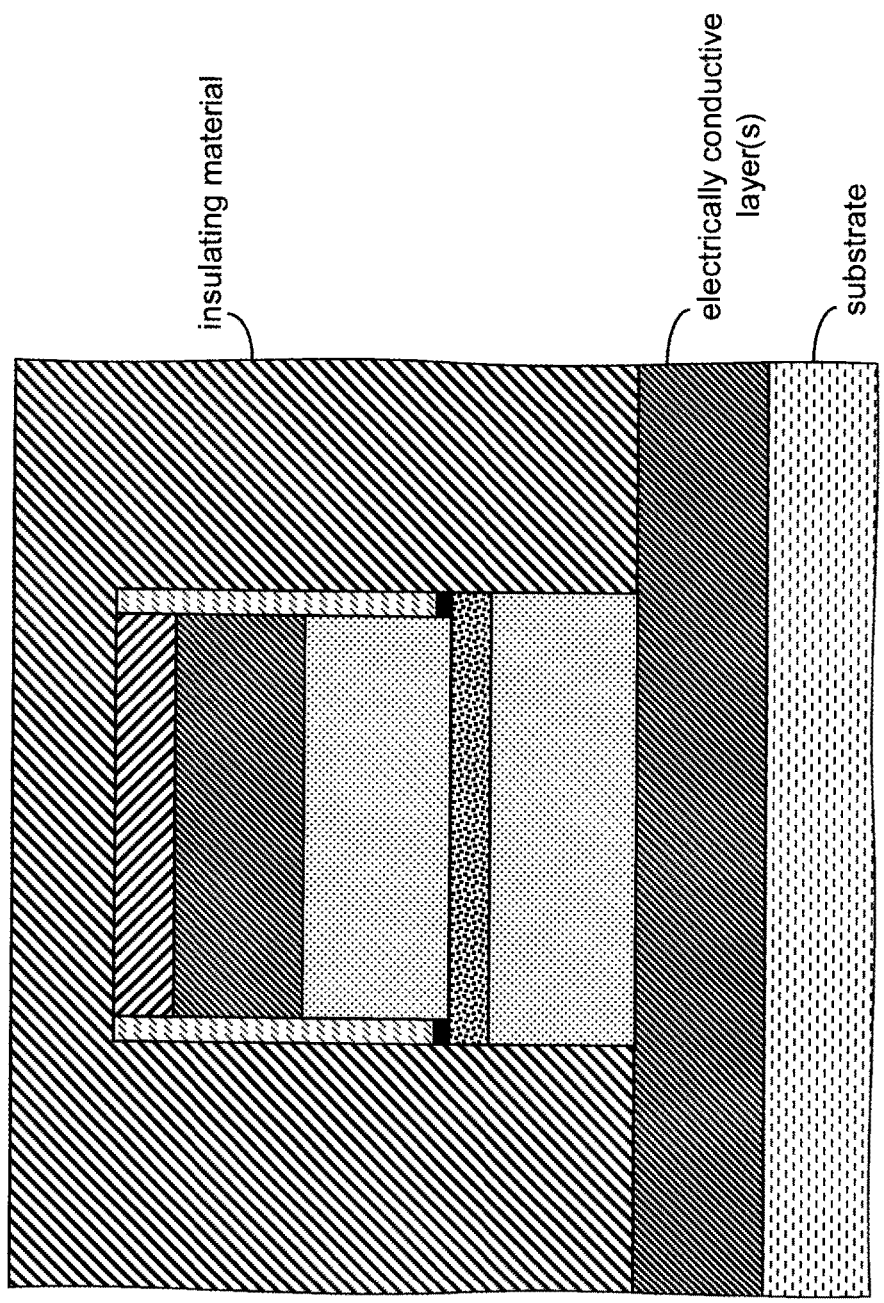
FIGS. 11A-11E illustrate cross-sectional views of a magnetoresistive stack/structure (for example, an out-of-plane magnetic anisotropic magnetoresistive stack/structure (for example, fixed and/or free magnetic regions of a magnetoresistive stack/structure having perpendicular magnetic anisotropy) wherein the free magnetic region is disposed on or above a dielectric layer (i.e., the tunnel barrier), which is disposed on or above a pinned or unpinned fixed magnetic region) at selected stages of manufacturing in accordance with another embodiment of the present inventions.
Figure 11B:
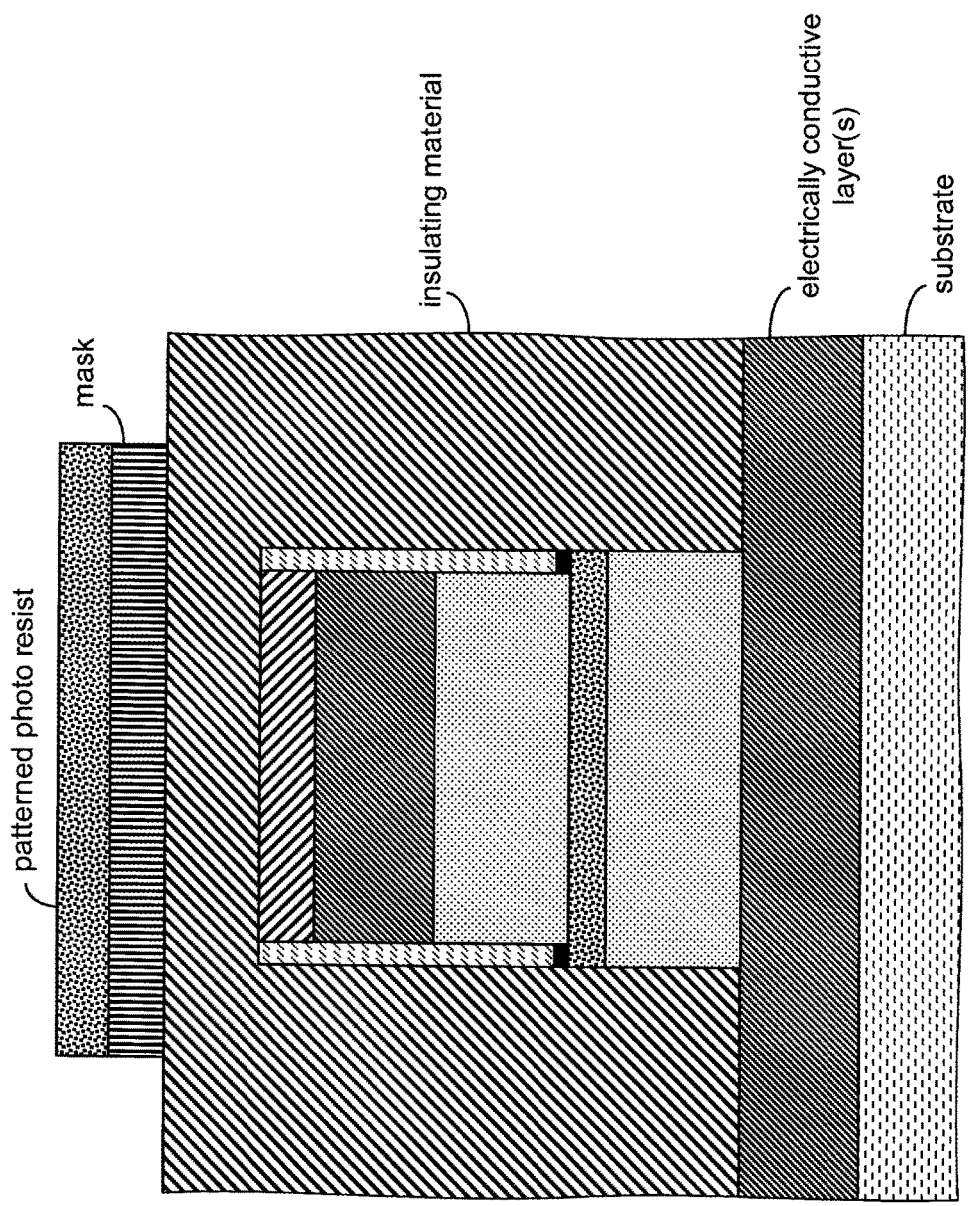
Figure 11C:
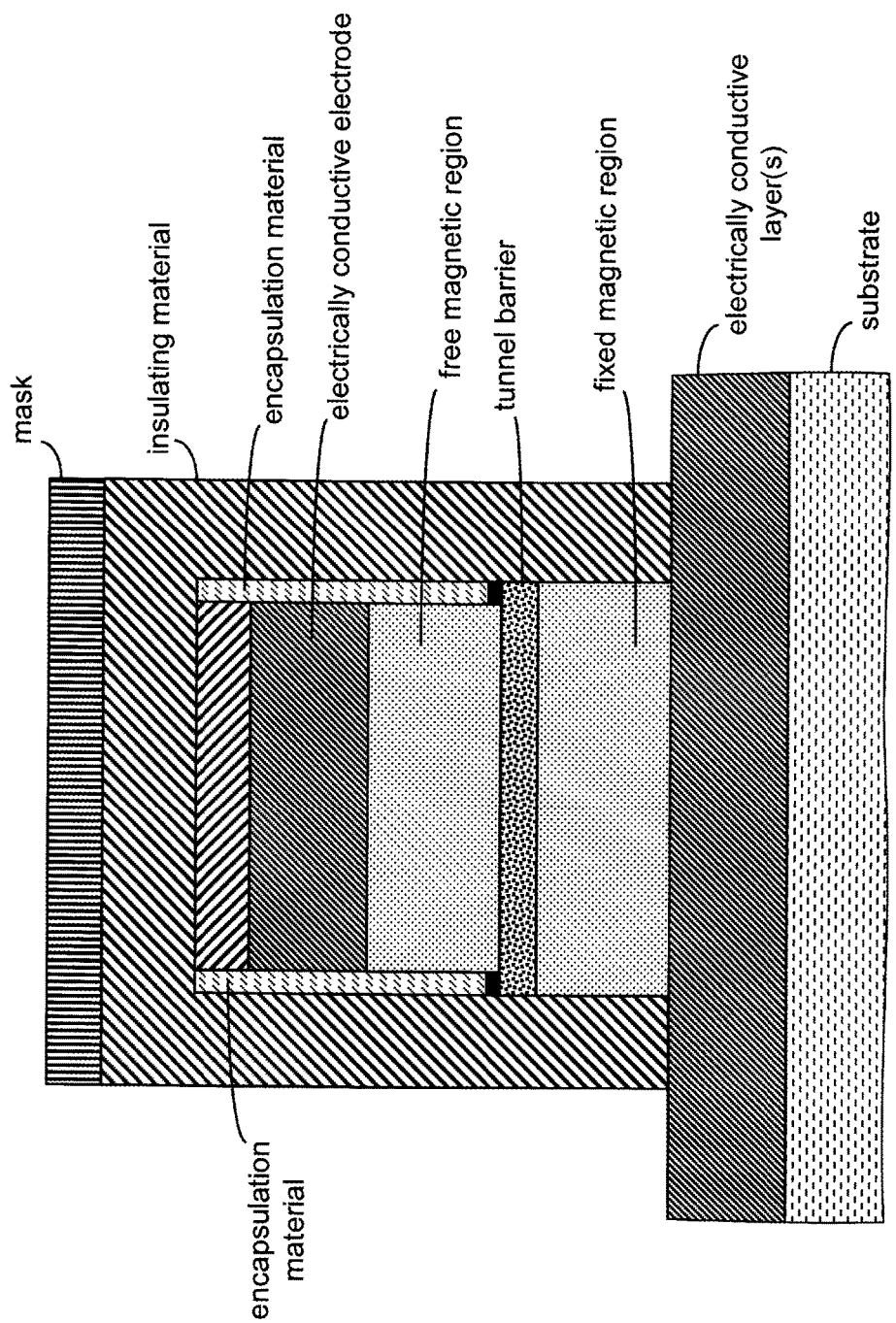

With reference to FIGS. 10A-10H and 11A-11E, in another embodiment of an out-of-plane magnetic anisotropic magnetoresistive stack/structure (for example, wherein the free magnetic region and/or the fixed magnetic regions have perpendicular magnetic anisotropy (perpendicular to the plane of the stack/structure)), the partially formed stack/structure is processed like that in FIGS. 10A-10H and removal of all or substantially all of the re-deposited materials (see FIGS. 10E-10G), and an insulating material (for example, a silicon oxide, silicon nitride and/or TEOS) is deposited (see FIG. 11A) and patterned using conventional techniques (see FIGS. 11B and 11C).

Figure 7H:
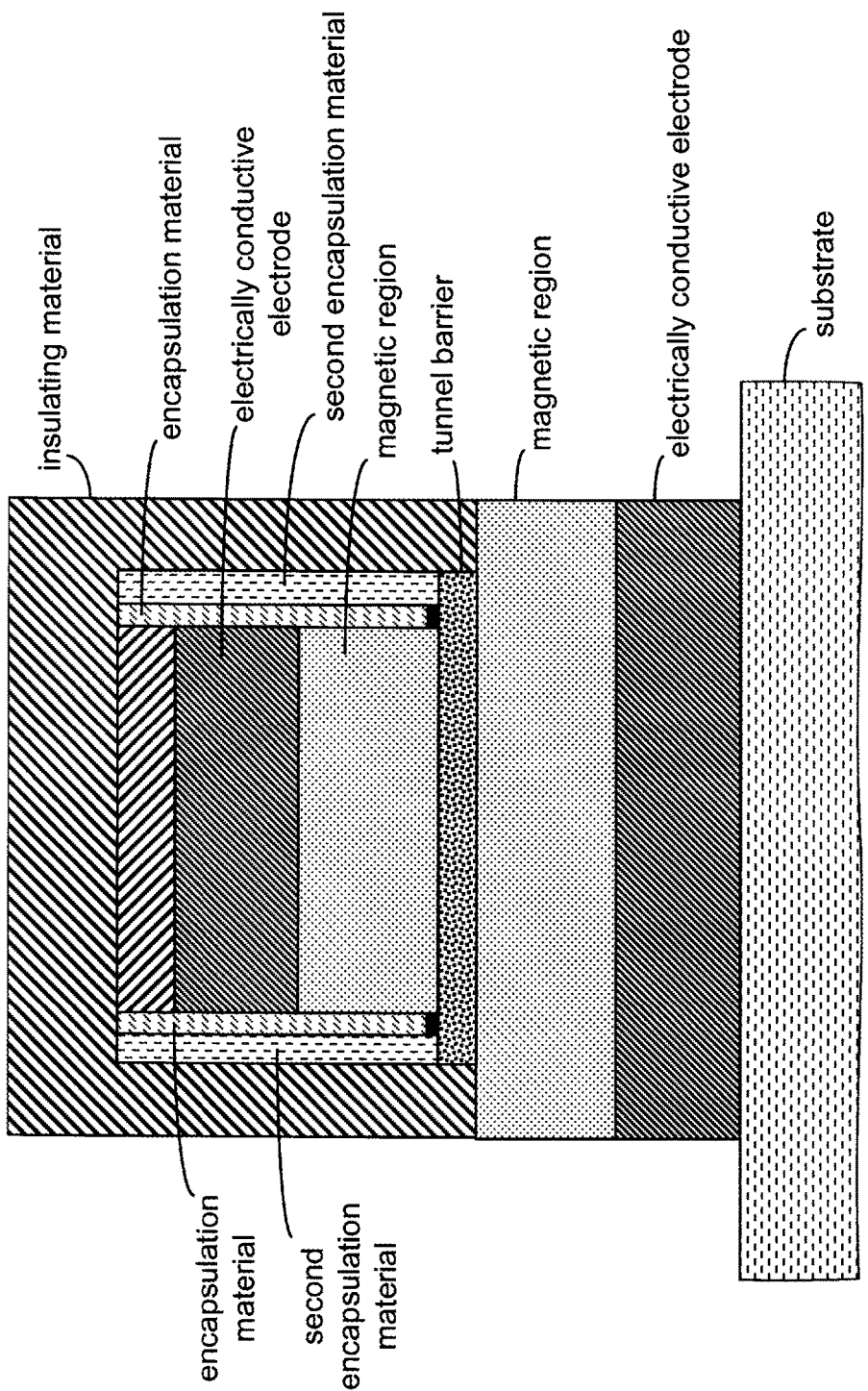
Figure 71:
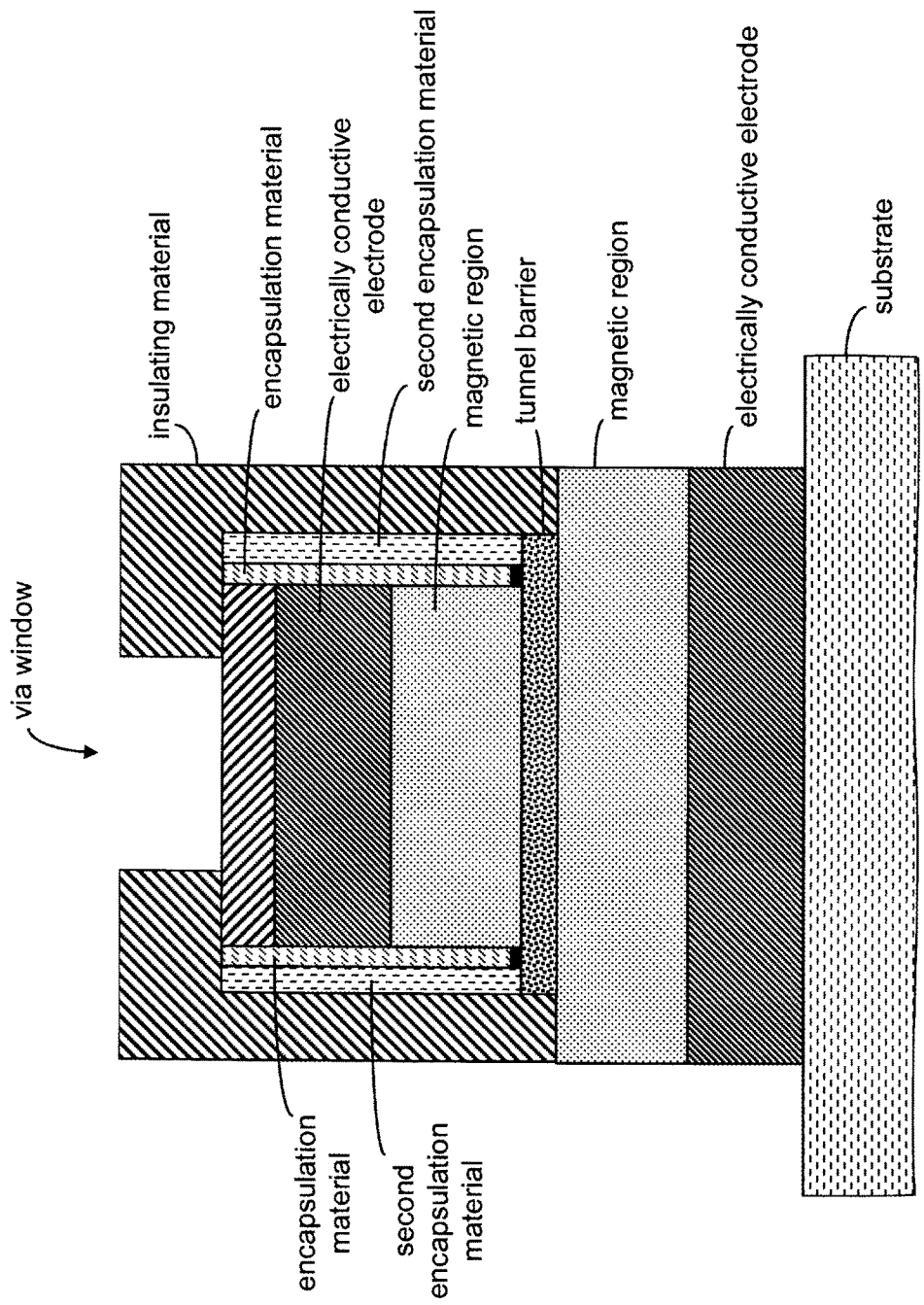
Figure 7J:
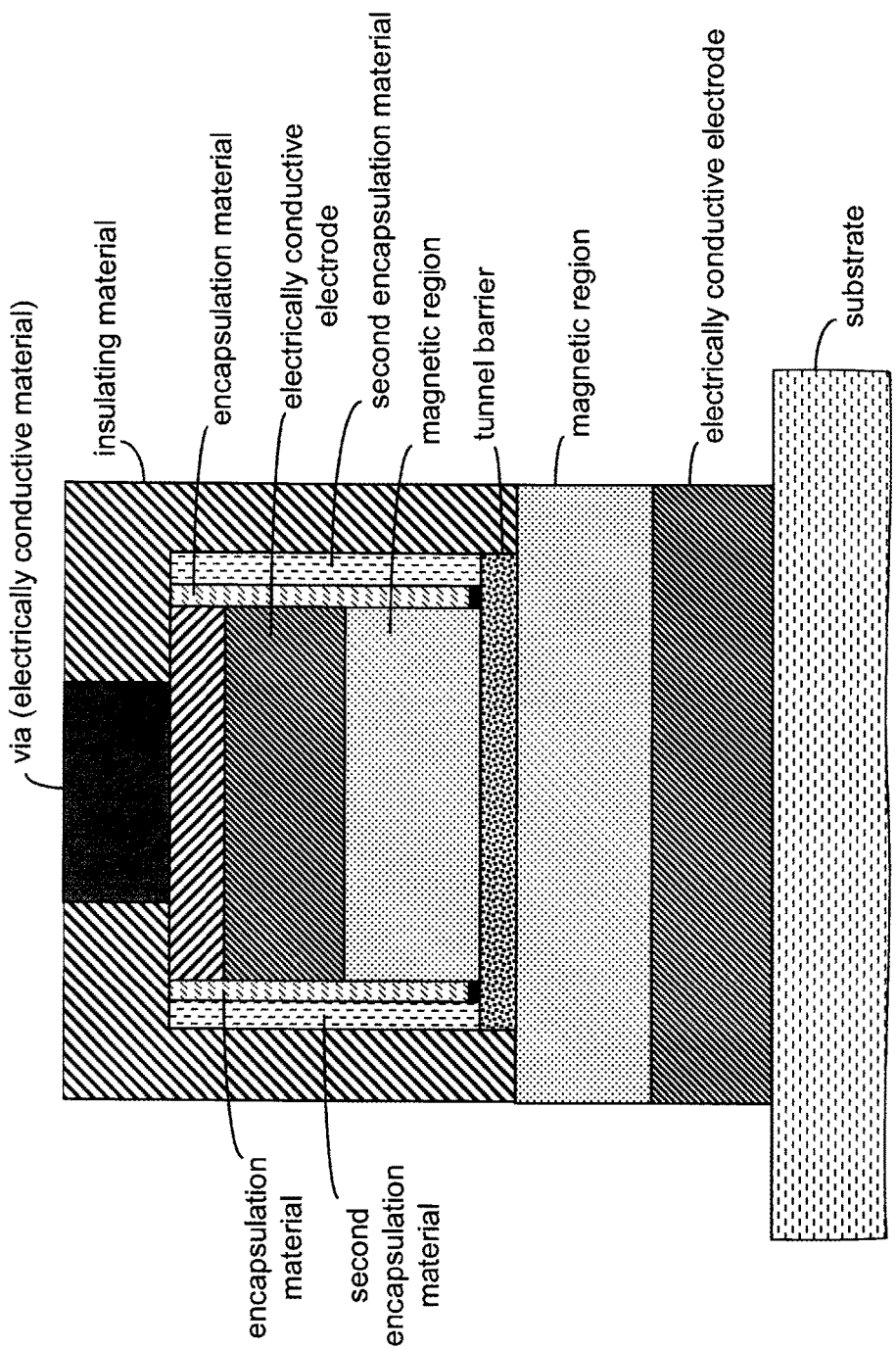
Figure 11D:
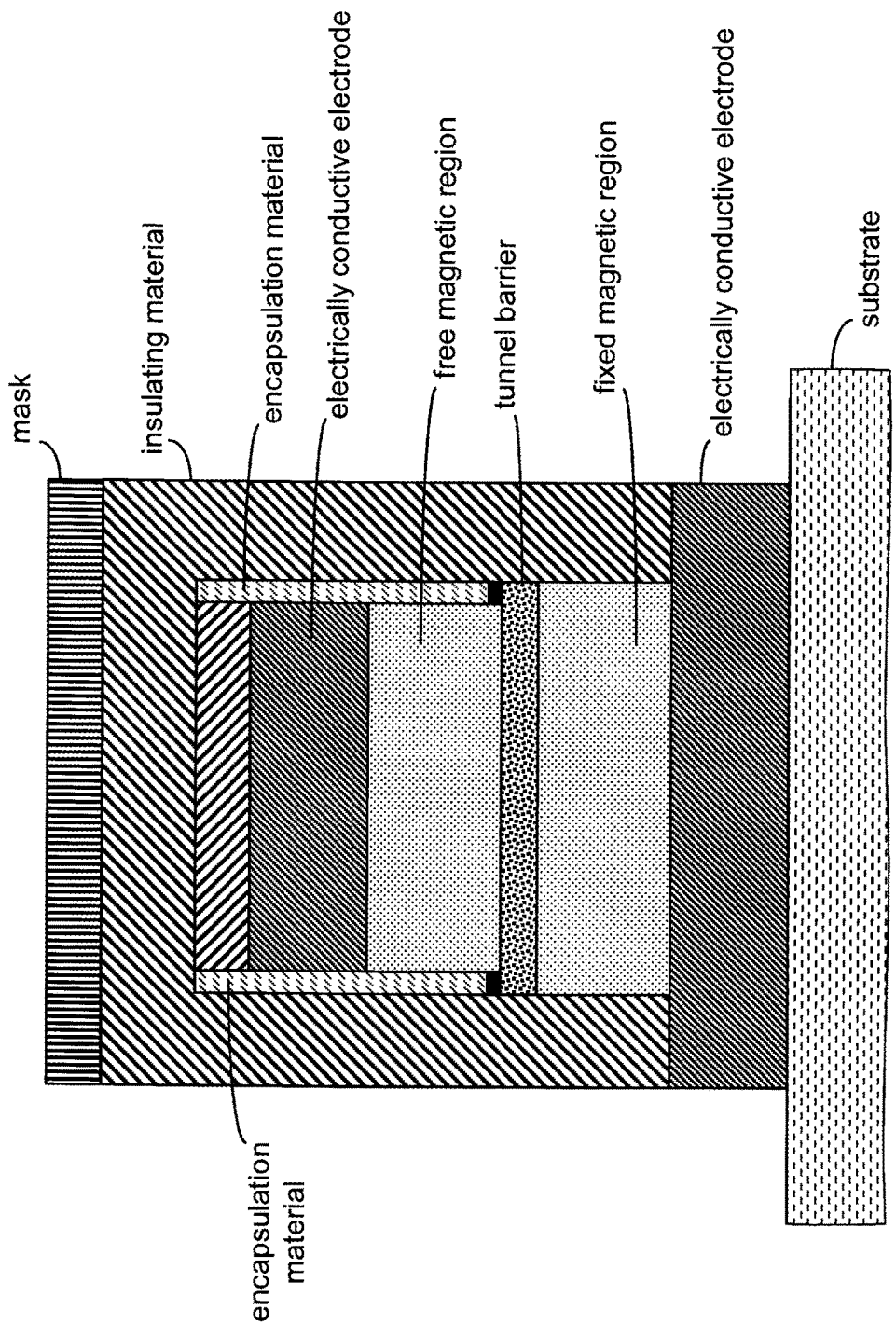
Figure 11E:
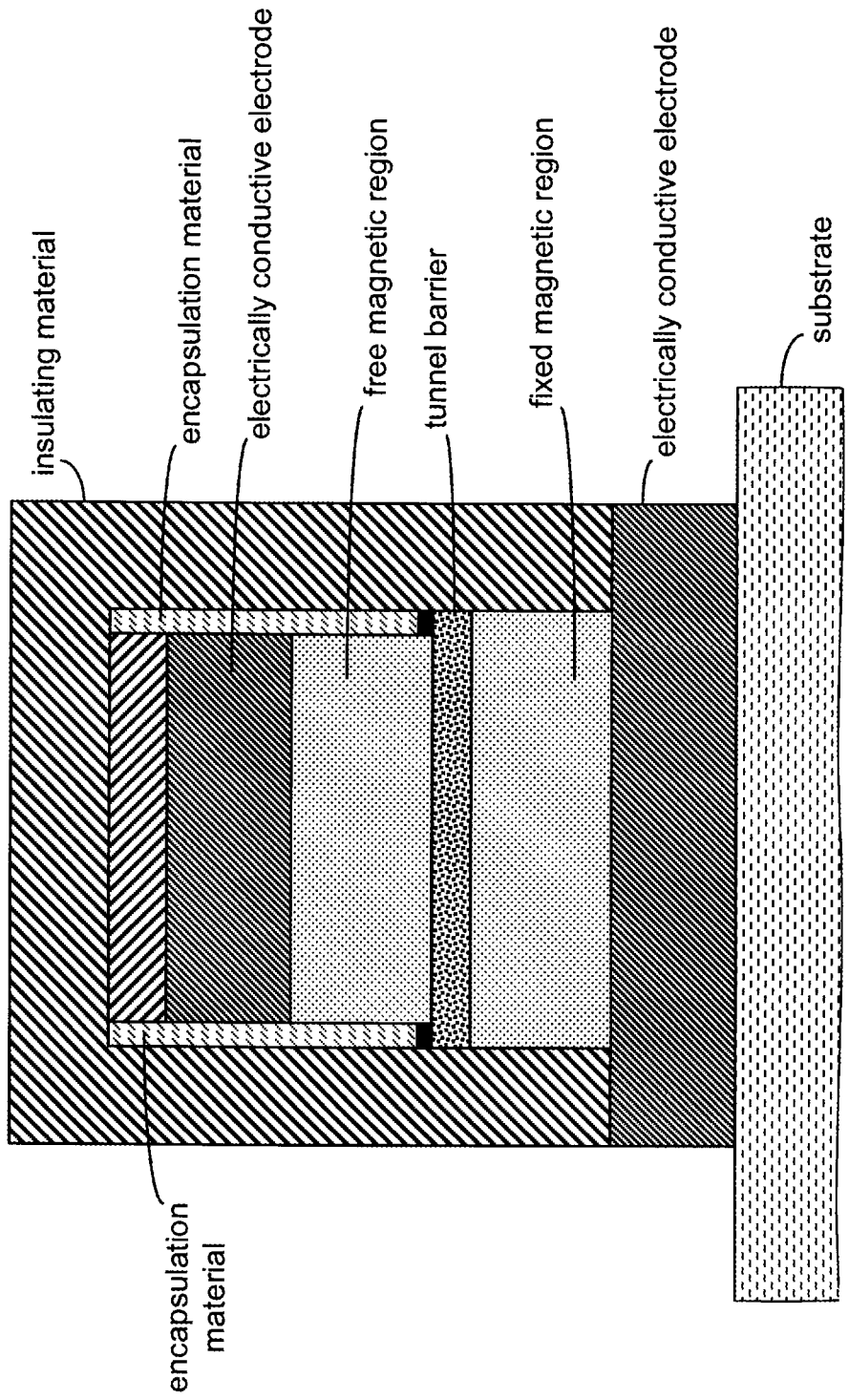

With reference to FIG. 11D, after patterning the insulating material, the electrically conductive electrode is etched using the insulating material as a mask to protect the magnetoresistive stack/structure. Notably, the mask used to pattern the insulating material may be removed (see FIG. 11E) and a via window formed in the insulating material (not illustrated) to facilitate electrical contact (through a metal or conductive via) to the top electrically conductive electrode for the MTJ stack/structure in the same manner as illustrated in FIGS. 7H-7J. Here, after forming the via window in the insulating material, an electrically conductive via is formed therein to contact the exposed electrically conductive electrode to provide connection to, for example, sense, read and/or write conductors.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the above embodiments of the inventions are merely exemplary. They are not intended to be exhaustive or to limit the inventions to the precise forms, techniques, materials and/or configurations disclosed. Many modifications and variations are possible in light of this disclosure. It is to be understood that other embodiments may be utilized and operational changes may be made without departing from the scope of the present inventions. As such, the scope of the inventions is not limited solely to the description above because the description of the above embodiments has been presented for the purposes of illustration and description.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

Figure 12A:
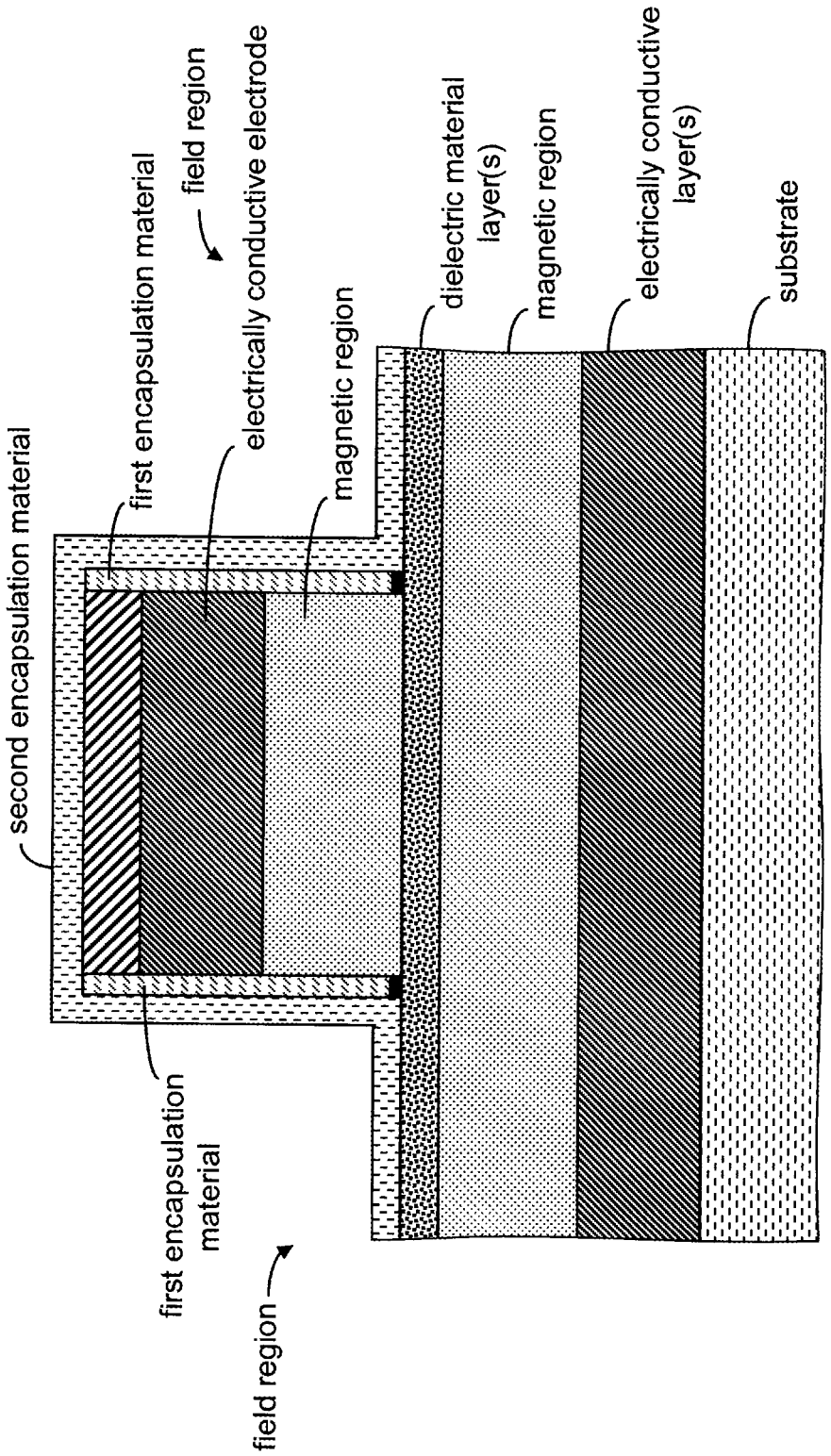
FIGS. 12A-12F illustrate cross-sectional views of a magnetoresistive stack/structure at selected stages of manufacturing in accordance with another embodiment of the present inventions.
Figure 12B:
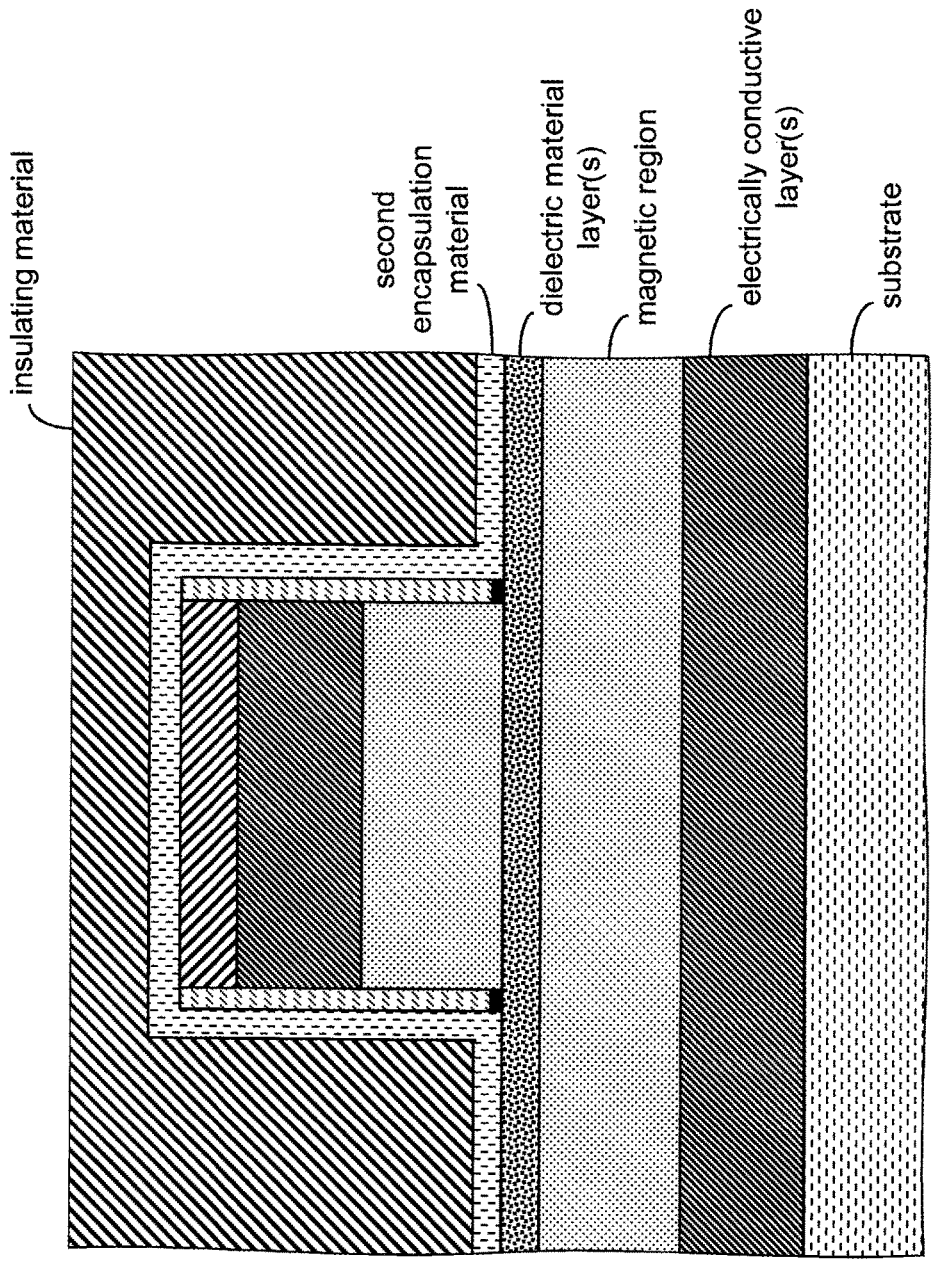
Figure 12C:
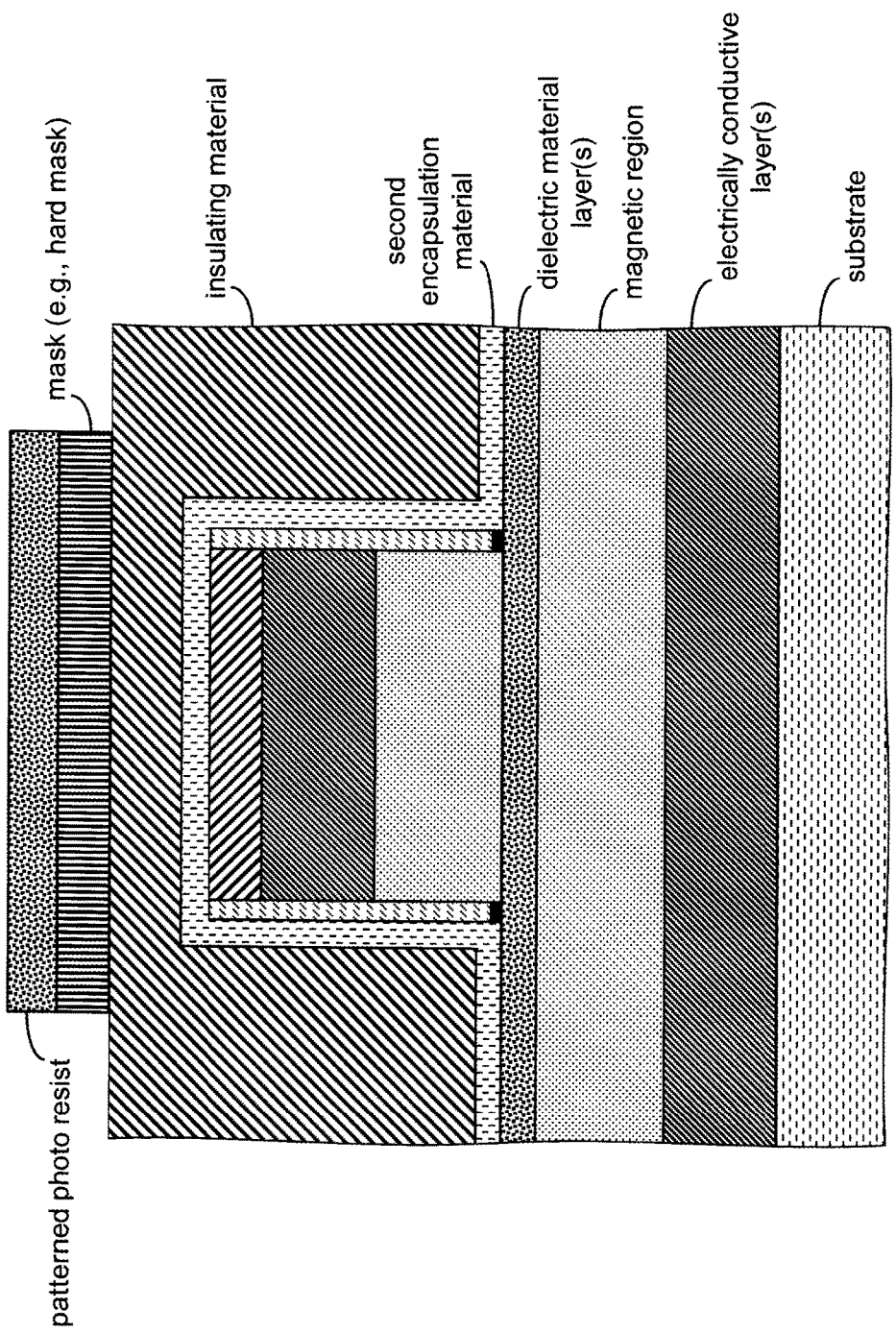

Many modifications, variations, combinations and/or permutations are possible in light of the above teaching. For example, with reference to FIGS. 1A-1G and 12A-12F, in another embodiment, after removal of all or substantially all of the re-deposited materials (see FIGS. 1F and 1G), a second encapsulation material is deposited (see FIG. 12A) on the partially formed stack/structure—including on the first encapsulation material on the sidewalls of the magnetic region (i.e., free or fixed magnetic region). Thereafter, an insulating material (for example, a silicon oxide, silicon nitride and/or TEOS) may be deposited (see FIG. 12B) and a mask is patterned using conventional techniques (see FIG. 12C) to facilitate selective removal of portions of the layers/regions (for example, second encapsulation material, the dielectric material layer(s) (to form the tunnel barrier), and magnetic region). (Compare FIGS. 7B/7C and FIG. 12B).

Figure 12D:
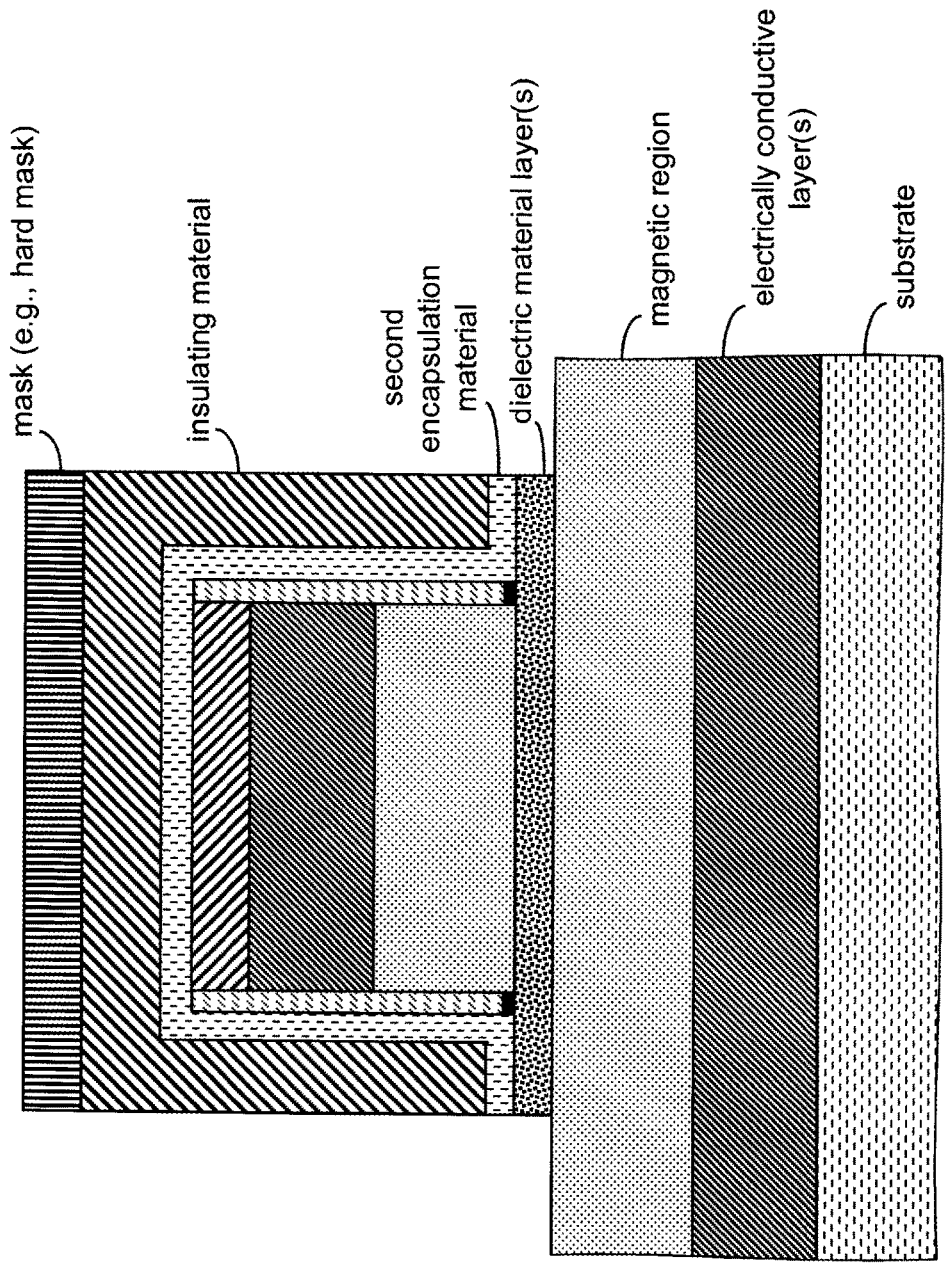
Figure 12E:
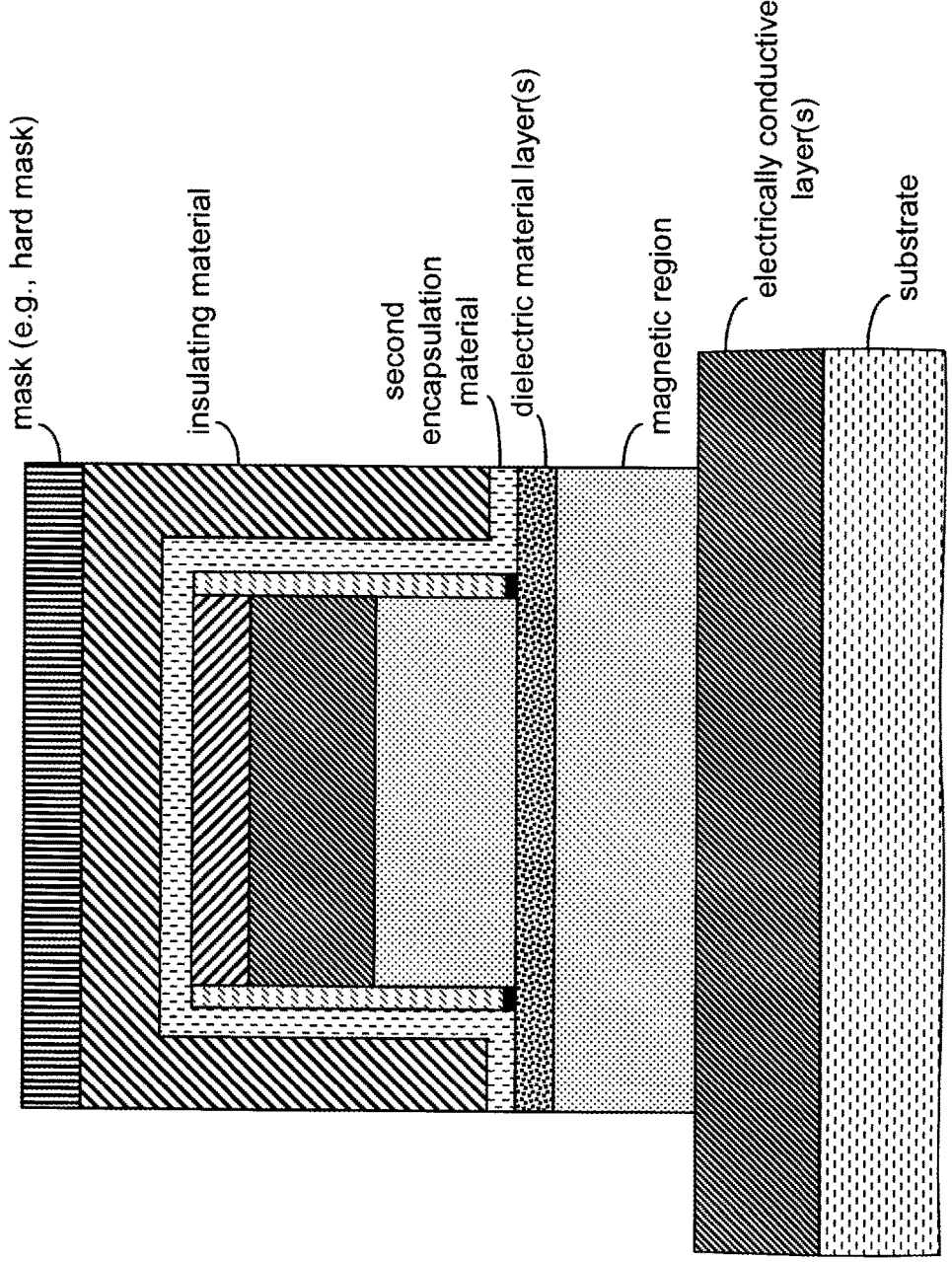
Figure 12F:
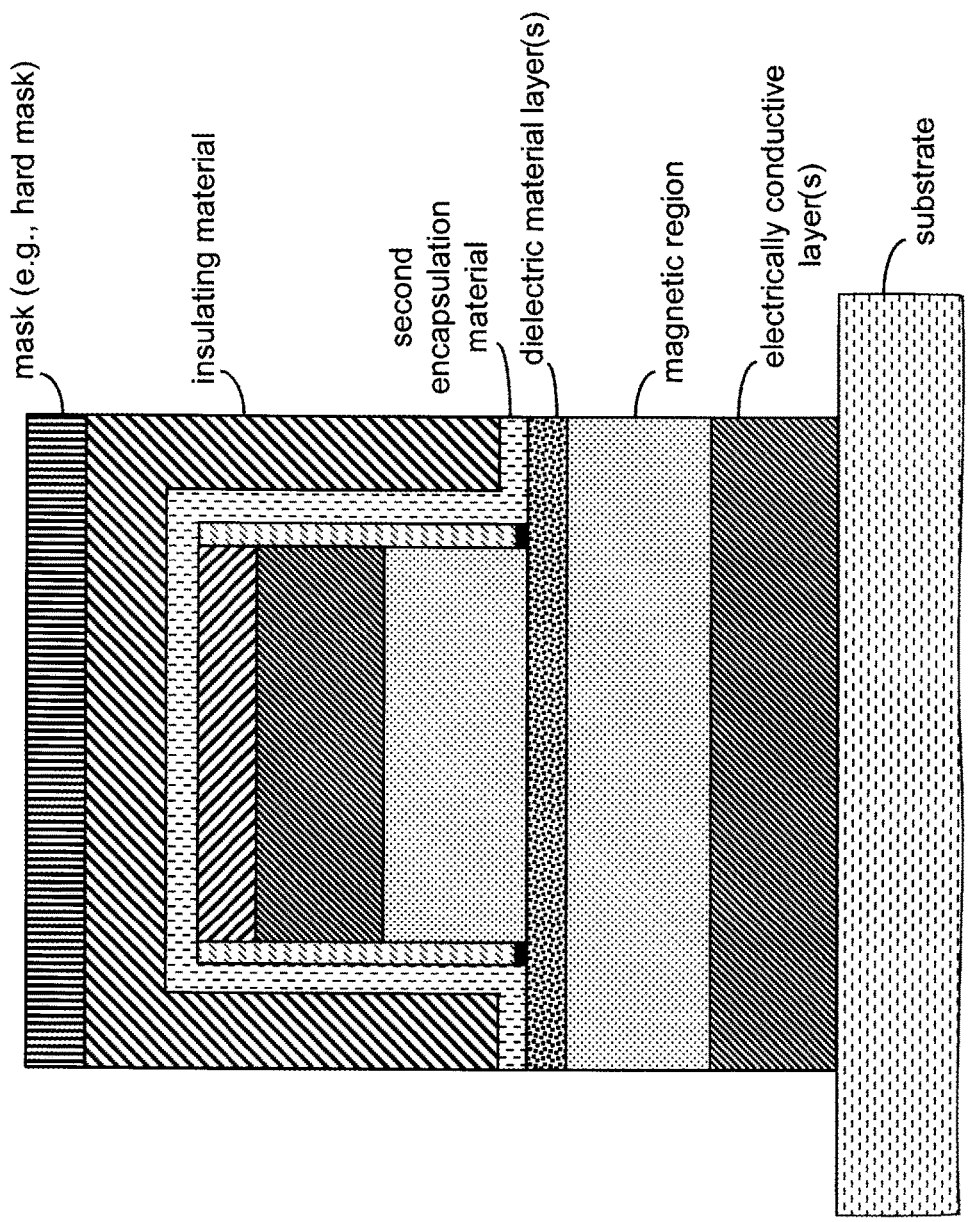

With reference to FIG. 12D, after patterning the mask, the insulating material is etched/patterned, the second encapsulation material is etched and the dielectric material layer(s) is etched, using the insulating material as a mask, to form a tunnel barrier. The magnetic layer(s) of the magnetic region under or beneath the tunnel barrier may then be etched to form the magnetic region. (See, FIG. 12E). Thereafter, the electrically conductive layer(s) may be etched, to form the electrically conductive bottom electrode. (See, FIG. 12F). Notably, additional encapsulation layers may be deposited, formed or employed at various stages of formation of the stack/structure.

The mask employed to pattern the insulating material may be removed (like that illustrated in FIG. 7H) and a via window formed in the insulating material (like that illustrated in FIG. 7I) to facilitate electrical contact (through a metal or conductive via) to the electrically conductive top electrode. Here, after forming the via window in the insulating material, an electrically conductive via is formed therein to contact the exposed electrically conductive electrode to provide connection to, for example, sense, read and/or write conductors, through a via (like that illustrated in FIG. 7J).

As noted above, the magnetoresistive structures/stacks of the present inventions may be formed on a via/conductor. In addition thereto, or in lieu thereof, a via/conductor may be formed on the magnetoresistive structures/stacks of the present inventions. In these embodiments, one or both separate electrodes are omitted and the via/conductor provide electrical connection to the magnetoresistive structure/stack thereby allowing for or facilitating electrical connectivity to circuitry and other elements of the device. Under these circumstances, the via(s)/conductor(s) is/are substitute(s) for electrode(s) formed from separate and distinct electrically conductive layer(s).

Further, although certain exemplary techniques are described and/or illustrated above in the context of MTJ stacks/structures, as noted above, the present inventions may be implemented in GMR stacks/structures of GMR-based magnetoresistive devices (for example, sensor and memory). For the sake of brevity such discussions/illustrations will not be repeated in the context of a GMR stack/structure—but it is to be interpreted as entirely applicable to GMR stacks/structures where a conductor or conductive material (rather than a dielectric material in the case of MTJ stacks/structures) is disposed between magnetic regions.

As noted above, the encapsulation techniques and materials described and/or illustrated herein may employ the subject matter described and/or illustrated in U.S. Provisional App. No. 62/249,196, entitled "Magnetoresistive Device and Method of Manufacturing Same", filed Oct. 31, 2015 (which, as indicated above, is incorporated herein by reference in its entirety). The encapsulation structures, techniques and/or materials described and/or illustrated in U.S. Provisional App. No. 62/249,196 may be employed in conjunction with any of the inventions/embodiments described and/or illustrated herein.

Notably, the processing techniques described and/or illustrated herein may be employed in conjunction with stacks/structures having other configurations—for example, while the magnetic regions of the MTJ stack or structure are illustrated as a single layer, the magnetic regions may include a number of different layers of both magnetic and nonmagnetic material. The layers may include multiple layers of magnetic material, non-magnetic layers (for example, spacer layers or spacer regions), dielectric layers that provide one or more diffusion barriers (for example, with reference to FIGS. 13A and 13B), coupling layers between layers of magnetic material that provide for ferromagnetic or antiferromagnetic coupling, anti-ferromagnetic material. For example, one of the magnetic material layer(s) may include a set of layers forming a synthetic antiferromagnetic structure (SAF) and an antiferromagnetic layer, seeding layers, diffusion layers as well as non-contiguous layers of magnetic and nonmagnetic material. The other magnetic material layer(s) may include a set of layers corresponding to a synthetic ferromagnetic structure (SyF), seeding layers, spacing layers, diffusion layers as well as non-contiguous layers of magnetic and nonmagnetic material. Notably, each of the layers shown to be included in the magnetoresistive stack/structure may be a composite layer that includes multiple sub-layers. Other embodiments may include multiple SAFs, SyFs, and tunnel barriers in addition to the other layers, where the materials and structures are arranged in various combinations and permutations now known or later developed.

Figure 13A:
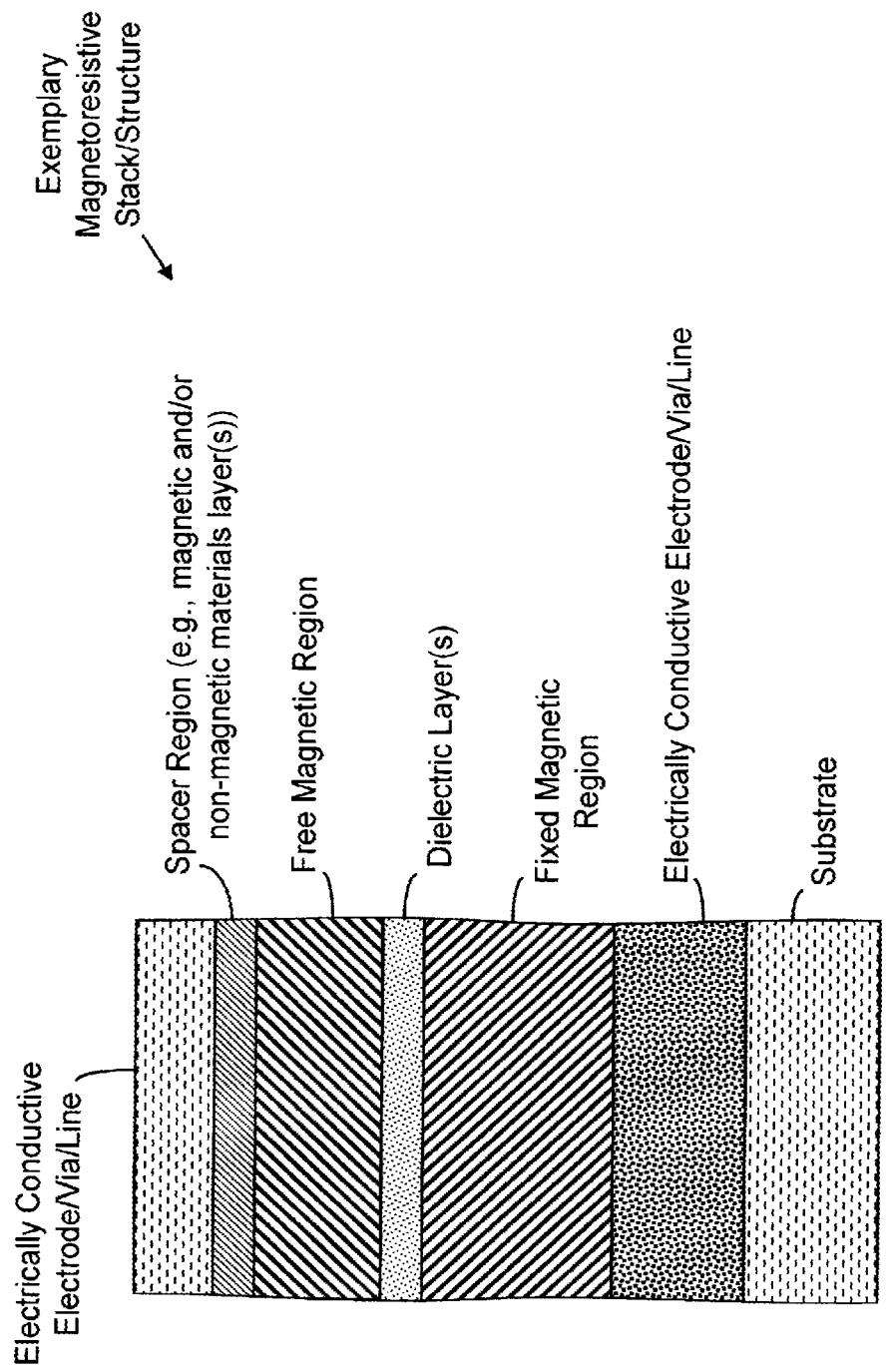
FIGS. 13A and 13B each illustrate a cross-sectional view of layers of an exemplary MTJ-type magnetoresistive stack/structure (for example, an in-plane or out-of-plane (e.g., perpendicular) magnetic anisotropy magnetoresistive stack/structure) including a dielectric layer disposed between a free magnetic region and a fixed magnetic region which may be processed according to any of the processing embodiments described and/or illustrated herein; wherein, in these exemplary embodiments, (ii) a non-magnetic spacer region is disposed between the free magnetic region and the electrically conductive material of the electrode/via/line (FIG. 13A) and (ii) a non-magnetic spacer region and second dielectric layer(s) are disposed between the free magnetic region and the electrically conductive material of the electrode/via/line (FIG. 13B); the non-magnetic spacer region and the non-magnetic spacer region-dielectric layer(s) provide barriers between the free magnetic region (as illustrated) and the electrically conductive material of the electrode/via/line or fixed magnetic region and the electrically conductive material of the electrode/via/line (not illustrated)
Figure 13B:
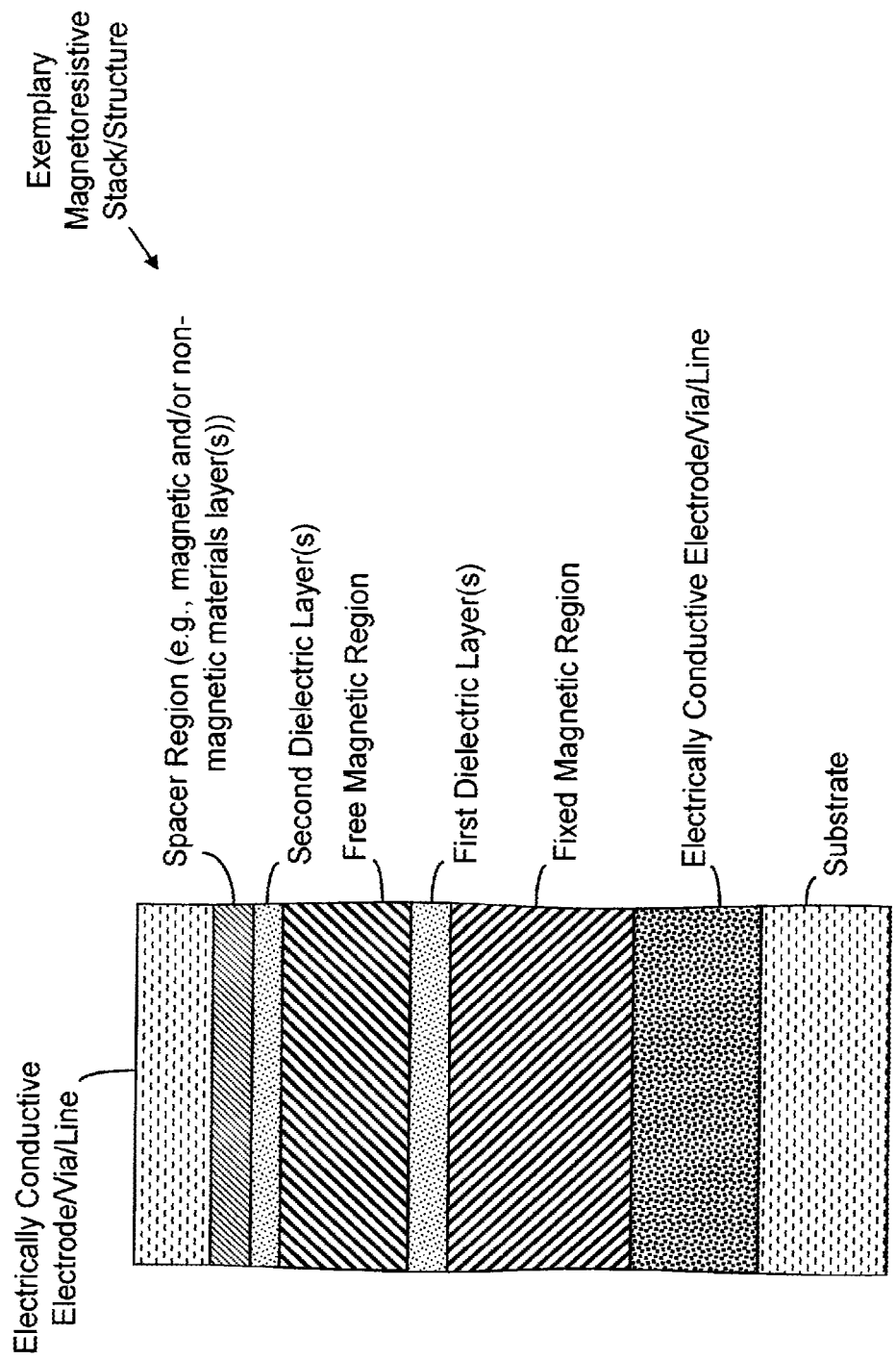

For example, with reference to FIGS. 13A and 13B, in one embodiment, a spacer region is disposed between the electrically conductive material of the electrode/via/line and the magnetic material layer(s) (which may be the fixed magnetic region or the free magnetic region (as illustrated)). The spacer region may be a non-magnetic region that provides a barrier between the free magnetic region or fixed magnetic region and the electrically conductive material of the electrode/via/line. (See, for example, U.S. Pat. No. 8,686,484). Indeed, with reference to FIG. 13B, in one embodiment, one or more additional dielectric layers may be employed to provide, among other things, an additional barrier between the free magnetic region and the electrically conductive material of the electrode/via/line. The stack or structure configurations of FIGS. 13A and 13B may be processed according to any of the processing embodiments described and/or illustrated herein. Indeed, all of the embodiments described and/or illustrated herein may include the additional layers/materials (i.e., spacer region and/or one or more dielectric layers) as set forth in FIGS. 13A and 13B. For the sake of brevity, such embodiments will not be illustrated separately for each of the embodiments of FIGS. 1-12.

Moreover, for the avoidance of doubt, the magnetoresistive stack/structure described and/or illustrated above may include materials or layer in addition to those expressly discussed herein. As indicated above, the regions, layers and materials of the embodiments described and/or illustrated herein are intended to be non-exclusive.

Further, the one or more layers of the magnetic regions (for example, Nickel (Ni), Iron (Fe), Cobalt (Co), and alloys thereof) may be etched, formed and/or patterned using any etchants and/or technique now known or later developed—for example, using mechanical and/or chemical techniques (for example, a low bias power sputter technique or a chemical etch technique such as a conventional fluorine and/or chlorine based etch technique). Where the magnetic material stack includes one or more synthetic antiferromagnetic structures (SAF) or synthetic ferromagnetic structures (SyF), the one or more layers of the magnetic regions may also include one or more non-magnetic materials layers (for example, ruthenium (Ru), copper (Cu), aluminum (Al), tantalum (Ta), titanium (Ti), and one or more alloys thereof, and in certain embodiments, tungsten (W) and molybdenum (Mo)). Notably, one or more magnetic regions of the stack/structure may include SAF and SyF structures, one or more layers of the magnetic materials, and other materials (including magnetic and/or non-magnetic) whether now known or later developed. Such materials and/or structures may be arranged in any combination or permutation now known or later developed.

Figure 15A:
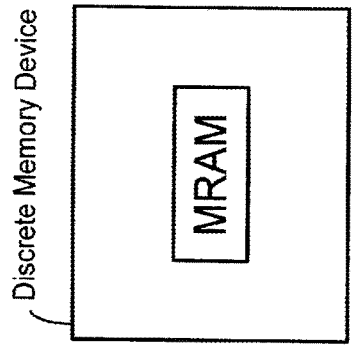
FIGS. 15A and 15B are schematic block diagrams of integrated circuits including discrete memory device and an embedded memory device, each including MRAM (which, in one embodiment is representative of one or more arrays of MRAM having a plurality of magnetoresistive memory stacks/structures according to or manufactured according to one or more aspects of the present inventions.
Figure 15B:
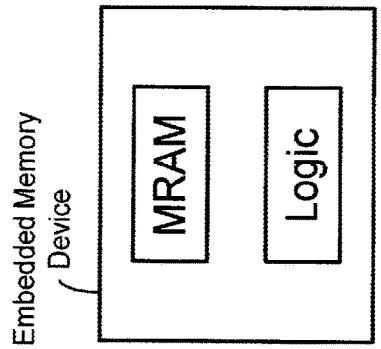
Figure 14:
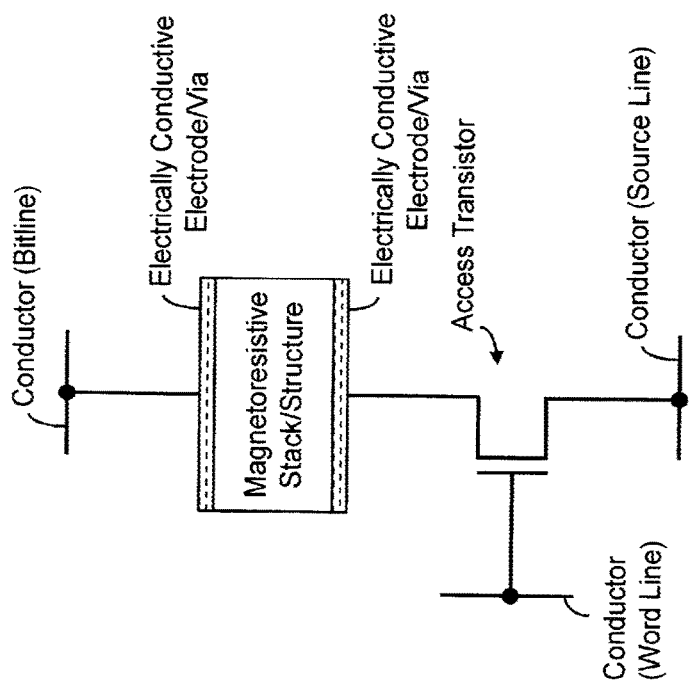
FIG. 14 is an exemplary schematic diagram of a magnetoresistive memory stack/structure electrically connected to an access transistor in a magnetoresistive memory cell configuration, wherein the magnetoresistive memory stack/structure is according to or manufactured according to one or more aspects of the present inventions.

As mentioned above, the magnetoresistive stack/structure of the present inventions, and the magnetoresistive stack/structure manufactured according to the present inventions may be implemented in a sensor or memory architecture and/or integrated circuit. For example, in a memory configuration, the magnetoresistive memory stack/structure may be electrically connected to an access transistor and configured to coupled or connect to various conductors (which carry one or more control signals). (See, FIG. 14). In one embodiment, a plurality of magnetoresistive memory stacks/structures may be fabricated and/or incorporated on an integrated circuit, for example, in an MRAM array. (See, FIGS. 15A and 15B).

The magnetoresistive stack/structure may be an MTJ-based stack/structure having an out-of-plane magnetic anisotropy or an in-plane magnetic anisotropy. The present inventions are applicable to all forms or types of magnetoresistive stacks/structures. Moreover, the free magnetic region may be disposed on the magnetic tunnel barrier or beneath the magnetic tunnel barrier; the fixed magnetic region would be disposed on and interface a side of the magnetic tunnel barrier which is opposite to the side that interfaces the free magnetic region. Moreover, the magnetoresistive stack/structure of the present inventions may include multiple tunnel barriers (see FIG. 13B) and/or multiple magnetic tunnel barriers (i.e., magnetic regions disposed on both interfaces of the dielectric material of the tunnel barrier).

Although the described exemplary embodiments disclosed herein are directed to various magnetoresistive stacks/structures and methods for making such stacks/structures, the present disclosure is not necessarily limited to the exemplary embodiments, which illustrate inventive aspects that are applicable to a wide variety of semiconductor processes, stacks/structures and/or devices. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions so that those skilled in the art should understand that they can make various changes, substitutions and alterations without departing from the spirit and scope of the inventions in their broadest form.

Notably, reference herein to "one embodiment" or "an embodiment" means that a particular feature, structure, or characteristic described in connection with the embodiment may be included, employed and/or incorporated in one, some or all of the embodiments of the present inventions. The usages or appearances of the phrase "in one embodiment" or "in another embodiment" in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, as indicated above, an embodiment or implementation described herein as exemplary is not to be construed as preferred or advantageous, for example, over other embodiments or implementations; rather, it is intended convey or indicate the embodiment or embodiments are example embodiment(s). Thus, as noted above, the term "exemplary" is used in the sense of an "example," rather than "ideal" or "preferred" or "advantageous".

The term "magnetic material" means or includes magnetic and/or ferromagnetic material. As noted above, the term "deposit" (or various forms thereof (e.g., deposited, deposition or depositing)) means or includes deposit, grow, sputter, evaporate and/or provide (or various forms thereof).

The terms "comprise," "include," "have" and any variations thereof (for example, "comprising," "including" and "having") are used synonymously to denote or describe non-exclusive inclusion. As such, a process, method, article and/or apparatus that uses such terms to, for example, describe a recipe, configuration and/or contents, does not include only those steps, structures and/or elements but may include other steps, structures and/or elements not expressly identified, listed or inherent to such process, method, article or apparatus.

Further, the terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item.

What is claimed is:

1. A method of manufacturing a magnetoresistive stack/structure from: (i) a first magnetic region including one or more layers of magnetic material, (ii) an intermediate layer disposed over the first magnetic region, and (iii) a second magnetic region including one or snore layers of magnetic material, wherein the second magnetic region is disposed over the intermediate layer, the method comprising:

using a first etch process to etch through the second magnetic region to form one or more first sidewalls and expose an area of the intermediate layer, wherein the one or more first sidewalls and the area of the intermediate layer exposed by the first etch process form exposed surfaces, and wherein at least a portion of the exposed surfaces, after the first etch process, includes re-deposited material;

depositing a first encapsulation layer on the exposed surfaces after the first etch process;

after depositing the first encapsulation layer, using a second etch process to remove at least a portion of the re-deposited material from the exposed surfaces; and after removing at least a portion of the re-deposited material, etching through the intermediate layer to form one or more second sidewalls; and depositing a second encapsulation layer on the one or more second sidewalls.

2. The method of claim 1, wherein the intermediate layer is a dielectric layer.

3. The method of claim 1, wherein the first etch process is a physical etch.

4. The method of claim 1, wherein the second etch process includes a physical etch.

5. The method of claim 4, wherein the second etch process includes ion beam etching.

6. The method of claim 1, wherein the using the first etch process includes etching through at least a portion of the intermediate layer to expose an area of the intermediate layer below an interface of the intermediate layer with the second magnetic region.

7. The method of claim 1, wherein the first etch process includes ion beam etching.

8. The method of claim 1, wherein the first encapsulation layer includes one or more of a silicon oxide, a silicon nitride, and a TEOS.

9. The method of claim 1, wherein the first encapsulation layer includes one or more of a silicon oxide, a silicon nitride, and a TEOS, and wherein the second encapsulation layer includes one or more of a silicon oxide, a silicon nitride, and a TEOS.

10. A method of manufacturing a magnetoresistive stack/structure from: (i) a first magnetic region including one or more layers of magnetic material, (ii) a dielectric layer disposed over the first magnetic region, and (iii) a second magnetic region including one or more layers of magnetic material, wherein the second magnetic region is disposed over the dielectric layer, the method comprising:

using a first etch process to etch through the second magnetic region to form one or more first sidewalk and expose an area of the dielectric layer, wherein the one or more first sidewalk and the area of the dielectric layer exposed by the first etch process form exposed surfaces, and wherein at least a portion of the exposed surfaces, after the first etch process, includes re-deposited material;

depositing a first encapsulation layer on the exposed surface after the first etch process;

after depositing the first encapsulation layer, using a second etch process to remove at least a portion of the re-deposited material from the exposed surfaces; and using a third etch process to etch through the dielectric layer and form one or more second sidewalls after removing the portion of the redeposited material, the second and the third etch processes being different etch processes.

11. The method of claim 10, wherein the first encapsulation layer is one or more of a silicon oxide, a silicon nitride, and a TEOS.

12. The method of claim 10, further including depositing a second encapsulation layer on the one or more second sidewalk after the third etch process.

13. The method of claim 12, wherein the second encapsulation layer is one or more of a silicon oxide, a silicon nitride, and a TEOS.

14. The method of claim 10, wherein the first, second, and third etch processes are physical etch processes.

15. The method of claim 10, wherein the first, second, and third etch processes use an ion beam for etching.

16. The method of claim 1, wherein the first magnetic region and the second magnetic region include at least one of a synthetic antiferromagnetic structure (SAF) or a synthetic ferromagnetic structure (SyF).

17. The method of claim 1, wherein the intermediate layer includes magnesium oxide (MgO).

18. The method of claim 10, wherein using the first etch process includes etching through at least a portion of the dielectric layer to expose an area of the dielectric layer below an interface of the dielectric layer with the second magnetic region.

19. The method of claim 10, wherein using the second etch process includes removing at least a portion of the first encapsulation layer deposited on the exposed surfaces.

* * * * *